United States Patent
Kanda

(10) Patent No.: US 7,539,053 B2
(45) Date of Patent: May 26, 2009

(54) NON-VOLATILE SEMICONDUCTOR MEMORY DEVICE

(75) Inventor: Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 11/849,752

(22) Filed: Sep. 4, 2007

(65) Prior Publication Data

US 2008/0055985 A1 Mar. 6, 2008

(30) Foreign Application Priority Data

Sep. 4, 2006 (JP) ............................. 2006-239643

(51) Int. Cl.
*G11C 16/04* (2006.01)

(52) U.S. Cl. ........................... 365/185.03; 365/185.12; 365/185.17

(58) Field of Classification Search ............ 365/185.03, 365/185.11, 185.12, 185.17, 225.7
See application file for complete search history.

(56) References Cited

U.S. PATENT DOCUMENTS

| | | | |
|---|---|---|---|
| 6,100,588 A | 8/2000 | McAdams et al. | |
| 6,226,212 B1 | 5/2001 | Sakamoto et al. | |
| 6,937,514 B2 * | 8/2005 | Hasegawa | 365/185.12 |
| 7,042,044 B2 * | 5/2006 | Wu | 257/316 |
| 7,116,603 B2 * | 10/2006 | Kanda et al. | 365/225.7 |
| 7,196,950 B2 | 3/2007 | Kanda et al. | |
| 7,224,617 B2 * | 5/2007 | Takeuchi | 365/185.25 |
| 2005/0207220 A1 | 9/2005 | Takeuchi | |
| 2006/0018164 A1 * | 1/2006 | Wu | 365/185.29 |
| 2008/0055985 A1 | 3/2008 | Kanda | |

FOREIGN PATENT DOCUMENTS

| | | |
|---|---|---|
| JP | 2004-152405 | 5/2004 |
| JP | 2004-327865 | 11/2004 |
| JP | 2005-267687 | 9/2005 |
| JP | 2005-267821 | 9/2005 |

OTHER PUBLICATIONS

U.S. Appl. No. 12/028,480, filed Feb. 8, 2008, Kanda.

* cited by examiner

*Primary Examiner*—Gene N. Auduong
(74) *Attorney, Agent, or Firm*—Oblon, Spivak, McClelland, Maier & Neustadt, P.C.

(57) ABSTRACT

A non-volatile semiconductor memory device includes plurality of word lines and a plurality of bit lines comprising even numbered bit lines and odd numbered bit lines and a memory cell array including a plurality of memory cells having two or more storage states, one of the plurality of memory cells being connected to a corresponding word line of the plurality of word lines, the number of storage states between adjacent memory cells is different in a word line direction and a bit line direction.

23 Claims, 25 Drawing Sheets

NON-VOLATILE SEMICONDUCTOR MEMORY DEVICE

CROSS REFERENCE TO RELATED APPLICATION

This application is based upon and claims the benefit of priority from the prior Japanese Patent Applications No. 2006-239643, filed on Sep. 4, 2006; the entire contents of which are incorporated herein by reference.

BACKGROUND OF THE INVENTION

1. Field of the Invention

This invention relates to a non-volatile semiconductor memory device and particularly, a NAND type flash memory.

2. Description of the Related Art

In recent years, in order to reduce the unit cost per one bit of data and increase storage capacity in a non-volatile semiconductor memory device such as a NAND type flash memory, a flash memory which stores multi-bit data, that is, a volume of information of more than two-levels of data, in one memory cell has been developed. Four threshold distributions of one memory cell in which two bits of data are stored exist corresponding to four-levels data.

It is generally preferred that the form of the threshold distribution of a memory cell including this NAND type flash memory be sharp and narrow in width considering drops in power supply voltage or variations in manufacture. Consequently, in order to achieve this, a step-up width of a programming voltage Vpgm is made to be narrow. However, by narrowing the step-up width of a programming voltage Vpgm, but then the threshold distribution of a memory cell becomes wider by the interference of an adjacent memory cell caused by capacitive coupling of the adjacent cell. With miniaturization, this effect has become significant.

In addition, by narrowing the step-up width of a programming voltage Vpgm and programming, it is possible to reduce the widening of the threshold distribution. However, when narrowing the step-up width of a programming voltage Vpgm, the number of times the programming voltage Vpgm is applied increases, programming time becomes longer and programming speed is reduced. Japanese Laid Open Patent 2005-267687, Japanese Laid Open Patent 2005-267821, Japanese Laid Open Patent 2004-152405, and Japanese Laid Open Patent 2004-327865 are used as reference.

BRIEF SUMMARY OF THE INVENTION

A non-volatile semiconductor memory device according to one embodiment of this invention comprises a plurality of word lines, and a plurality of bit lines comprising even numbered bit lines and odd numbered bit lines, and a memory cell array including a plurality of memory cells having two or more storage states, one of said plurality of memory cells being connected to a corresponding word line of said plurality of word lines, the number of storage states between adjacent memory cells is different in a word line direction and a bit line direction.

A non-volatile semiconductor memory device according to one embodiment of this invention comprises a plurality of word lines, and a plurality of bit lines comprising even numbered bit lines and odd numbered bit lines, and a memory cell array including a plurality of memory cells having two or more storage states, said plurality of memory cells having a first address and a second address, said second address being allocated and being the same between two said adjacent memory cells, one of said plurality of memory cells being connected to a corresponding word line of said plurality of word lines, the number of storage states between adjacent memory cells is different in a word line direction and a bit line direction, and a plurality of sense amplifiers connected to said plurality of bit lines, said sense amplifiers amplify and output a signal which is read from said plurality of memory cells, latches data which is input or output and converts said data based on said second address into a signal.

A non-volatile semiconductor memory device according to one embodiment of this invention comprises a plurality of word lines, and a plurality of bit lines comprising even numbered bit lines and odd numbered bit lines, and a memory cell array including a plurality of memory cells having two or more storage states, said plurality of memory cells having a first address, a second address and a third address, said second address being allocated and being the same between two said consecutive memory cells among three consecutive memory cells which are adjacent and said third address which is allocated to another memory cell among said three memory cells, one of said plurality of memory cells being connected to a corresponding word line of said plurality of word lines, the number of storage states of said memory cell among three consecutive memory cells which are adjacent is different, and a plurality of sense amplifiers connected to said plurality of bit lines, said sense amplifiers amplify and output a signal which is read from said plurality of memory cells, latches data which is input or output and converts said data based on said second address and said third address into a signal.

DETAILED DESCRIPTION OF THE INVENTION

Figure 1:
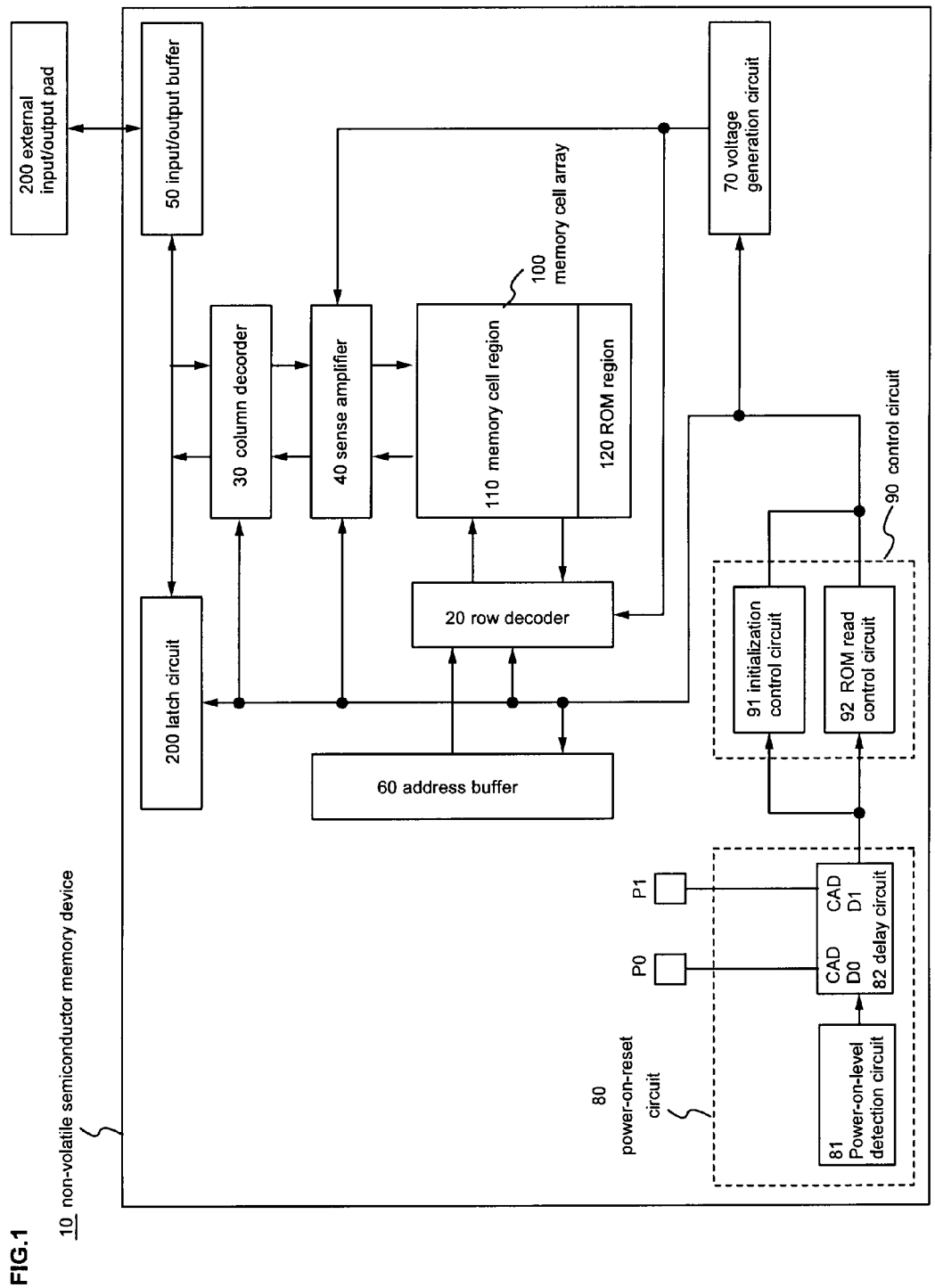
FIG. 1 is an outline construction drawing of a non-volatile semiconductor memory device relating to a first embodiment of this invention.

Below, the embodiments of this invention will be explained in detail while referring to the drawings.

Embodiment One

Below, the non-volatile semiconductor memory device relating to embodiment one of this invention will be explained in detail while referring to the drawings using a NAND type flash memory as an example. Further, an example of the non-volatile semiconductor memory device of this invention is shown in the embodiments, however, the non-volatile semiconductor memory device of this invention is not limited to these embodiments.

In a flash memory, by converting the amount of electric charge which is stored within a memory cell's floating gate electrode, that threshold is changed and data is stored. For example, (1) data corresponds to when the memory cell threshold is negative and (0) data corresponds to when it is positive.

In recent years, in order to reduce the cost per unit of one data bit or to increase storage capacity, a plurality of data bits are stored in one cell, or what is called a multi-levels flash memory, is being developed. The threshold distribution of one memory cell in which two bits of data are stored exist corresponding to four-levels data.

In order to program more than two-levels of data in this NAND flash memory, there is a need to insert a threshold distribution which corresponds to the amount of data to be programmed in a memory cell within a predetermined potential range. That is, a plurality of threshold distributions must be inserted between a read voltage Vread (the gate voltage of a non-selected cell within a NAND cell, for example, 5V) and 0V. Therefore, in order to make a threshold distribution which is sharp and narrow in width, it becomes necessary to narrow the step-up width of the program voltage Vpgm. Here, the floating gate of a memory cell (FG) has capacitive coupling with a floating gate of an adjacent memory cell in a bit line (BL) direction, word line (WL) direction and diagonal direction. Therefore, in order to store an amount of data of more than two-levels, even if the threshold distribution of the memory cell is sharp and narrow in width, the threshold distribution of the memory cell becomes wide due to the effect of capacitive coupling. Therefore, it is difficult to realize a sharp threshold distribution with a width or a desired narrowness. The effect of this capacitive coupling is increasingly becoming significant along with miniaturization and in particular, because capacity is large in a bit line (BL) direction and a word line (WL) direction.

Therefore, in order to realize further increases in both miniaturization and large capacity, there will be a need to reduce the effect of capacitive coupling, reduce the interference of an adjacent memory cell, increase the level of integration and improve programming speed in the case of storing an amount of data of more than two-levels. The non-volatile semiconductor memory device relating to embodiment one of this invention can reduce the effect of capacitive coupling, reduce the interference of an adjacent memory cell, increase the level of integration and improve programming speed.

[Construction of a Non-Volatile Semiconductor Memory Device]

An outline construction drawing of a NAND type flash memory relating to embodiment one of a non-volatile semiconductor memory device of this invention is shown in FIG. 1. The non-volatile semiconductor memory device shown in FIG. 1 includes a memory cell array 10 in which is arranged a plurality of electrically rewritable memory cells MC111, a row decoder 20, a column decoder 30, a sense amplifier 40, an input/output buffer 50, an address buffer 60, a voltage generation circuit 70, a power-on-reset circuit 80, a control circuit 90 and a latch circuit 200. Also, a state machine, a command interface and a selection circuit are further arranged, however, these are not shown in FIG. 1. The non-volatile semiconductor memory device relating to this embodiment performs sending and receiving of data and control signals (command) with an external input/output pad 210.

In the non-volatile semiconductor memory device 10 relating to embodiment one of this invention, data and control signals are input from the external input/output buffer 210 via the data input/output buffer 50 to the command interface and column decoder 30. The state machine controls the column decoder 30 and the row decoder 20 based on the control signals and data. The state machine inputs access information to the memory cell MC111 of the memory cell array 100 to the column decoder 30 and the row decoder 20. The row decoder 20 controls the selection circuit based on the access information and data and activates the memory cell MC 111. The column decoder 30 is arranged between the sense amplifier 40 and a data bus, reads data in units of eight bits or sixteen bits from the latch of the sense amplifier 40 corresponding to a selected address and transmits this to a data bus. The transmitted data is output to the external input/output pad 210 via the data input/output buffer 50. Also, at the time of programming, the row decoder 20 loads data into the latch of the sense amplifier 40. A sense amplifier 40 which is connected to each bit line 140 of the memory cell array 100 includes a latch function for storing read data and program data and amplifies the sense of the potential of the bit line 140 at the time of reading a page and latches the read data. At the time of programming, the sense amplifier 40 latches the program data which is inputted externally and loads the program data into the bit line 140.

Figure 2:
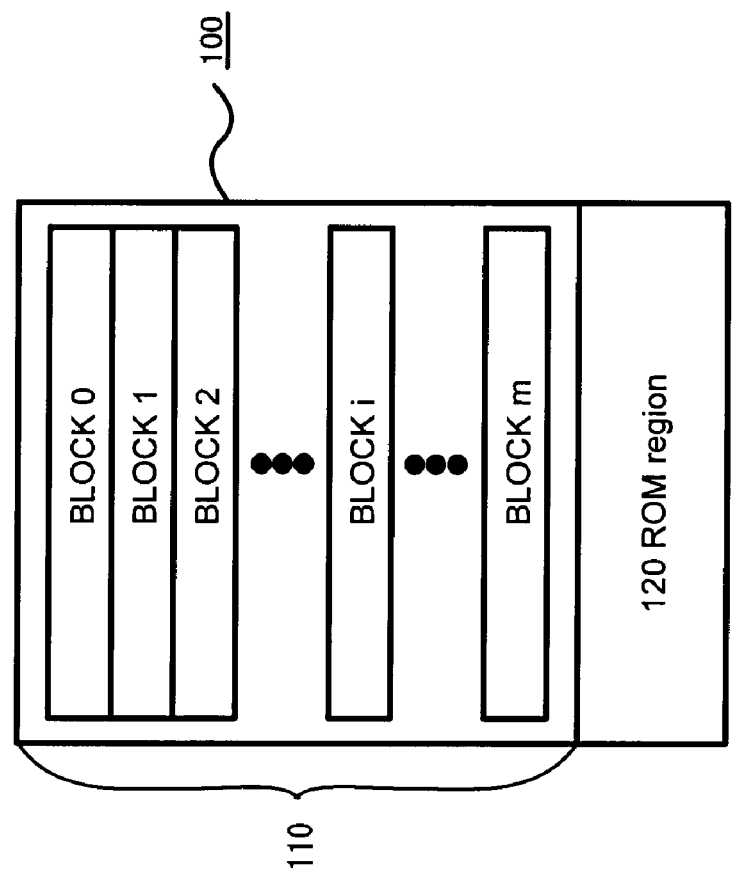
FIG. 2 is an outline construction drawing of a memory cell array of the non-volatile semiconductor memory device relating to a first embodiment of this invention.

Here, the construction of a memory cell array is shown in FIG. 2. As is shown in FIG. 2, the memory cell array of the non-volatile semiconductor device 100 relating to embodiment one of this invention is divided into a total of m blocks (BLOCK0, BLOCK1, BLOCK2, . . . , BLOCKi, . . . , BLOCKm). Here a block is the smallest unit of data erasure.

Also, the memory cell array of the non-volatile semiconductor device 100 relating to embodiment one of this invention is included, apart from a usual memory cell region 110 for storing data, with a ROM region 120 for storing various data (fuse data) which requires reading after power activation such as trimming data for time adjustment or various types of voltage adjustment and replacement address data for replacing a defective cell which exists in the memory cell array 110 for a different redundant cell The fuse data which is stored in the ROM region 120 is sent to the latch circuit 200 via the sense amplifier 40 and the column decoder 30 and retained. The operation which reads the fuse data stored in this ROM region 120 and is set to the latch circuit 200 is called a ROM read operation.

Figure 3:
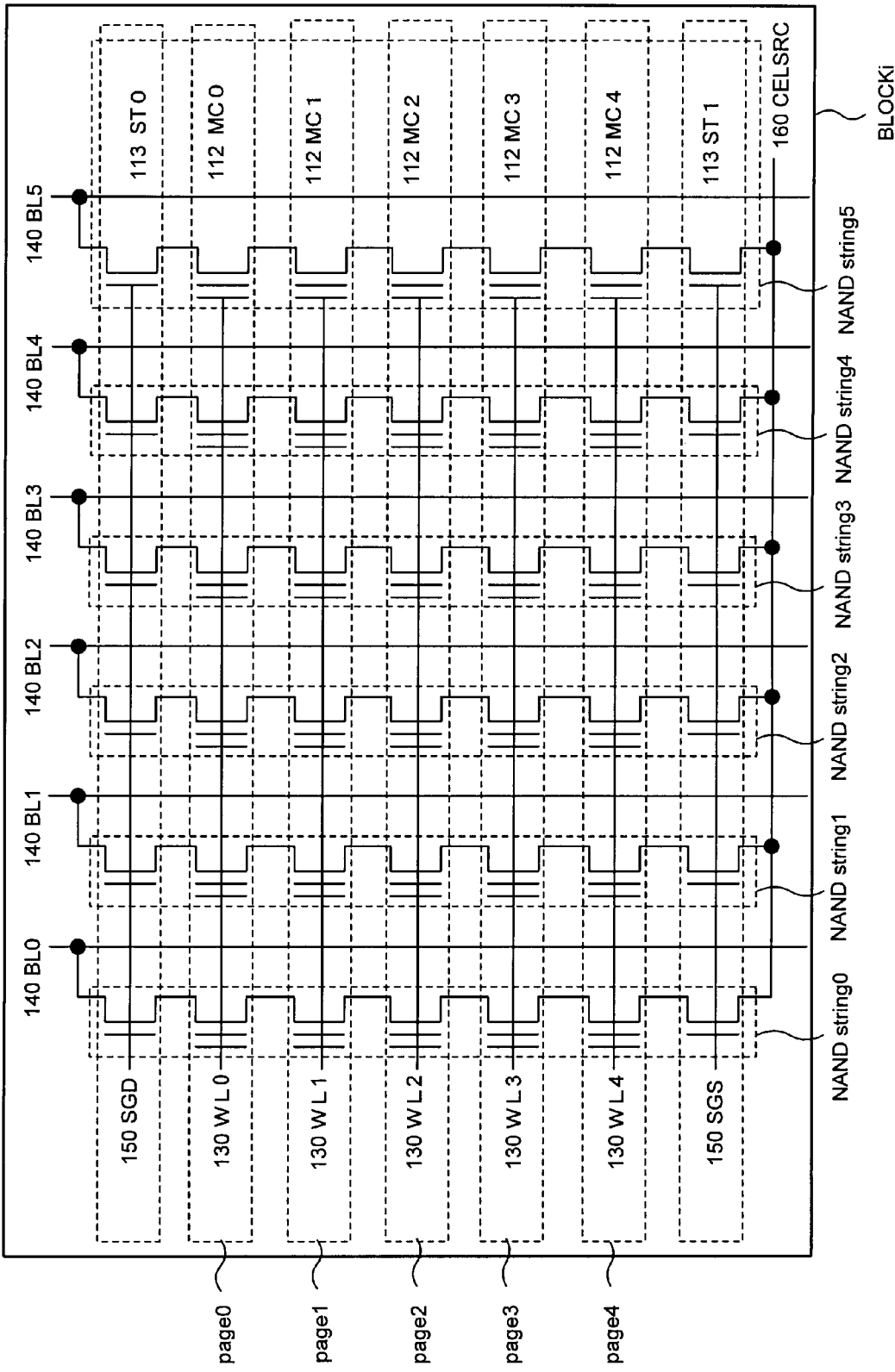
FIG. 3 is an outline construction drawing of the interior of a memory cell block of the non-volatile semiconductor memory device relating to a first embodiment of this invention.

Also, each block BLOCK0-BLOCKm, similar to block BLOCKi shown representatively in FIG. 3, is constructed of six NAND strings 0-5. FIG. 3 is a construction drawing of the block BLOCKi of a memory cell of the non-volatile semiconductor device relating to one embodiment of this invention. Here, the NAND string means a construction in which the memory cell MC is connected in a series and selection gate transistors ST are arranged at both ends of the memory cell MC connected in a series.

According to the present embodiment each NAND string is constructed by connecting five memory cells MC0-MC4 (111) in series and one end is connected to a bit line BL140 (BL0, BL1, BL2, BL3, BL4, BL5) via a selection gate transistor ST0 (113) which is connected to a drain side selection gate line SGD 150. Also, the other end of each NAND string is connected to a common source line CELSRC 160 via a selection gate transistor ST1 (113) which is connected to a source side selection gate line SGS150. The control gate of each memory cell MC111 is connected to a word line WL130 (WL0-WL4). In FIG. 3 five word lines are shown as an example, however it is not limited to this.

Here, the six memory cells MC111 which are connected to one word line WL130 stores a plurality of bits of data (multi-levels bit data) in accordance with the electron injection rate. These six memory cells MC111 comprise a unit called a page.

Also, according to the present embodiment, the number of blocks which comprise a memory cell array is given as m blocks and one block was given to include six NAND strings comprised from five memory cells, however, it is not limited to this. The number of blocks, the number of memory cells MC and the number of NAND strings may be changed according to desired capacity. Also, in the present embodiment, an example of a NAND type flash memory in which one NAND string is connected to one bit line BL was explained, however, in the NAND type flash memory of the present invention, one bit line may be connected to a plurality of NAND strings.

Figure 4:
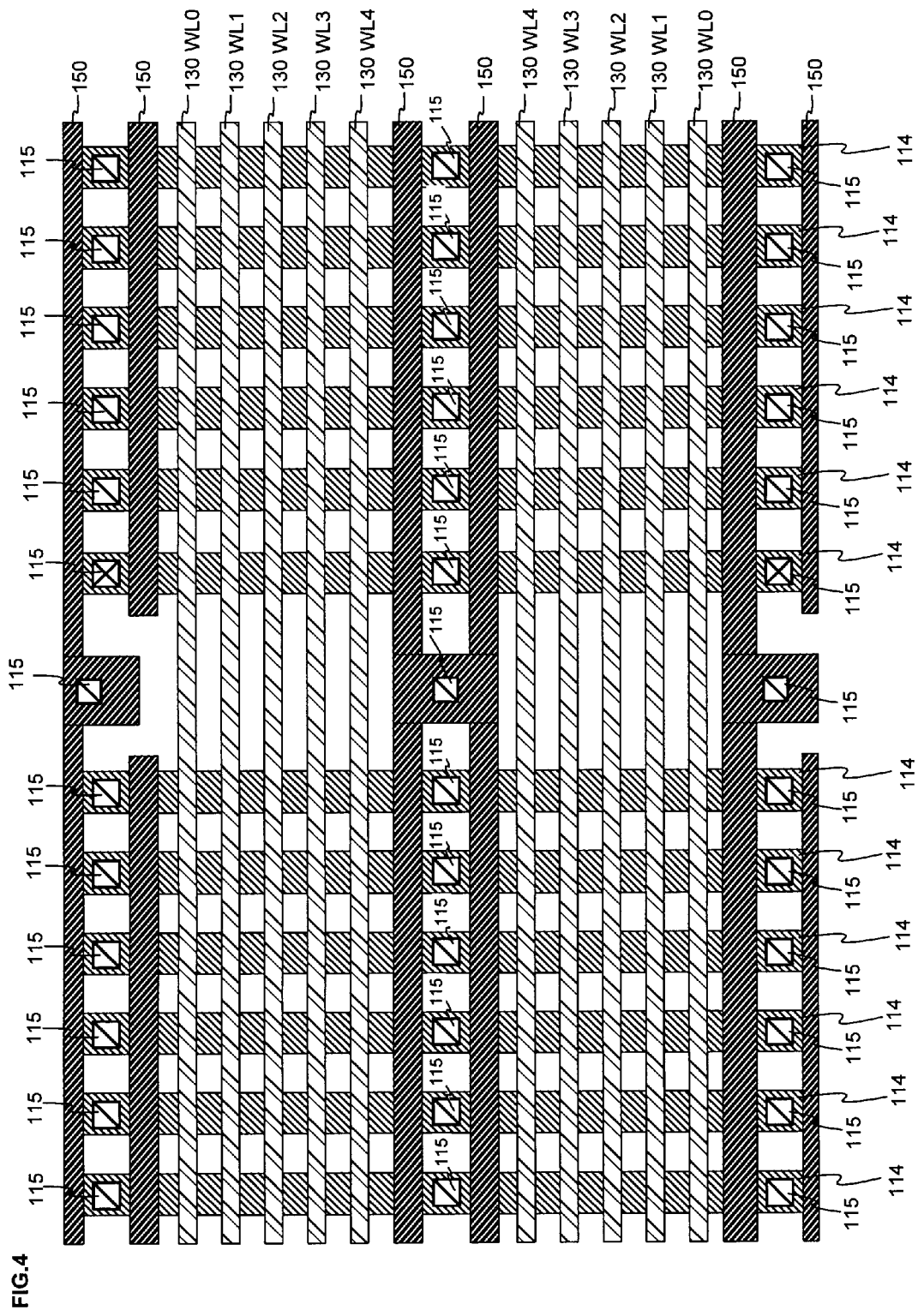
FIG. 4 is a typical drawing of the layout of a NAND cell of the non-volatile semiconductor memory device relating to a first embodiment of this invention.

FIG. 4 is a drawing which typically shows a NAND cell layout of the non-volatile semiconductor memory device relating to embodiment one of this invention. Each NAND string is placed axisymmetrical with a bit line contact at the center. Because the selection gate lines SGD150b and SGS150a are important wires related to access when reading (data) they are shunted by a wire metal layer (not shown in the drawings). Also, shunting by the wire metal layer is to lower the resistance of the selection gate line SGD150 which has a high resistance by electrically connecting it to a low resistance wire layer. The drain side selection gate line SGD150b shares a wire with an adjacent NAND string because there is insufficient area in a relationship which as much as possible makes the resistance of the shunt line smaller. While a diffusion layer 114 for forming a channel in a memory cell MC is lined in a direct line in a vertical direction towards FIG. 4 and is connected to an M0 by a diffusion layer—M0 contact (below, referred to as a CB contact 115) in the area between the selection gate lines SGD150b (not shown in the drawings). The diffusion layer 114 is connected to the M0 by the CB contact 115 in the area surrounded by the selection gate lines SGS150a and is connected to a source line in the cell array region by a cell source line of the M0 layer 116 which is commonly connected in a horizontal direction facing FIG. 4.

The row decoder 20 controls a selection circuit and activates a memory cell MC111 based on a decoded address signal.

The column decoder 30 is arranged between the sense amplifier 40 and a data bus, reads data in units of eight bits or sixteen bits from the latch of the sense amplifier 40 corresponding to a selected address and transmits this to a data bus. The transmitted data is output to the external input/output pad 210 via the data input/output buffer 50.

The sense amplifier 40 includes a latch function which stores read data and program data. The sense amplifier 40 amplifies the potential of the bit line 140 at the time of reading a page, latches the read data and also latches the program data inputted externally and loads the program data into the bit line 140 at the time of programming.

The address buffer 60 encodes the address data inputted externally and transmits it to the row decoder 20 or the column decoder 30. The row decoder 20 or the column decoder 30 decodes the encoded data and selects the word line 130 and the bit line 140 which is to be accessed.

The voltage generation circuit 70 receives a mode signal, a voltage generation timing control signal and a voltage level setting signal from the control circuit 90 and using a power voltage Vcc supplied externally and generates an internal voltage required for various modes such as a standard voltage Vref of reference or a program voltage Vpgm. Then, the voltage generation circuit 70 outputs the voltage to the circuit such as the row decoder 20 and the sense amplifier 40 which requires it.

A power on reset circuit 80 detects the activation of power, resets the control circuit resistor and outputs a signal for performing an initialization operation. The power on reset circuit 80 generates a power on reset signal which becomes a LOW level until the power voltage activated by the power reaches a predetermined voltage level and becomes HIGH after the predetermined voltage level is reached and outputs to the control circuit 90.

The control circuit 90 receives a command inputted externally and generates a mode signal such as a read operation, program operation and erasure operation. Then, the control circuit 90 outputs a timing control signal for generating a required voltage for each mode and a voltage setting signal, an address control signal and a memory cell access control signal in accordance with a resistor which stores a voltage setting level.

Also, the control circuit 90 outputs a control signal for initializing the address buffer 60, the column decoder 30, the row decoder 20, the sense amplifier 40, the latch circuit 200 and the voltage generation circuit 70 in FIG. 1 based on a power on reset signal.

That is, the control circuit 90 includes an initialization control circuit 91 for outputting a control signal for initializing, and a ROM read control circuit 92 which outputs a control signal for controlling a ROM read operation.

The operation of the power on reset circuit 80 and the control circuit 90 are outlined below. That is, the power voltage VCC is initialized and when it reaches a power on detection level a power on reset signal is output and a control signal for controlling a ROM read operation is output from the ROM read control circuit 92 and the ROM read operation starts.

The operations of programming, reading and erasing of the non-volatile semiconductor memory device relating to one embodiment of the present invention by this construction will be explained. In the non-volatile semiconductor memory device relating to one embodiment of the present invention because an amount of information of more that two-levels of data is programmed to the memory cell MC111, the programming and reading operations are different to a general non-volatile semiconductor memory device. Therefore, the programming and reading operations of a general non-volatile semiconductor memory device will be explained.

Figure 5:
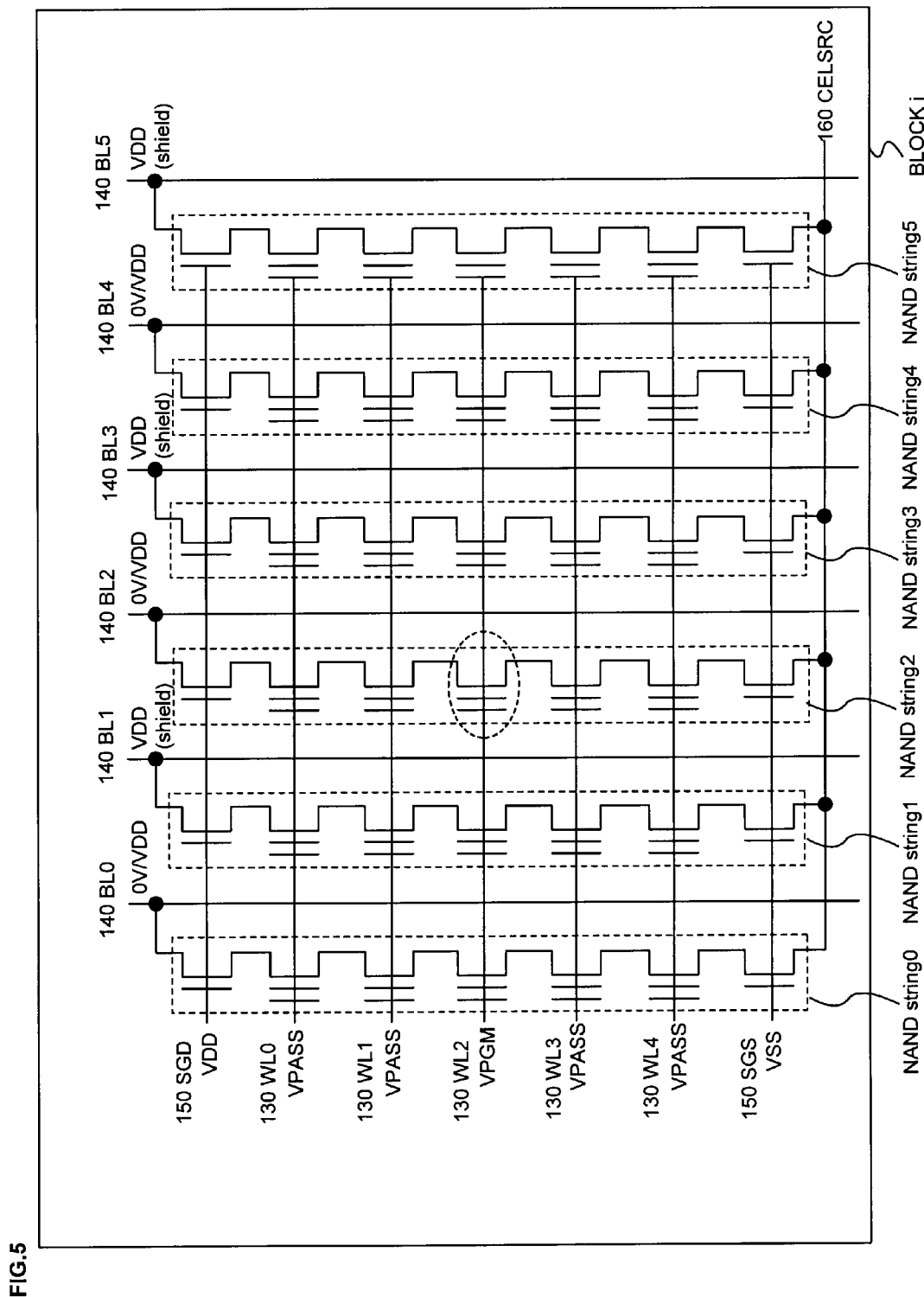
FIG. 5 is a drawing which shows the potential relationship at the time of programming in a memory cell block BLOCKi shown in FIG. 3.

FIG. 5 is a drawing which explains the potential relationship at the time of programming in a memory cell block BLOCKi shown in FIG. 3. An example in the case of programming to a memory cell MC111 which is connected to an even (even numbered) bit line and the word line WL2 in FIG. 5 will be explained. Programming in a NAND type flash memory is performed by applying 0V to a selected memory cell MC111, that is, 0V is applied to the bit line 140 connected to the memory cell MC111 which is to be programmed with (0) data. Alternatively, in the case when a memory cell MC111 is not programmed to, that is, in the case where the memory cell MC111 is left as (1) data, a voltage VDD is applied to the bit line 140 connected to the memory cell MC 111 and the drain side selection gate line SGD150 and 0V is applied to the source side selection gate line SGS150. Therefore, in the present example, 0V is applied to the bit lines BL0, BL2 and BL4 (140) and VDD is applied to the bit line BL1, BL3 and BL5. Also, VDD is applied to the drain side selection gate line SGD150b and 0V is applied to the source side selection gate line SGS150a.

Within a selected NAND string, by the application of these voltages, the potential of a channel which is desired to be programmed becomes 0V and the potential of a channel which is not desired to be programmed becomes (VDD−Vth_SGD).

After that, a program voltage Vpgm (about 20V) is applied to the selected word line WL2 (130) and a middle voltage Vpass (about 10V) is applied to the non-selected word lines WL0, WL1, and WL3 to WL5 (130). At this time, the potential of the channel within the NAND string is raised by capacitive coupling with the word line 130.

The bit lines BL1, BL3 and BL5 (140) which are applied with VDD are boosted to a voltage Vbst which is decided by the capacity ratio between the word line and the memory cell channel because the drain side selection gate line SGD150 is cut off when the potential of the channel becomes higher than (VDD−Vth).

Alternatively, 0V as a potential of the channel continues to be applied to the NAND string which is connected to the bit lines BL0, BL2 and BL4 which are applied with 0V from the bit line because the drain side selection gate line SGD150b is not cut off. By this, the potential of the memory cell channel of the NAND string of the bit lines BL0, BL2 and BL4 is 0V and the potential of the memory cell channel of the NAND string which is applied with VDD becomes Vbst, and a state where the memory cell MC with 0V is programmed with a tunnel current while the memory cell MC with Vbst is not programmed is realized.

By the above stated operations, a page program can be realized on the EVEN side word line WL2 (130) of the bit lines BL0, BL2 and BL4 (140). The bit lines BL1, BL3 and BL5 (140) perform the role of a shield for protecting against read-out noise and at the time of programming of an EVEN side bit line the potential of ODD side bit lines BL1, BL3 and BL5 (140) all become VDD and become a state (ALL1) where they are not programmed. When programming of an EVEN side bit line is completed, programming of an ODD side bit line is performed (specifically, a programming voltage is applied to the bit lines BL1, BL3 and BL5 (140) and VDD is applied to the bit lines BL0, BL2 and BL4 (140)).

Continuing, the program and read operation in the case where an amount of information of more than two-levels of data is programmed to a memory cell within one chip, will be explained. Here, an example in the case where four-levels data (two bit data) is programmed to the memory cell MC will be explained.

Four-levels data (two bit data) is stored in one memory cell. According to one embodiment of the present invention, program data is given as [(0) (program)] and [(1) (non-program)] and the four level data when combined with the program data is [11], [10], [01] and [00]. One bit of data from the four-levels data (two bit data) is LOWER PAGE data and another one bit of data is UPPER PAGE data and stored in the same memory cell.

Figure 6:
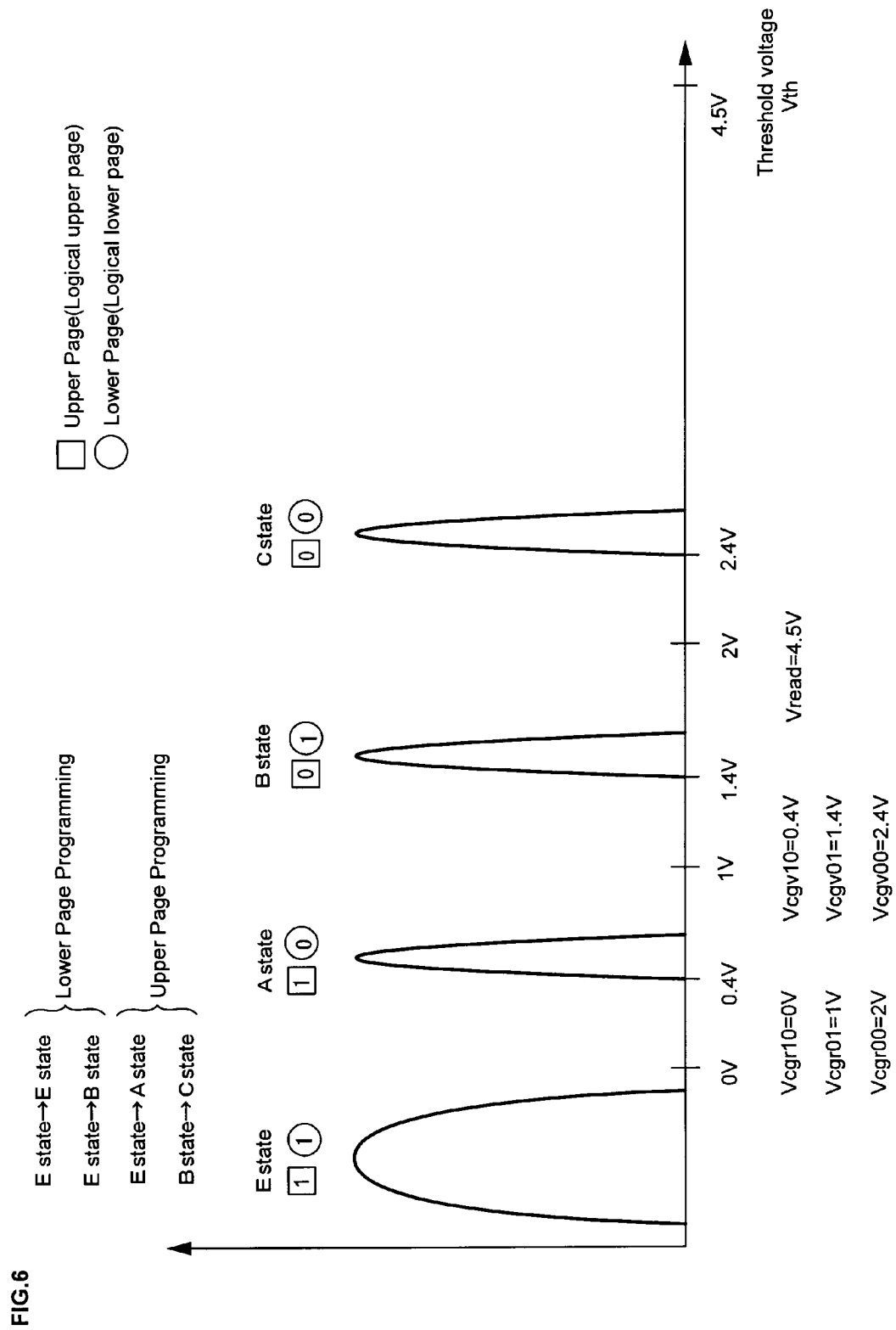
FIG. 6 is a drawing which shows the threshold voltage relationship of four-levels data.

As an example, the relationship between the four-levels data ([11], [10], [01] and [00]) and the threshold voltage of a memory cell is given as shown in the relationship in FIG. 6. In FIG. 6, LOWER PAGE data is shown as a square with white letters on a dark background and UPPER PAGE data is shown as a circle with white letters on a dark background.

In the case of controlling the four-levels data programming and reading, one level is allocated to a negative threshold voltage which is an erase state and three levels are allocated to a positive threshold voltage which is a program and read state. The positive threshold voltage is usually allocated between 0V-5V and while mutually taking a margin, is generally stepped up at a fixed proportion. Here, as an example, 0V is allocated to a program state [10], 1V is allocated to a program state [01] and 2V is allocated to a program state [00].

Also, in FIG. 6, Vcgv10 is a read voltage used in a verify read of the data [10] and is set with a fixed margin (for example, 0.4V). Vcgv01 is a read voltage (for example, 1.4V) used in a verify read of the data [01] and Vcgv00 is a read voltage (for example, 2.4V) used in a verify read of the data [00]. Vread is a transmission voltage which is applied to a non-selected word line.

In FIG. 6, the E state [11] is an erasure state. In an erasure state, LOWER PAGE data level and UPPER PAGE data level both become [1]. A memory cell in an erasure state has a negative threshold voltage Vth.

Similarly, in FIG. 6, an A state [10], B state [01] and C state [00] are program states. A memory cell in a program state has a positive threshold voltage. Also, the A state [10] among the program states has the lowest threshold voltage, the C state [00] has the highest threshold voltage, the B state [01] has a threshold voltage between the A state [10] and the C state [00].

A four-levels data is comprised from LOWER PAGE data and UPPER PAGE data, and a memory cell is programmed by a two time program operation. There are many ways to program, however, in order to simplify the explanation, programming is performed in the order from an E state to an E state or an A state, also, an E state to B state or an A state to a C state. In this case, the former program (from E to E or A) is called [LOWER PAGE program] and the latter program (from E to B or from A to C) is called [UPPER PAGE program].

First, programming of LOWER PAGE data is performed. Here, for the purposes of explanation, all the memory cells are initially in an erasure state, that is an E state [11]. When programming of LOWER PAGE data is performed, the distribution of the threshold voltage of the memory cell MC, is divided into two, corresponding to a [1] level of program data (LOWER PAGE data) or a [0].

That is, in the case of LOWER PAGE data [1], by making a bit line [H] (a potential of a word line is a program voltage Vpgm), boosting of the threshold voltage Vth of the memory cell MC is prevented so that a high electric field does not affect a tunnel oxide film of the memory cell MC. As a result, the memory cell MC maintains (programming of LOWER PAGE data [1]) an erasure state (E state [11]).

Alternatively, in the case of LOWER PAGE data [0], by making a bit line [L] (a potential of a word line is a program voltage Vpgm) a high electric field is applied to the tunnel oxide film of the memory cell MC, electrons are injected into the electrode of a floating gate and the memory cell threshold voltage Vth is only boosted by a predetermined amount. As a result, the memory cell changes (programming of LOWER PAGE data [0]) to a program state (A state [10]). After this, programming of UPPER PAGE data is performed.

In the case of UPPER PAGE data [1], by making a bit line [H] (a potential of a word line is a program voltage), boosting of the threshold voltage Vth of the memory cell MC is prevented so that a high electric field does not affect a tunnel oxide film of the memory cell MC. As a result, the memory cell MC of the E state [11] (erasure state) which is LOWER PAGE data [1] maintains the E state [11] as it is (programming of UPPER PAGE data [1]). Also, the memory cell MC of the A state [10] state which is LOWER PAGE data [0] maintains the A state [10] as it is (programming of UPPER PAGE data [1]).

Alternatively, in the case of UPPER PAGE data [0], by making a bit line [L] a high electric field is applied to the tunnel oxide film of the memory cell MC, electrons are injected into the electrode of a floating gate and the memory cell threshold voltage Vth is only boosted by a predetermined amount. As a result, the memory cell of the E state [11] (erasure state) which is LOWER PAGE data [1] changes to a B state [01] (programming of UPPER PAGE data [0]). Also, the memory cell of the A state [10] state which is LOWER PAGE data [0] changes to a C state [00] (programming of UPPER PAGE data [0]).

In this way, by a two time program operation, the distribution of a memory cell threshold voltage Vth is divided into four [11], [10], [01], [00]. According to the present example, when the UPPER PAGE data is [0], the E state [11] memory cell changes to a B state [01] and the A state [10] memory cell changes to a C state [00].

The relationship between the memory cell and data is as follows. That is, if the threshold voltage of the memory cell MC is less than Vcgr10 then the memory cell MC data is [11], and in the case where the threshold voltage of the memory cell MC exceeds Vcgr10 and is below Vcgr01, the memory cell MC data is [10]. Also, in the case where the threshold voltage of the memory cell MC exceeds Vcgr01 and is below Vcgr00, the memory cell MC data is [01] and in the case where the threshold voltage of the memory cell MC exceeds Vcgr00, the memory cell MC data is [00].

Usual reading of LOWER PAGE data, for example, is realized by a two time read operation ([READ00], [READ10]). READ00 is a read operation which uses Vcgr00 (for example, 2V) as a read voltage and READ10 is a read operation which uses Vcgr10 (for example, 0V) as a read voltage. Also, reading of UPPER PAGE data, for example, is realized by a one time operation (READ01). READ01 is a read operation which uses Vcgr01 (for example, 1V) as a read voltage.

Furthermore, programming, erasing and reading of an amount of information of more than two-levels of data in the case when the word line WL2 and an odd numbered bit line BL0, BL2, BL4 is selected at the time of programming and reading, will be explained.

The chart 1 and chart 2 shows the potential of each part within a flash memory in an erasure, program, read and program verify. In chart 1 and chart 2, BLe represents an even numbered bit line and BLo represents an odd numbered bit line. SGD represents a select gate line of a drain side (bit line side) selection gate transistor and SGS represents select gate line of a source side (source line side) selection gate transistor, WL1, WL2, WL3, WL4 represents word lines, C-source represents a source line and C-p-well represents a well (cell p well) in which a cell is formed.

CHART 1

|  | erase | first level programming | second level programming | program inhibition | 10 read | 01 read | 00 read |
|---|---|---|---|---|---|---|---|
| BLe | Floating | 0 V | 0.4 V | Vdd | HorL | HorL | HorL |
| BLo | Floating | Vdd | Vdd | Vdd | 0 V | 0 V | 0 V |
| SGD | Floating | Vdd | Vdd | Vdd | 4.5 V | 4.5 V | 4.5 V |
| WL3 | 0 V | 10 V | 10 V | 10 V | 4.5 V | 4.5 V | 4.5 V |

CHART 1-continued

|  | erase | first level programming | second level programming | program inhibition | 10 read | 01 read | 00 read |
|---|---|---|---|---|---|---|---|
| WL2 | 0 V | Vpgm | Vpgm | Vpgm | 0 V | 1 V | 2 V |
| WL1 | 0 V | 0 V | 0 V | 0 V | 4.5 V | 4.5 V | 4.5 V |
| WL0 | 0 V | 10 V | 10 V | 10 V | 4.5 V | 4.5 V | 4.5 V |
| SGS | Floating | 0 V | 0 V | 0 V | 4.5 V | 4.5 V | 4.5 V |
| C-source | Floating | 0 V | 0 V | 0 V | 0 V | 0 V | 0 V |
| C-p-well | 20 V | 0 V | 0 V | 0 V | 0 V | 0 V | 0 V |

CHART 2

|  | 10 first level program verify | 10 second level program verify | 01 first level program verify | 01 second level program verify | 00 first level program verify | 00 second level program verify |
|---|---|---|---|---|---|---|
| BLe | HorL | HorL | HorL | HorL | HorL | HorL |
| BLo | 0 V | 0 V | 0 V | 0 V | 0 V | 0 V |
| SGD | 4.5 V | 4.5 V | 4.5 V | 4.5 V | 4.5 V | 4.5 V |
| WL3 | 4.5 V | 4.5 V | 4.5 V | 4.5 V | 4.5 V | 4.5 V |
| WL2 | 0.2 V | 0.4 V | 1.2 V | 1.4 V | 2.2 V | 2.4 V |
| WL1 | 4.5 V | 4.5 V | 4.5 V | 4.5 V | 4.5 V | 4.5 V |
| WL0 | 4.5 V | 4.5 V | 4.5 V | 4.5 V | 4.5 V | 4.5 V |
| SGS | 4.5 V | 4.5 V | 4.5 V | 4.5 V | 4.5 V | 4.5 V |
| C-source | 0 V | 0 V | 0 V | 0 V | 0 V | 0 V |
| C-p-well | 0 V | 0 V | 0 V | 0 V | 0 V | 0 V |

A memory cell in an initialization state becomes a [11] state. Also, in an erase operation by applying 20V to the cell p well C-p-well and applying 0V to all the word lines WL0, WL1, WL2, WL3 within the selected block, electrons are released from the floating gate and the memory cell within that selected block becomes a [11] state.

At the time of an erase operation, a word line within a non-selected block, all the bit lines and a control gate line and a source line become a state of floating. As a result, the potential of these conducting lines is boosted up to near 20V by capacitive coupling with cell p well C-p-well.

Programming is conducted by applying 14V-20V as a program voltage Vpgm to the selected word line WL2. Because the selected bit line BLe is set at 0V, in the selected memory cell which is connected to these selected word lines WL2 and the selected bit line BLe, electrons are injected into the floating gate electrode and the threshold increases rapidly (first level programming).

If the threshold of the selected memory cell rises to near the target level, in order to suppress the speed of the rise of the threshold for the purpose of stopping the threshold of that selected memory cell near the target level, the potential of the selected bit line BLe is raised to about 0.4V (second level programming).

Because the rise in the threshold of the non-selected memory cell is inhibited, the potential of the bit line BLe is made a power voltage Vdd (for example, about 3V) (program inhibition).

Reading is performed by applying 0V, 1V or 2V as a read voltage to the selected word line WL2.

At this time, when the threshold of the selected memory cell is lower than the read voltage, the bit line BLe and the common source line C-source are shunted and the potential of the bit line BLe becomes a low level [L]. Alternatively, when the threshold of a selected memory cell exceeds the read voltage, because the bit line BLe and the common source line C-source are non conductive, the potential of the bit line BLe becomes high [H].

By setting a read voltage to 0V it is judged whether a memory cell is in a [11] state or a [10] state or a [00] state (10 read). Also, by setting a read voltage to 1V it is judged whether a memory cell is in a [11] state or a [01] state or a [00] state (01 read). Further, by setting a read voltage to 2V it is judged whether a memory cell is in a [11] state or a [10] state or a [00] state (00 read).

The lower limit of the threshold distribution of a memory cell which is in a [10] state, for example, is set at a level more than 0.4V in order to give a read margin of more than 0.4V as opposed to a read voltage of 10 read of 0V, and in the present example, is set at 0.4V. Whether the threshold of all the memory cells in a [10] state has a voltage of more than 0.4V is verified by a 10 verify read. Then, a program inhibition is applied to a memory cell in which the threshold has reached 0.4V and a rise in the threshold is inhibited.

Similarly, the upper limit of the threshold distribution of a memory cell which is in a [01] state, for example, is set at a level more than 1.4V in order to give a read margin of more than 0.4V as opposed to a read voltage of 01 read of 1V, and in the present example, is set at 1.4V. Whether the threshold of all the memory cells in a [01] state has a voltage of more than 1.4V is verified by a 01 program verify. Then, a program inhibition is applied to a memory cell in which the threshold has reached 1.4V and a rise in the threshold is inhibited.

Also, the upper limit of the threshold distribution of a memory cell which is in a [00] state, for example, is set at a level more than 2.4V in order to give a read margin of more than 0.4V as opposed to a read voltage of 00 read of 2V, and in the present example, is set at 2.4V. Whether the threshold of all the memory cells in a [00] state has a voltage of more than 2.4V is verified by a 00 program verify. Then, a program inhibition is applied to a memory cell in which the threshold has reached 2.4V and a rise in the threshold is inhibited.

A program verify is performed by applying Vcgv10 (=0.4V), Vcgv01 (=1.4V), Vcgv00 (=2.4) as a verify voltage to the selected word line WL2.

Here, it is effective to perform a two step level program verify to narrow the width of the threshold distribution. A two step level program verify is a verify in which two kinds of verify voltage levels, a normal level and a level lower than the normal level are prepared and a program verify is executed using these two kinds of verify voltage.

For example, in a [10] program verify, first, 0.2V is applied to the selected word line WL2 as a verify voltage Vcgv10 and a [10] first step program verify is carried out. Then, when a [10] first step program verify is completed in a memory cell, after this, 0.4V is applied as a verify voltage Vcgv10 and a [10] second step program verify is carried out.

Similarly, in a [01] program verify, 1.2V ([01] first step program verify) and 1.4V ([01] second step program verify) are used as a verify voltage Vcgv01 and in a [00] program verify, 2.2V ([00] first step program verify) and 2.4V ([00] second step program verify) are used as a verify voltage Vcgv00.

In the case where the threshold of a memory does not reach a verify voltage, because the bit line BLe and the common source line C-source are shunted the voltage of the bit line BLe becomes a low level [L]. When the threshold of a memory cell exceeds the verify voltage, because the bit line BLe and the common source line C-source become non conductive, the voltage of the bit line BLe becomes high [H].

In a multi-level flash memory, n bits (n is a plurality) or $2^n$ level data is stored in one memory cell. Therefore, as the threshold distribution of a memory cell it is preferred that it is sharp and narrow. In order to obtain this kind of sharp and narrow threshold distribution, the following program and threshold control method is taken in the semiconductor memory device related to embodiment one of this invention.

The program voltage Vpgm is stepped up by a fixed proportion voltage Dvpgm (for example, 0.2V) from an initial level. The program voltage Vpgm is applied to a memory cell as a pulse signal (program pulse) and every time the pulse signal is applied to a memory cell, the voltage only rises by that potential (program voltage Vpgm).

When 0V is applied to a bit line which is connected to a memory cell which is to be programmed, after a number of pulse signals are applied the threshold of that memory cell rises by a rise ratio (0.2V/pulse) the same as the program voltage Vpgm.

After executing a program using a pulse signal a program verify is carried out. In the program verify, the potential of the bit line which is connected to a memory cell in which the threshold reaches a program verify voltage is set as Vdd (power voltage). In other words, whether programming is finished in each cell is verified and the memory cell in which programming is finished is separately set as a program inhibition state. According to this kind of program and threshold control method, it is possible to control the width of the threshold distribution to about the same rising ratio of the threshold per one pulse, that is, 0.2V.

Figure 7:
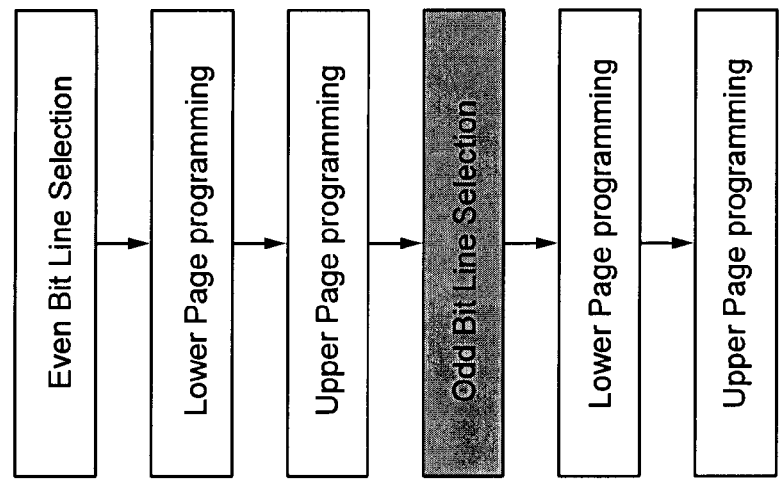
FIG. 7 is a drawing which shows a programming sequence in the non-volatile semiconductor memory device relating to a first embodiment of this invention.
Figure 8:
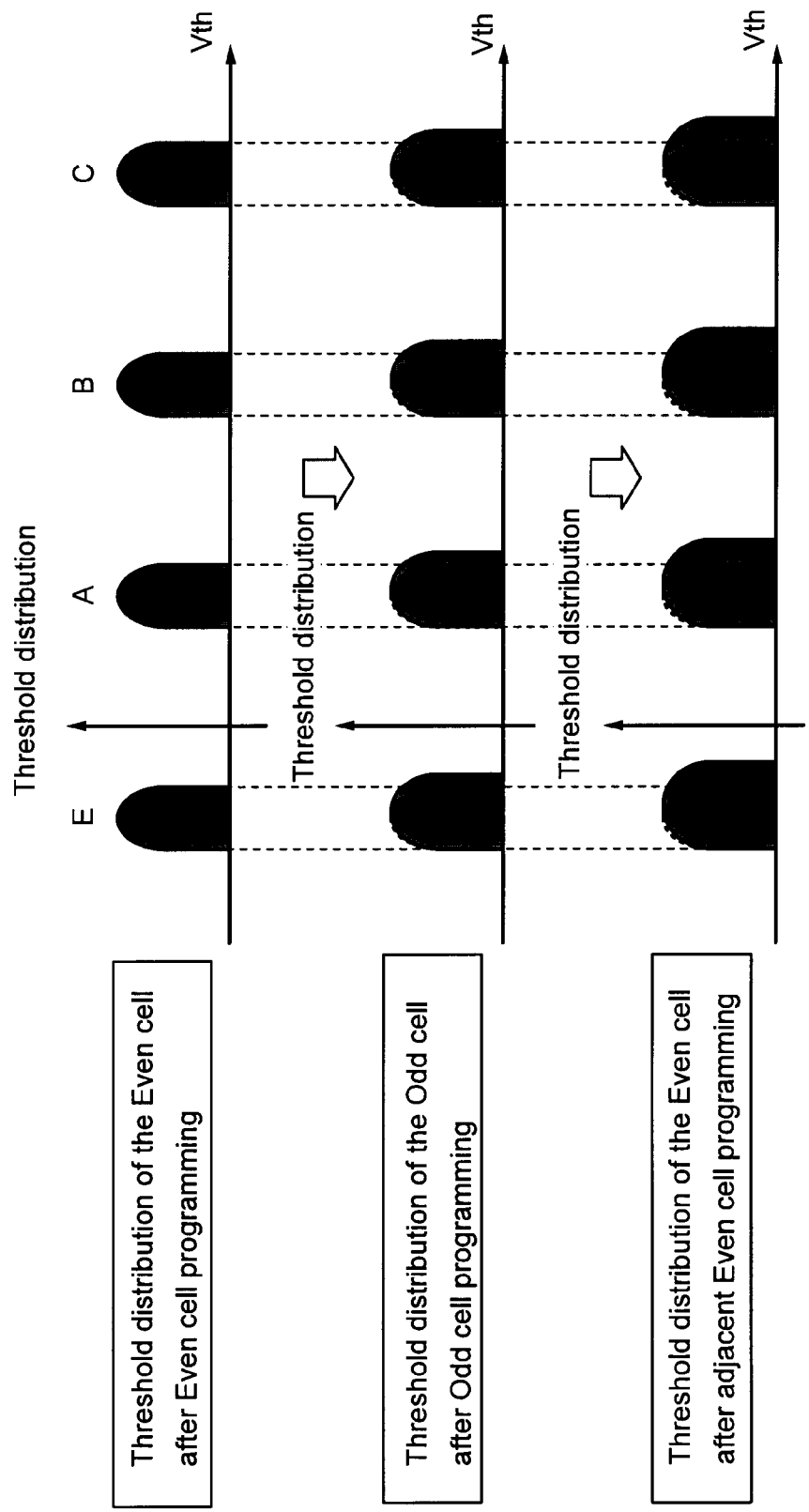
FIG. 8 is a typical drawing of the threshold distribution which shows the effect of capacitive coupling in a NAND type cell.

The sequence of series of programming is represented as in FIG. 7. FIG. 7, shows a programming sequence of the non-volatile semiconductor memory device related to one embodiment of this invention. Also, FIG. 8 is a typical threshold distribution which shows the effects of capacitive coupling of a NAND type cell. As a way of programming, there are many ways, however, in order to simplify explanation it is programmed in the order from an E state to an E state or A state, also, an E state to a B state or an A state to a C state. In this case, the former programming (from an E to an E or A) is called a LOWER PAGE programming and the latter programming (from an E to a B or from an A to a C) is called an UPPER PAGE programming.

First, program data as to whether to program (0 data) or not to program (1 data) is applied to the EVEN side bit line BL0, BL2 and BL4. In the case of two bit multi-levels, four threshold distribution states as a state, are as shown in FIG. 8.

First, in order to program, the EVEN bit lines BL0, BL2 and BL4 (140) are selected. A program voltage 0V or a non-program voltage VDD is applied to the EVEN bit lines BL0, BL2 and BL4 (140). After that, LOWER PAGE programming is carried out and then UPPER PAGE programming is carried out.

Continuing, the ODD bit lines BL1, BL3 and BL5 (140) are selected. A program voltage 0V or a non-program voltage VDD is applied to the EVEN bit lines BL0, BL2 and BL4 (140) and then LOWER PAGE programming is carried out and then UPPER PAGE programming is carried out.

Figure 9:
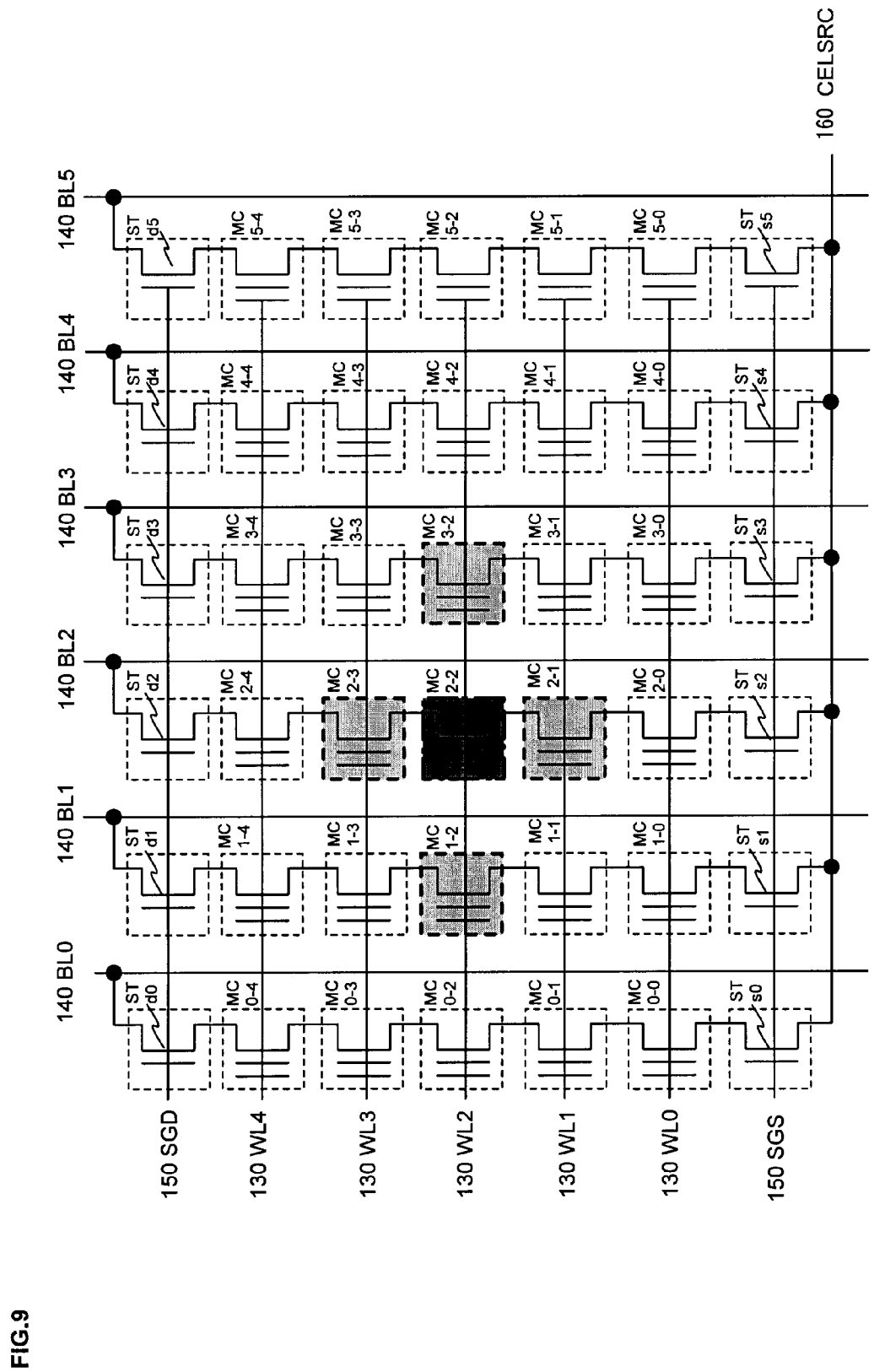
FIG. 9 is a typical drawing which shows the effect of capacitive coupling in a NAND type cell in the non-volatile semiconductor memory device relating to a first embodiment of this invention.

In the case of programming two bit multi-levels, the above stated programming sequence is used, however, the problem here is the effect of capacitive coupling of an adjacent cell. FIG. 9 is a typical drawing which shows the effects of capacitive coupling of a NAND type cell.

The floating gate (FG) of the memory cell MC has capacitive coupling with the floating gates of adjacent memory cells MC in a bit line direction, word line direction and diagonal direction. The floating gate of the memory cell MC2-2 shown in FIG. 9 has capacitive coupling with the adjacent memory cells MC1-1, MC1-2, MC1-3, MC2-1, MC2-3, MC3-1, MC3-2 and MC3-3. However, particularly because the capacitive coupling of the adjacent memory cells MC2-1, MC2-3 in a bit line direction and the adjacent memory cells MC1-2, MC3-2 in a word line direction is larger than the capacitive coupling of the adjacent memory cells MC1-1, MC1-3, MC3-1 and MC3-3 in a diagonal direction, the effects becomes greater. Alternatively, although the memory cells MC1-1, MC1-3, MC3-1 and MC3-3 in a diagonal direction have capacitive coupling the effect is small.

In the case where a consecutive programming sequence shown in FIG. 7 is assumed, the form of the effect of capacitive coupling appears is as shown in FIG. 8. In FIG. 8, a typical drawing which shows the threshold distribution of a memory cell MC, which is connected to the EVEN bit lines BL0, BL2 and BL4, is taken as an example, (below referred to as EVEN memory cell MC) and the case of programming to a memory cell MC which is connected to the adjacent ODD bit lines BL1, BL3 and BL5 (below referred to as ODD memory cell MC) and the case of further programming to the adjacent EVEN memory cell MC. The memory cell MC2-2 in FIG. 9 is used as an example for the purposes of explanation.

First, the EVEN bit lines BL0, BL2 and BL4 are selected and a program voltage is applied. At this time, the threshold distribution of the memory cell MC2-2 becomes as shown by the upper level in FIG. 8. Next, the ODD bit lines BL1, BL3 and BL5 are selected and when they are in a programmed state, because the memory cell MC2-2 has capacitive coupling with the adjacent memory cells MC1-2 and MC3-2, the threshold distribution of the memory cell MC2-2 becomes as shown in the middle level of FIG. 8. The threshold distribution becomes wider by the effect of capacitive coupling of the ODD memory cells MC.

Further, the word line WL3 is selected and the memory cell MC2-3 which is connected to the same EVEN bit line BL2 is programmed. Then, because the memory cell MC2-3 also has capacitive coupling with the memory cell MC2-2 the threshold distribution of the memory cell MC2-2 becomes even wider as shown in the lower level of FIG. 8 by programming to the ODD memory cells.

In other words, this is because a shift in the threshold of the ODD memory cell MC at the time of read by the effect caused by the shift in the amount of charge of the floating gate (FG) by programming of the memory cell MC can be seen.

Because this effect depends on the threshold of a programmed adjacent cell the threshold distribution does not widen uniformly as accurately as that shown in the drawing, however, in the case where an adjacent cell MC is programmed, the original width of the threshold distribution of the memory cell always widens.

Therefore, in the memory cell which stores by multi-levels, because a plurality of levels are programmed in one memory cell the number of programs synergistically increases. As a result, even though the threshold distribution is narrowed as much as possible and a margin is taken for the shift in the memory cell MC with regards to the reliability of data retention and read disturbance (stress shift caused by the application of a read voltage) the threshold distribution of the memory cell becomes wider due to capacitive coupling of an adjacent memory cell MC and a margin for reliability is reduced by miniaturization.

The widening of this threshold distribution can be reduced by making the width of a program voltage step up smaller and programming. However, in the case where the step up width is simply made smaller, the number of times a program voltage is applied increases, the entire program time becomes longer and program speed drops and thus is not practical. Therefore, while reducing the drop in program speed, reducing the widening of this threshold distribution is becoming an important technological issue in the progress of multi-levels programming.

In the present invention, at the time of programming to and reading of a memory cell MC, each memory cell MC is allocated between a memory cell which stores data with more information than a memory cell which stores data with a small amount of information based on the address of the memory cell MC. Then, by this, it is possible to reduce the effect caused by large capacitive coupling from an adjacent memory cell in word line direction and in a bit line direction.

Figure 10:
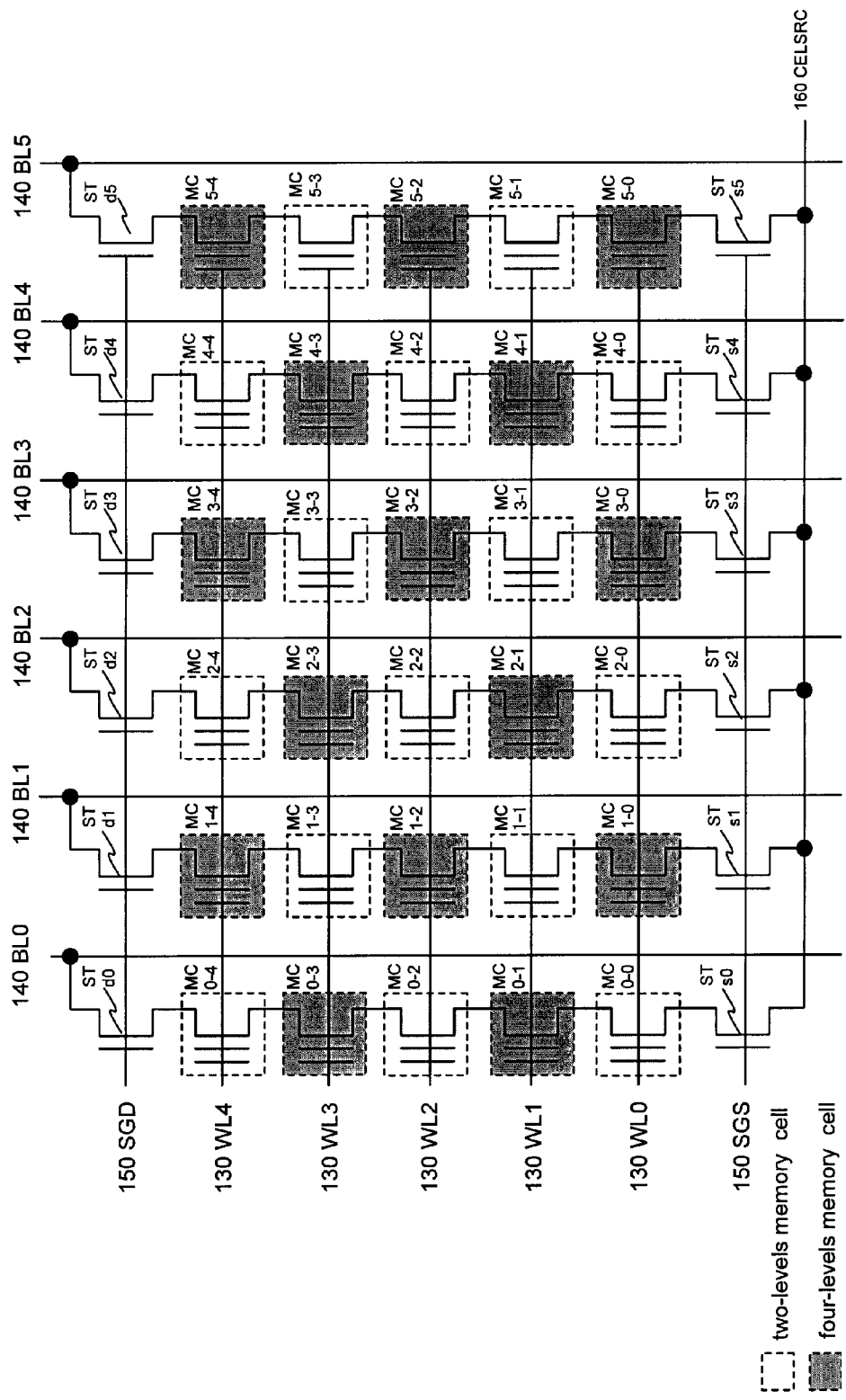
FIG. 10 is a typical drawing of the allocation of two-levels data and four-levels data to a memory cell in the non-volatile semiconductor memory device relating to a first embodiment of this invention.

FIG. 10 is a typical drawing of the allocation of memory cells MC in the non-volatile semiconductor memory device relating to embodiment one of the present invention. The present embodiment is an example of the allocation of each memory cell MC between memory cells MC which store two-levels data and memory cells MC which store four-levels data. In the present embodiment the memory cells MC which are adjacent in a bit line direction and a word line direction are allocated in a checkered flag shape so that each memory cell MC stores data with a different amount of information.

That is, in the case where a certain specific memory cell MC is allocated so that two-levels data is stored, the memory cell which is adjacent to this memory cell MC on both sides on the same bit line and the memory cell which is adjacent to this memory cell on both sides on the same word line are allocated so that four-levels data is stored.

This allocation is decided based on the address of the memory cell. Specifically, first, the bit lines 140 are separated into EVEN bit lines 140 and ODD bit lines 140 and the word lines 130 are similarly separated into EVEN word lines 130 and ODD word lines 130. Then, a combination of the bit lines 140 and the word lines 130 is separated into a first group of memory cells EVEN-EVEN and ODD-ODD and a second group of memory cells made up of the other memory cells. Then, in the non-volatile semiconductor memory device relating to embodiment one of the present invention, because programming to a memory cell MC begins from the EVEN bit line 140 in order to reduce the effect of capacitive coupling, the first group of memory cells are allocated so that each memory cell stores two-levels data which is data with a small amount of information, and the second group of memory cells are allocated so that each memory cell stores four-levels data.

Specifically, in FIG. 10, in the case where the memory cell MC2-2 which is included in the first group of memory cells, is allocated so that two-levels data is stored, the memory cells MC2-1 and MC2-3 which are adjacent on the same bit line BL2 (140) and the memory cells MC1-2 and MC3-2 which are adjacent on the same word line WL2 (130) are allocated so that four-levels data is stored. Similarly, when the memory cell MC3-2 is looked at, that memory cell MC is allocated so that four-levels data is stored, however, the memory cells MC3-1 and MC3-3 which are adjacent on the same bit line BL3 (140) and the memory cells MC2-2 and MC4-2 which are adjacent on the same word line WL2 (130) are all allocated so that two-levels data is stored.

This allocation, is decided based on the address of a memory cell MC as stated above, and is stored as fuse data in the ROM region 120 within the memory cell array 100 shown in FIG. 1. In this way, the ROM region 120 which stores the fuse data is called a ROM fuse. This fuse data is read from the ROM region 120 by a ROM read operation and is set in the latch circuit 200. Therefore, in embodiment one of the present invention, by the set fuse data, all the memory cells MC can be made memory cells MC which store two-levels data (below an operation mode which handles the storing of two-levels data is called two cell mode and the memory cell MC which is allocated with a two cell mode is called two-levels cell) and memory cells MC which store four-levels data (below an operation mode which handles the storing of four-levels data is called four cell mode and the memory cell MC which is allocated with a four cell mode is called four-levels cell). By changing of an operation mode, a non-volatile memory device can be used in two cell mode, four cell mode, and two-levels & four-levels checkered flag shape mixture mode.

Further, in the present invention, an operation mode is allocated to all the memory cells MC of a non-volatile memory device by the ROM fuse, however, the allocation of an operation mode is not limited to this. For example, two fuse circuits can be arranged within the power on reset circuit 80, fuse data is programmed corresponding to each address, these fuse data are read immediately after power on and supplied to the delay circuit 82. Also, it may be controlled by an external input.

The program sequence in embodiment one of the present invention will be explained in detail based on FIG. 10. Programming begins with programming of the memory cells connected to the EVEN bit lines BL0, BL2 and BL4 (140). First, the word line WL0 (130) is selected. Next, the EVEN bit lines BL0, BL2 and BL4 (140) are selected and page programming is carried out. In this case, because all the memory cells MC0-0, MC2-0 and MC4-0 which are connected to the word line WL0 (130) and each bit line are set so that two-levels data is stored, two-levels data programming is carried out.

When this programming is completed, next, the ODD bit lines BL1, BL3 and BL5 (140) are selected and page programming is carried out. In this case, because all the memory cells MC1-0, MC3-0 and MC5-0 which are connected to the word line WL0 (130) and each bit line are set so that four-levels data is stored, four-levels data programming is carried out. First, after LOWER PAGE programming is carried out UPPER PAGE programming is carried out.

In this programming, the effect of capacitive coupling caused by programming of the memory cells MC1-0, MC3-0 and MC5-0 which are connected to an ODD bit line (140) reaches to the memory cells MC0-0, MC2-0 and MC4-0 which are connected to an adjacent EVEN bit line (140). However, because two-levels data programming is already being carried out in the adjacent memory cells MC0-0, MC2-0 and MC4-0, there is a margin for a sufficient threshold distribution shift and it is possible to absorb the effect of capacitive coupling.

Continuing, programming is carried out to the memory cells MC which are connected to the word line WL1. After the word line WL1 is selected, the EVEN bit lines BL0, BL2 and BL4 (140) are selected and programming is carried out. In this case, the memory cells MC0-1, MC2-1 and MC4-1 which are connected to the word line WL1 and each bit line and because these memory cells are made into memory cells which store four-levels data, four-levels data programming is carried out.

Even in this programming, the effect of capacitive coupling reaches the adjacent memory cells MC0-0, MC2-0 and MC4-0 along the bit line 140, however, these memory cells MC0-0, MC2-0 and MC4-0 are already being programmed with two-levels data, there is a sufficient margin for the shift of the threshold distribution and it is possible to absorb the effect of capacitive coupling.

Further, the ODD bit lines BL1, BL3 and BL5 (140) are selected and programming is carried out. At this time, because the memory cells MC1-1, MC3-1 and MC5-1 which are connected to the word line WL1 (130) and each bit line are made into memory cells which store two-levels data and two-levels data programming is carried out.

In this programming, in the memory cells MC1-0, MC3-0 and MC5-0 which are connected to each memory cell which are already programmed along the selected ODD bit lines BL1, BL3 and BL5 (140) and connected to the word line WL0 (130) the threshold distribution shifts by the effect of capacitive coupling. However, four-levels data is already programmed in these memory cells MC1-0, MC3-0 and MC5-0. Also, because programming to the memory cells MC1-1, MC3-1 and MC5-1 is two-levels data, the shift of the threshold distribution of each of these memory cells is small and the effect of capacitive coupling is small. Below, programming is controlled so that it is conducted by word lines (130) (that is, programmed in page units).

As stated above, by making a memory cell which is adjacent in a word line direction and a bit line direction which has large capacitive coupling a two-levels cell (that is, allocated so that two-levels data is stored in these memory cells) it is possible to reduce the effect of capacitive coupling in the four-levels cell. Alternatively, the effect of capacitive coupling in a two-levels cell from a four-levels cell, because the two-levels cell has a sufficient margin in the threshold distribution it is possible to absorb that effect. Also, at the time of programming the two-levels cell, because a read voltage of the non-selected word line is set lower compared to that of a four-levels cell, it is possible to reduce read disturbance (a stress shift by the application of a read voltage). In one embodiment of the present invention, in the memory cell which stores data with an amount of information of more than two-levels, it is possible to reduce widening of the threshold distribution by capacitive coupling with an adjacent memory cell and reduce the effect caused by interference of an adjacent memory cell.

Also, in embodiment one of the present invention, by changing of an operation mode, because it is possible to make the data which is stored in a memory cell MC a mixture of two-levels data and four-levels data and a checkered flag shape (two-levels and four-levels mixed mode) at the time of programming a two-levels cell, because the number of programming times is few the stress at the time of programming of a four-levels cell is reduced. Also, because half of the memory cells MC are a two-levels cell it is possible to accelerate the program speed over the entire cell.

Further, by the changing of this operation mode, when speed in programming is demanded, it is possible to use the entire memory as a high speed programmable memory with a two-levels cell mode. Alternatively, when large capacity is demanded more than program speed, it is possible to use the whole memory as a large capacity storage memory with a four-levels cell mode by changing the operation mode. Further, when either program speed or large capacity is demanded, it is possible to fulfill this demand by using a mixture of a two-levels cell and four-levels cell mode by changing the operation mode. In the same memory, because it is possible to accommodate the demands of different users, and because it is possible to improve the efficiency of a production line, production costs can be cut and the cost of memory chips can be cut.

In embodiment one of the present invention, the two-levels mode and four-levels mode as stated above, become operation modes which continue to raise the level of programming performance and relieve the stresses of programming and reading. Therefore, reliability is high, in the case when the reliability of a four-levels cell mode is low, it is effective for guaranteeing reliability in the same chip aimed at the high end market which emphasizes reliability and performance.

Embodiment Two

In the non-volatile semiconductor memory device relating to embodiment two of the present invention, the operation mode allocation which is stored by a memory cell MC, is allocated into a checkered flag shape of two-levels data and eight-levels data.

In order to significantly increase storage capacity by memory chip high integration, further miniaturization than hitherto is required, however, it is possible to significantly increase storage capacity by storing multi data in one cell (data which has an amount of information of more than two-levels). In this case, a plurality of different threshold values are required for programming and reading and it is necessary to narrow the threshold distribution and the width of the step up. However, in the case of narrowing the threshold distribution, the effect of capacitive coupling with an adjacent memory cell becomes even greater and when storing data of an amount which has information of more than two-levels, because the number of times a program voltage is applied increases there is a reduction in program speed.

Therefore, when the data which is stored by a memory cell MC is made the same data which has an amount of information more than two-levels (for example, eight-levels data) as an entire memory chip, because the threshold distribution is narrow, the effect of capacitive coupling with an adjacent memory cell MC in a word direction and a bit direction becomes large. In the non-volatile semiconductor memory device relating to embodiment two of the present invention, even in the case when eight-levels data is stored in a memory cell, it is possible to reduce capacitive coupling with an adjacent memory cell MC in a word line direction and a bit line direction.

Figure 11:
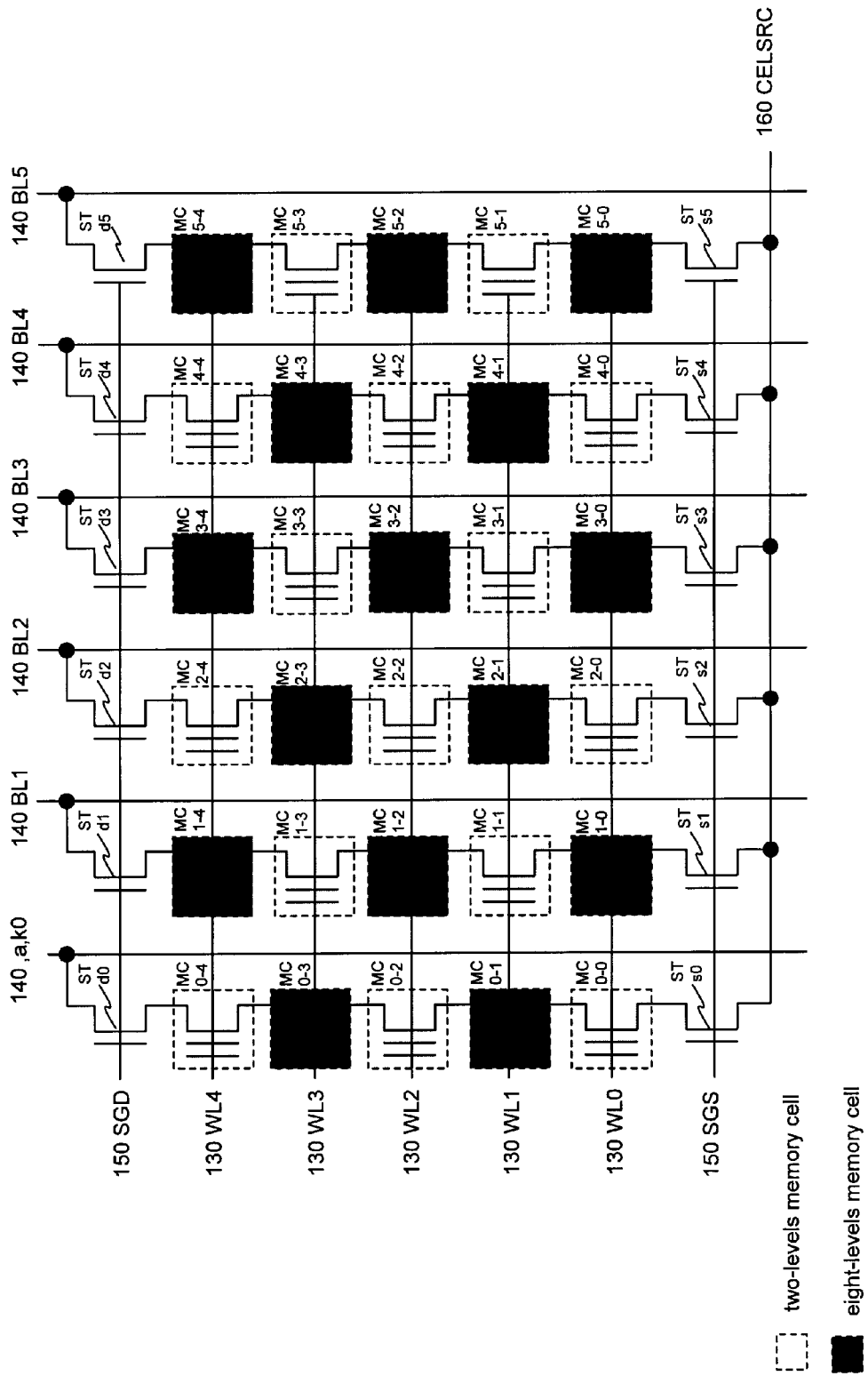
FIG. 11 is a typical drawing of the allocation of two-levels data and eight-levels data to a memory cell in the non-volatile semiconductor memory device relating to a second embodiment of this invention.

FIG. 11 is a typical drawing of a memory cell operation mode allocation of a non-volatile semiconductor memory device relating to embodiment two of the present invention. In FIG. 11, in the case where a certain specific memory cell MC is allocated an operation mode so that data which has an amount of information of more than two-levels (here eight-levels data) the memory cells MC which are adjacent on both sides of the this memory cell on the same bit line and the memory cells MC which are adjacent on both sides of this memory cell MC on the same word line are allocated with an operation mode so that data (here two-levels data) of an amount of information less than data which has an amount of information more than two-levels (eight-levels data) is stored.

Specifically, in FIG. 11, in the case where the memory cell MC2-2 is allocated with an operation mode so that two-levels data is used, the adjacent memory cells MC2-1 and MC2-3 on the same bit line BL2 (140) and the adjacent memory cells MC1-2 and MC3-2 on the same word line WL2 (130) are all allocated with an operation mode so that eight-levels data is stored. Similarly, if the memory cell MC3-2 is looked at, this memory cell is allocated with an operation mode so that eight-levels data is stored, however, the adjacent memory cells MC3-1, MC3-3, M2-2 and MC4-2 are all allocated with an operation mode so that two-levels data is stored.

This operation mode allocation is decided in advance based on a memory cell address and is stored in a ROM fuse as fuse data, similar to that of embodiment one of the present invention. And, this fuse data is read from a ROM region by a ROM read operation and set in the latch circuit. Of course, the allocation of an operation mode is possible even by a method which arranges a fuse circuit within the power on reset circuit, similar to that of embodiment one of the present invention. Also, it is also possible to set the changing of the operation mode by an external input.

In the case of controlling the programming and reading of eight-levels data, one negative threshold voltage is allocated as an erasing state and seven positive threshold voltages are allocated as programming states. The positive threshold voltages are set between 0V and 5V while stepping up the voltage at the same width from 0V and the setting of the read voltage which is used in a verify read is the same as that of embodiment one of the present invention.

In addition, because the threshold distribution width is narrowed, the two step program verify is carried out the same as in embodiment one of the present invention.

Programming is carried out in order from the word line WL0 (130) and the memory cell MC which is connected to the EVEN bit line 140 which is connected to this word line WL0 (130) is selected and programmed and the memory cell MC which is connected to the ODD bit line 140 is selected and programmed. This programming sequence is also controlled by the fuse data. This point is the same as that stated above in embodiment one of the present invention.

Because an adjacent memory cell MC is set so that data with a different amount of information is stored by controlling the allocation and programming sequence of the amount of data which is stored in a memory cell as stated above, it is possible to reduce the effect of capacitive coupling with an adjacent memory cell in a word line direction and a bit line direction. This point is the same as that in embodiment one.

That is, the memory cells which are adjacent in a word line direction and a bit line direction to a memory cell which stores data which has an amount of information of more than two-levels (in this case eight-levels data), are allocated so that data which has an amount of information which is less than that amount of information more than two-levels is stored. On that basis, programming to a memory cell is controlled so that after data is programmed to a memory cell MC which is connected to the same word line and which stores data with a small amount of information, a memory cell MC which is connected to the same word line and which stores data which has an amount of information of more than two-levels is programmed. This programming control is carried out by the fuse data which is stored in the ROM fuse, for example, in the case when an EVEN bit line is programmed, an ODD bit line becomes a state of program inhibition and acts as a shield line. As a result, it is possible to reduce to a minimum the effect of capacitive coupling of a memory cell MC which stores data which has an amount of information of more than two-levels, with an adjacent memory cell in a word line direction and bit line direction by controlling the data program sequence and the effects of the shield. Alternatively, because the memory cell MC which stores data which has a small amount of information is programmed first it is possible to absorb the capacitive coupling caused by a shift in the threshold distribution. Further, according to the present embodiment, programming to a memory cell MC is controlled so that programming is carried out from the memory cell MC which stores data with a small amount of information, however, this it is not always limited to this. The same effects can be obtained if the adjacent memory cells in a word line direction and a bit line direction are allocated so that a data with a different amount of information is stored and programming is carried out every even bit line and every odd bit line.

In addition, in the case where data which has an amount of information of more than two-levels (here, eight-levels data) is stored across the entire memory, by narrowing the width of the threshold step up, the number of times a program voltage is applied increases significantly and program speed becomes slower. In the non-volatile semiconductor memory device relating to embodiment two of this invention, because an operation mode is allocated so that about half of all the memory cells are stored with data which has an amount of information fewer than that of the data which has an amount of information of more than two-levels, it is possible to reduce the number of times a program voltage is applied. Therefore, although the storage capacity of the entire memory is reduced it is possible to reduce to a fixed limit the drop in program speed.

Also, in the case where data with a small amount of information is programmed (here, two-levels data), because the read voltage of a non-selected word line is set lower than in the case where data with a larger amount of information is programmed (here, eight-levels data) it is possible to reduce read disturbance. Therefore, compared to an operation mode where all the memory cells MC store data with an amount of information of more than two-levels, a high level of reliability can be maintained.

Further, in the non-volatile semiconductor memory device relating to embodiment two of the present invention, by changing an operation mode via the fuse data, it is possible to use the same memory in three ways, namely, as a memory which stores data with an amount of information of more than two-levels, a memory which stores data with fewer information than the data with an amount of information of more than two-levels and a memory which can store a plurality of data with different amounts of information such as data which has two-levels of information and data which has fewer information than two-levels. Therefore, according to its usage purpose, it is possible to use a memory as a memory which stores data with an amount of information of more than two-levels in the case where storage capacity is emphasized, or a memory which stores data with a different amount of information in the case where a fixed programming speed is demanded, or further, in the case where reliability is emphasized a memory cell which stores data with an amount of information less than that amount of information more than two-levels. Because it is possible to manufacture large quantities of the same memory without needing to differentiate the usages of the various memories, it becomes possible to reduce manufacturing costs and therefore reduce the sale price and also it becomes possible to maintain a high quality product due to a stable product supply by mass production.

Embodiment Three

In the case where data with an amount of information of more than two-levels is stored in a memory cell MC, the threshold distribution is narrowed by making the width of the step up of the program voltage smaller and a plurality of threshold distributions are inserted between a non selected read voltage and VSS. Therefore, the effect of capacitive coupling with an adjacent memory cell MC becomes larger by making a threshold voltage a high voltage by inserting a plurality of threshold distributions. In other words, the larger the amount of information in the data which is stored in a memory cell MC the higher the threshold voltage and thus the effect of capacitive coupling becomes larger.

In the non-volatile semiconductor memory device relating to one embodiment of the present invention, because an operation mode is allocated and controlled so that data which is stored in an adjacent memory cell MC in a word line direction and a bit line direction is made data with a different amount of information which is stored, it is possible to propose a highly reliable storage memory with data which has an amount of information of more than two-levels together with making voltage control technology a high level In the non-volatile semiconductor memory device relating to embodiment three of the present invention, data which is stored in a memory cell is allocated in a checkered flag shape of four-levels data and eight-levels data.

Figure 12:
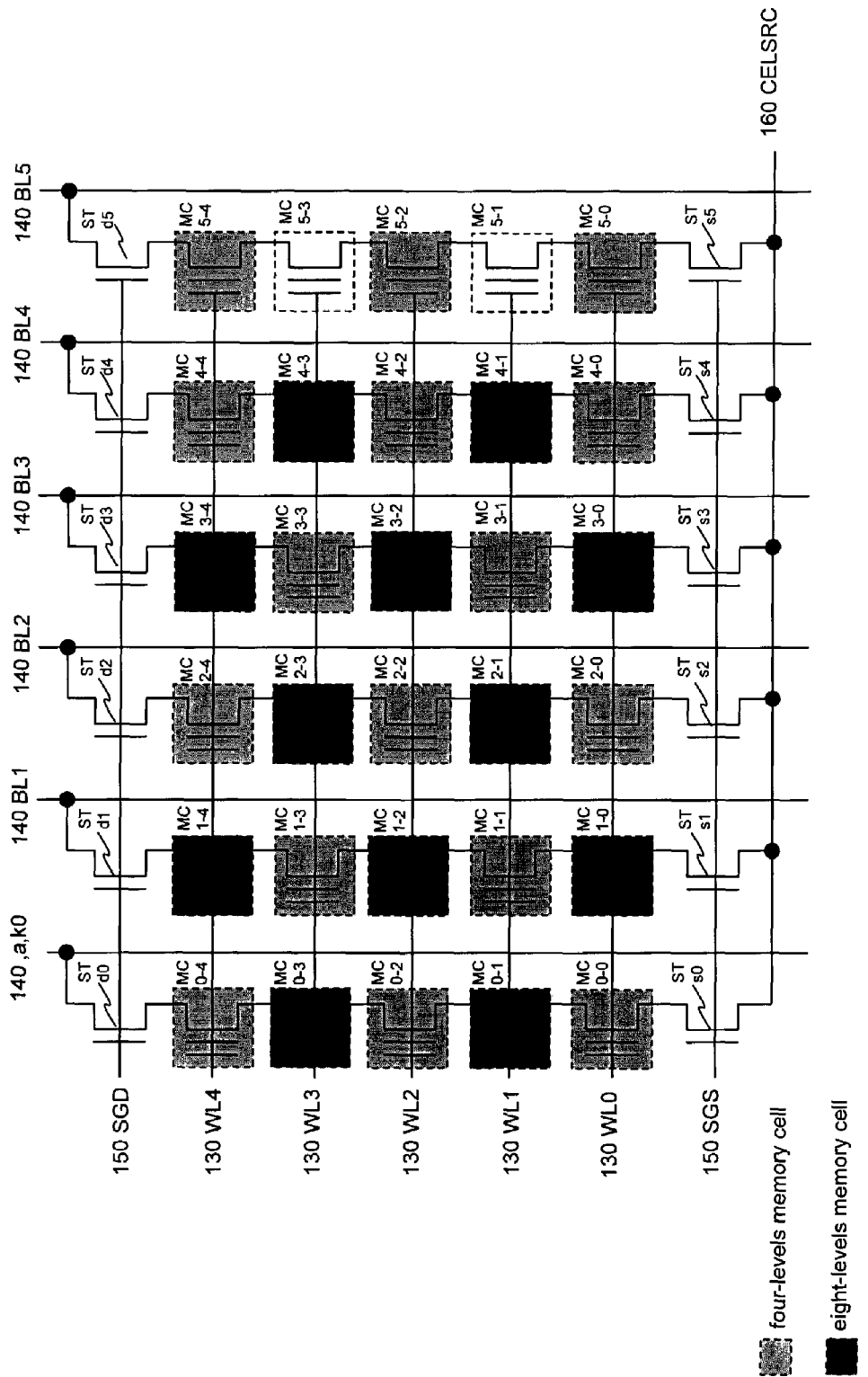
FIG. 12 is a typical drawing of the allocation of four-levels data and eight-levels data to a memory cell in the non-volatile semiconductor memory device relating to a third embodiment of this invention.

FIG. 12 is a typical drawing of the allocation of memory cell operation modes in the non-volatile semiconductor memory device relating to embodiment three of this invention. In FIG. 12, in the case where a certain specific memory cell MC is allocated with an operation mode so that data with an amount of information of more than two-levels (here, eight-levels) is stored, the adjacent memory cells MC on both sides of this memory cell on the same word line and the adjacent memory cells MC on both sides on the same bit line are allocated with an operation mode so that data (here, four-levels) which has fewer information that data (eight-levels data) which has an amount of information more than two-levels is stored.

This operation mode allocation is decided by the address of a memory cell and is stored as fuse data in the ROM fuse. Then, this fuse data is read from the ROM region by a ROM read operation and is set in the latch circuit. Of course, the allocation of an operation mode is possible even by a method which arranges a fuse circuit within the power on reset circuit, similar to that of embodiment one of the present invention. It is also possible to set the changing of the operation mode by an external input. This is the same as embodiment one and embodiment two of the present invention.

Specifically, in FIG. 12, in the case where the memory cell MC2-2 is allocated with an operation mode so that four-levels data is used, the adjacent memory cells MC2-1 and MC2-3 on the same bit line BL2 (140) and the adjacent memory cells MC1-2 and MC3-2 on the same word line WL2 (130) are all allocated with an operation mode so that eight-levels data is stored. Similarly, if the memory cell MC3-2 is looked at, this memory cell is allocated with an operation mode so that eight-levels data is stored, however, the adjacent memory cells MC3-1, MC3-3, M2-2 and MC4-2 are all allocated with an operation mode so that four-levels data is stored.

Programming is carried out in order from the word line WL0 (130) and the memory cell MC which is connected to the EVEN bit line 140 which is connected to this word line WL0 (130) is selected and programmed and the memory cell MC which is connected to the ODD bit line 140 is selected and programmed. This programming sequence is also controlled by the fuse data. This point is the same as that stated above in embodiment one and embodiment two of the present invention.

In the non-volatile semiconductor memory device relating to embodiment three of the present invention, the effects which can reduce capacitive coupling with an adjacent memory cell can be obtained by the allocation of an operation mode and programming such as that stated above. Also, it is possible to reduce the drop in programming speed to a specific level, read disturbance can be reduced and the effect whereby a high level of reliability can be sustained is obtained. This is the same as in embodiment one. Further, the following effects which can be obtained are the same as that in embodiment one; it is possible to use one memory cell and change the amount of information of data which is stored according to the purpose of use by changing an operation mode, it is possible to reduce manufacture costs and thus reduce sale price and it is possible to maintain a high product quality due to a stable product supply.

Embodiment Four

In the non-volatile semiconductor memory device relating to embodiment four of the present invention, an operation mode of a memory cell MC is allocated so that three varieties of information amounts, two-levels data, four-levels data and eight-levels data, are stored.

In the case where data with an amount of information of more than two-levels is stored in a memory cell MC, a high level of technology is required in order to narrow the step up width of a threshold distribution by a two step program verify and control the voltage within a memory. Particularly, the effect of capacitive coupling with an adjacent memory cell MC becomes larger as the step up width of the threshold distribution becomes narrower.

In the non-volatile semiconductor memory device relating to one embodiment of the present invention, because an operation mode is allocated and controlled so that data which is stored in an adjacent memory cell MC in a word line direction and a bit line direction is data with a different amount of information, it is possible to propose a highly reliable storage memory with data which has an amount of information of more than two-levels together with making voltage control technology a high level.

In the case where technology progresses and the reliability of voltage control technology which handles the data with an amount of information of more than two-levels is increased, the data which is stored in a memory cell MC is not limited to the data which has an amount of information of two varieties. If is possible to store data which has an amount of information of three varieties, a fixed reliability is maintained and it is possible to increase high capacity and realize higher integration. In the non-volatile semiconductor memory device relating to embodiment four of the present invention, the effect cause by capacitive coupling of an adjacent memory cell MC is reduced and it is possible to store three varieties of information amounts in a memory cell MC.

Figure 13:
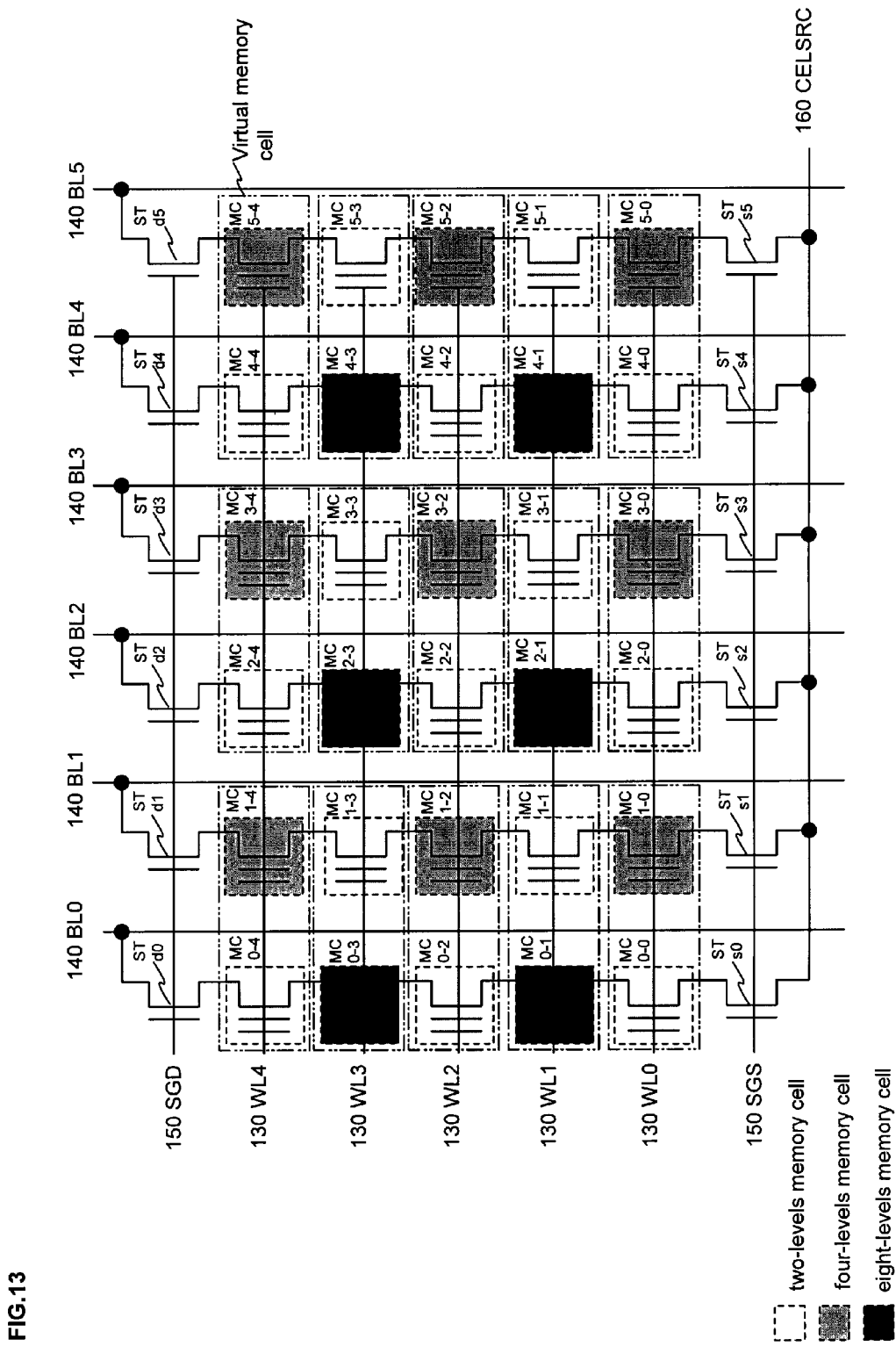
FIG. 13 is a typical drawing of the allocation of two-levels data, four-levels data and eight-levels data to a memory cell in the non-volatile semiconductor memory device relating to a fourth embodiment of this invention.

FIG. 13 is a typical drawing of a memory cell allocation in the non-volatile semiconductor memory device relating to embodiment four of the present invention. In the case where data of three different varieties of information amounts is given as $\alpha$, $\beta$, $\gamma$ ($\alpha<\beta<\gamma$), the memory cells MC of half of the memory are allocated so that data with the fewest amount of information is stored and the remainder of the memory cells MC are allocated so that data β and data γ are stored. The method of allocating to a memory cell MC is decided based on an address of the memory cell which is decided by the bit line 140 and the word line 130. That is, the memory cell MC which is connected to an EVEN bit line 140 and an EVEN word line 130 and an ODD bit line 140- and an ODD word line 130 is allocated as a memory cell MC which stores data α. A memory cell which is connected to an EVEN bit line 140 and an ODD word line 130 is given as a memory cell which stores data β and a memory cell which is connected to an ODD bit line 140 and an EVEN word line 130 is given as a memory cell MC which stores data γ. The allocation of a memory cell which stores data β and data γ may also be an opposite allocation to that stated above.

Specifically, in FIG. 13, two-levels data, four-levels data and eight-levels data are used as data which has three varieties of information amount. Therefore, because a memory cell MC which is located on an EVEN bit line 140 and an EVEN word line 130 is allocated as a memory cell MC which stores two-levels data, the memory cell MC2-2 is allocated so that two-levels data is used. Next, the adjacent memory cells MC2-1 and MC2-3 on the same EVEN bit line BL2 (140) are allocated so that four-levels data which is data of a middle level of information amounts. Then, the memory cells MC1-2 and MC3-2 which are connected to adjacent ODD bit lines BL1 and BL3 (140) on the same EVEN word line WL2 are all allocated so that eight-levels data is stored.

This operation mode allocation is decided in advance based on the address of a memory cell and is stored as fuse data in the ROM fuse, the same as in the first, second and third embodiments of the present invention. Then, this fuse data is read from the ROM region by a ROM read operation and is set in the latch circuit. Of course, the allocation of an operation mode is possible even by a method which arranges a fuse circuit within the power on reset circuit, similar to that of embodiment one of the present invention. It is also possible to set the changing of the operation mode by an external input. This is the same as in the first, second and third embodiments of the present invention.

In the non-volatile semiconductor memory device in which the allocation of this operation mode is carried out, the interference of an adjacent memory cell which is due to capacitive coupling with an adjacent memory cell in the case of programming will be explained. Specifically, the explanation will take the memory cell MC2-2 in FIG. 13 as an example. The memory cell MC2-2 is allocated so that two-levels data is stored. Programming is conducted in order from the memory cell which is connected to the word line WL0 (130) and in order to program to the memory cell MC2-2 the word line WL2 (130) is applied with Vpp. In this state, 0V or VBB is applied to the EVEN bit lines BL0, BL2 and BL4. By this, in the memory cell MC which is connected to the word line WL2 and which is connected to the bit lines BL0, BL2 and BL4 which are applied with VBB, the floating gate is injected with electrons and even in the memory cell MC2-2 programming takes place.

At this time, because this memory cell is a memory cell MC which is connected to all the EVEN word lines (130) and EVEN bit lines (140), two-levels data programming is carried out. The effect of capacitive coupling occurs between the memory cells MC1-2, MC3-2 which are adjacent to the memory cell MC2-2 on the same word line WL2 and the memory cells MC2-1 and MC2-3 which are adjacent to the memory cell MC2-2 on the same bit line BL2. However, because two-levels data is programmed in the memory cell MC-2, the number of times a program voltage is applied is few. Therefore, the effect of adjacent memory cell interference due to capacitive coupling to the other memory cells MC1-2, MC3-2, MC2-1 and MC2-3 is small. Also, the memory cell MC2-1 which is connected to the word line WL1 is already programmed with data (in this case, four-levels data programming) and it is possible to absorb the effect of interference of an adjacent memory cell due to capacitive coupling.

In this state, 0V or VBB is applied to the ODD bit lines BL0, BL2 and BL4 (140). By this, programming is carried out to the memory cells MC1-2 and MC3-2 which are adjacent to the memory cell MC2-2 on the same word line WL2. Because the adjacent memory cell is a memory cell which stores eight-levels data a program voltage is applied while narrowly stepping up in order to program eight-levels data. Therefore, the effect of interference in an adjacent memory cell occurs in the memory cell MC2-2. However, this memory cell is already programmed with two-levels data and because the width of the threshold distribution is wide it is possible to absorb the effect of the adjacent memory cell interference. Also, because the memory cell MC which is programmed with eight-levels data is not on the same word line 130 and is not on the same bit line 140 as the memory cell which is already programmed with four-levels data, for example, the memory cell MC2-1, the effect of capacitive coupling is extremely small.

Further, after this, the word line WL3 is selected and applied with Vpp and in the same sequence the EVEN bit lines BL0, BL2 and BL4 are selected and applied with VBB. Then, four-levels data is programmed to the memory cell MC2-3 which is adjacent to the memory cell MC2-2 on the same bit line BL2 and the effect of the adjacent memory cell interference due to capacitive coupling also reaches the memory cell MC2-2. However, because this memory cell MC2-2 is already programmed with two-levels data which has a wide threshold distribution width, it is possible to absorb this effect. Also, because this memory cell MC2-3 is not on the same bit line 140 or the same word line 130 as the memory cell which is already programmed with eight-levels data, for example, memory cell MC1-2, the effect of capacitive coupling does not occur.

As stated above, in the non-volatile semiconductor memory device relating to embodiment four of the present invention, an adjacent memory cell is allocated so that different data with three varieties of information amounts are stored and because at the of programming, programming is conducted on every bit line, it is possible to reduce the interference of an adjacent memory cell due to capacitive coupling with an adjacent memory cell. Further, in the present embodiment, programming to a memory cell MC is controlled so that programming is carried out from the memory cell which stores data with a small amount of information, however, it is not always limited to this. The memory cell MC which is adjacent in a word line direction and a bit line direction is allocated so that data with a different amount of information is stored and if programming is carried out on each bit line, the same effects can be obtained.

In addition, half of the memory cells MC of the entire memory are made to be memory cells MC which store two-levels data and are allocated an operation mode. Therefore, compared to the case where the memory cells MC of the entire memory store the same data which has an amount of information of more than two-levels (for example, four-levels data), the number of times a program voltage is applied becomes fewer over the entire memory. As a result, it is possible to reduce to a fixed level a drop in programming speed, reduce read disturbance and maintain a high level of reliability.

Furthermore, it is possible to use one memory cell changing the amount of information of the data which is stored in accordance with the purpose of use, and as a result, it is possible to reduce manufacture costs and thus sale price and because a stable product supply becomes possible it is possible to maintain high product quality. These effects are the same as in embodiments one, two and three.

Embodiment Five

As stated above, in the non-volatile semiconductor memory device in one embodiment of the present invention, by changing an operation mode it is possible to make the data which a memory cell MC stores a chequered flag shape mixture mode of two-levels data and data with an amount of information of more than two-levels (a data mixture mode of two-levels and an amount of information of more than two-levels).

Here, as data which has an amount of information of more than two-levels, originally, can be thought of as a numerical value of two multipliers, four-levels (two bits) and eight-levels (three bits). However, particularly in the case of using a threshold distribution with a sharp and narrow width of more than eight-levels (three bits) data, because the effect of the interference of an adjacent memory cell due to capacitive coupling is large, control is not easy. Consequently, by the adoption of a virtual architecture, two memory cells on the same word line are made into a pair (therefore, these two memory cells become a pair of memory cells which are connected to a bit line and which are adjacent on the same word line) and three different page addresses (virtual page address) are allocated to this pair of memory cells and by performing the role of three virtual storage memory cells, it is proposed that the pair of memory cells MC are made to store three cells worth of two-levels, 2-levels×2-levels×2-levels=8-levels.

This proposal aims to increase the storage capacity of the entire memory. However, even by this method, in the case where programming of data with an amount of information of more than two-levels is carried out, the effect of interference of an adjacent memory cell due to capacitive coupling with an adjacent memory cell MC in a bit line direction and a word line direction occurs.

In the non-volatile semiconductor memory device relating to embodiment five of the present invention, because a memory cell operation mode which is adjacent in a word line direction and a bit line direction is allocated and controlled so that data with different amounts of information is stored, it is possible to increase the storage capacity of the entire memory while reducing the interference of an adjacent memory cell due to capacitive coupling.

Figure 14:
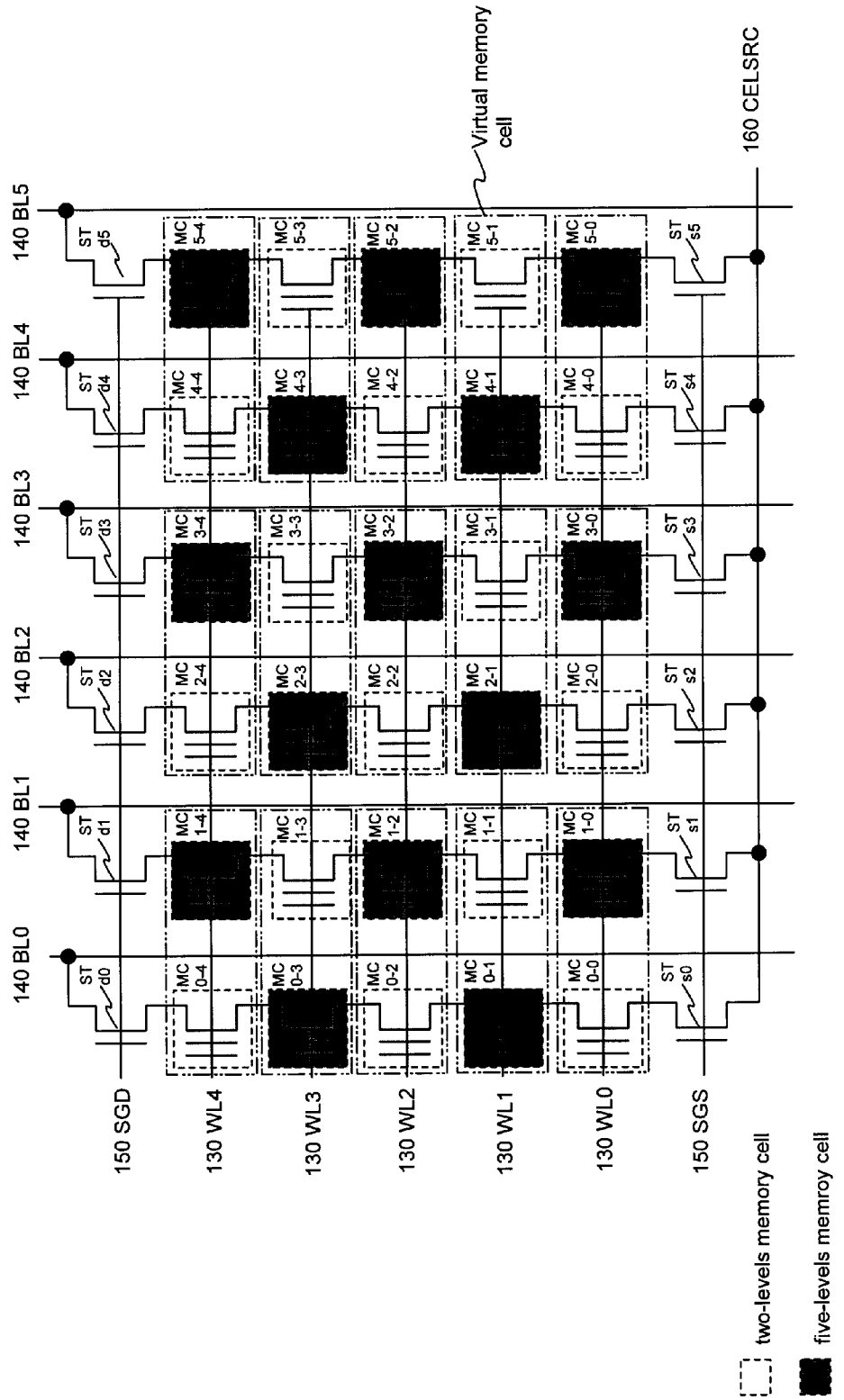
FIG. 14 is a typical drawing of the allocation of two-levels data and five-levels data to a memory cell in the non-volatile semiconductor memory device relating to a fifth embodiment of this invention.

This will be explained in more detail based on FIG. 14. FIG. 14 is a typical drawing of the allocation of a memory cell operation mode of the non-volatile semiconductor memory device relating to embodiment five of this invention. In FIG. 14, in the case where a certain specific memory cell MC is allocated so that data with an amount of information of more than two-levels (here, five-levels data) is stored, the memory cells which are adjacent to that cell on both sides on the same bit line or the memory cells which are adjacent to that memory cell on both sides on the same word line are each allocated so that data is stored which has a less amount of information (here, two-levels data) than the data which has an amount of information of more then two-levels (five-levels data).

This operation mode allocation is decided in advance based on the address of a memory cell and is stored as fuse data in the ROM fuse, the same as in the first, second, third and fourth embodiments of the present invention. Then, this fuse data is read from the ROM region by a ROM read operation and is set in the latch circuit.

Specifically, in FIG. 14, the memory cell MC which is located on the EVEN word line 130 and the EVEN bit line 140 and the memory cell MC which is located on the ODD word line 130 and the ODD bit line 140 are allocated with an operation mode so that they become memory cells MC which store two-levels data. Alternatively, the remaining memory cells, that is, the memory cell MC which is located on an EVEN word line 130 and an ODD bit line 140 and the memory cell MC which is located on an ODD word line 130 and an EVEN bit line 140 are allocated with an operation mode so that they become memory cells MC which store five-levels data.

The memory cell which is allocated with an operation mode is paired with the memory cell which is adjacent on the same word line 130 and which stores data which has an amount of information of different levels and are treated as if they were one memory cell MC (below, referred to as a virtual memory cell). In FIG. 14, the memory cells MC2-2 and MC3-2 are treated as a pair.

Apart from an actual address, a virtual page address is also allocated to this pair of memory cells MC. For example, a virtual page address m is allocated to the pair of memory cells MC2-2 and MC3-2. The method of allocating this virtual page address is decided in advance the same as the method use to allocate data which has an amount of information which is stored in the memory cell MC. Then, the method of allocating the virtual page address is stored as fuse data in the ROM region 120 within the memory cell array 100 shown in FIG. 1, the same as in the above stated embodiments one, two, three and four.

By the allocation of a virtual page address, it is possible to store multi bit data in a virtual memory cell. That is, the memory cell MC2-2 is allocated so that two-levels data is stored and the memory cell MC 3-2 is allocated so that five-levels data is stored, however, by treating these memory cells as a virtual memory cell it is possible to treat the memory cell MC2-2 as a first data page of a virtual memory cell and the memory cell MC3-2 as a second data page of a virtual memory cell. Thereupon, a first data of an input data which is calculated and processed by a sense amplifier which is explained later, is stored in the first data page and second data of an input data is stored in the second data page. Therefore, it is possible to store 2-levels×5-levels=10-levels>8-levels (three bit) data. As a result, it is possible to secure a capacity of seventy five percent in the case of setting the entire memory to an operation mode which stores four-levels data while reducing the interference of an adjacent memory cell. This is effective in the case where the effect of interference of an adjacent memory cell by programming four-levels data cannot be controlled.

It is also possible to set a virtual memory cell as memory cells which store data with a different amount of information and which are adjacent on the bit line 140. However, as explained in embodiment one, in LOWER page programming and UPPER page programming, when the bit line 140, for example, EVEN bit lines BL0, BL2 and BL4, are programmed and all the ODD bit lines BL1, BL3 and BL5 become VDD and become a state of non-programming (ALL1) and it is possible to fulfill the role of a shield line for preventing read noise. Therefore, in the present embodiment, adjacent memory cells in a word line 130 direction are set as a pair of virtual memory cells.

Programming of a virtual memory cell is carried out by controlling an EVEN and an ODD bit line 140 which are connected to this virtual memory cell. In the virtual memory cell MC2-2 and MC3-2 in FIG. 14, the EVEN bit line BL2 (140) and the ODD bit line BL3 (140) are controlled and the memory cell MC2-2 is programmed by a first data programming and the memory cell MC3-2 is programmed by a second data programming.

Here, in the non-volatile semiconductor memory device relating to embodiment five of the present invention, the memory cell MC is allocated with an operation mode so that two-levels data and five-levels data are stored, however, usually, five-levels data is not used. This is because a semiconductor memory device stores data in a [0] [1] binary system. However, when considering the control of threshold distribution, in order to program a memory cell MC with eight-levels data, one negative threshold voltage and seven positive threshold voltages which are generally set between 0V and 5V, are needed, while taking a predetermined margin. When setting these eight threshold voltages, the threshold distribution is controlled so that it becomes sharp and its width becomes narrow. However, because the threshold distribution width is wide as is shown in FIG. 8 by the effect of interference of an adjacent memory cell, the narrow the width of the margin with an adjacent threshold the more difficult voltage control becomes. Due to such reasons it is possible to assume that eight-levels data cannot be handled stably.

In this type of case, two memory cells are treated as a pair, and separated into a first data page and a second data page and when a method is adopted for programming two adjacent memory cells which are treated as one virtual memory cell, it is beneficial to handle five-levels data. In this case, in order to program and erase five-levels data, one negative threshold and four positive thresholds are needed. However, while taking a predetermined margin, it is easier to control the voltage when setting the four positive thresholds between 0V and 5V compared to setting the seven positive thresholds within the same voltage. Alternatively, there is no problem when programming and erasing of one memory cell MC of the pair of memory cells because two-levels data is used.

In order to separate program and erase input/output data into first data and second data, the non-volatile semiconductor memory device relating to embodiment five of the present invention has a function which latches and calculates the data within a sense amplifier 40 as shown in FIG. 1.

The sense amplifier 40 judges whether the data which is stored in a memory cell at the time of reading is a [1] or a [0], amplifies and outputs externally via an input/output buffer 50. Also, at the time of programming, the program data is input to the sense amplifier 40 via the input/output buffer 50 and stored. Therefore, the sense amplifier 40 is made to have a function which calculates input/output data corresponding to a normal address and a virtual address.

Next, one example of an input/output data calculation corresponding to an address using the memory cells MC2-2 and MC3-2 in FIG. 14 will be explained. In the case of storing three bit data in a virtual memory cell, the data which is stored has eight varieties, [000], [001], [010], [011], [100], [101], [110], [111]. An input from an external source is specified as a virtual address m and input.

This data which is input, for example, a numerical value in one hundred units, is allocated as first data of the virtual memory cell and the remaining lower two digit numerical values are allocated as second data of the virtual memory cell in the sense amplifier 40 in FIG. 1. Then, the first data of this allocated data is allocated as two-levels data to the normal address of the memory cell MC2-2, for example, a [0] one hundred unit is a two-levels [0] and a [1] one hundred unit is a two-levels [1]. Alternatively, the second data is calculated as five-levels data to the normal address of the memory cell MC3-2. However, in order to convert eight-levels data into 2-levels×5-levels=10-levels data, eight-levels data is not allocated to two-levels of this ten-levels data. Therefore, for example, the remaining lower two digit number [00] is allocated as a five-levels [0], similarly, [01] is allocated as [1], [10] is allocated as [2] and [11] is allocated as [3]. A five-levels [4] is not allocated. According to this allocation method, eight-levels data [010] becomes [02] of the virtual memory cell.

Programming this [02] data is carried out by programming the memory cell MC2-2 with [0] by the first data programming of the virtual memory cell and the memory cell MC3-2 with [2] by the second data programming of the virtual memory cell.

Reading is similarly carried out by reading [0] from the memory cell MC2-2 as first data of the virtual memory cell and by reading [2] from the memory cell MC3-2 as the second data of the virtual memory cell. Then, after latching by the sense amplifier 40, the opposite calculation is carried out by the sense amplifier 40 and is output externally as [010] data of the virtual memory cell.

Programming is carried out in the order first data programming and second data programming. The memory cell MC2-2 which is programmed with the first data, is allocated an operation mode so that two-levels data is stored. Therefore, the effect of the interference of an adjacent memory cell due to capacitive coupling reaches the memory cell MC3-2 which is programmed with the second data. However, because it is programming of two-levels data and the bit line BL3 (140) fulfills the role of a shield line, the effect of the interference of an adjacent memory cell due to capacitive coupling with an adjacent cell is small. Also, because the memory cell MC3-2 which is programmed with the second data, is programmed with five-levels data, effect occurs in the adjacent memory cell MC2-2. However, because this memory cell MC2-2 is already programmed with two-levels data which has a threshold distribution with a wide width, and because the bit line BL2 (140) fulfills the role of a shield line, it is possible to absorb the effect of the interference of an adjacent memory cell due to capacitive coupling with an adjacent memory cell.

As stated above, because the non-volatile semiconductor memory device relating to embodiment five of the present invention allocates an operation mode so that an adjacent memory cell stores data with different amounts of information and is controlled so that programming is carried out on every bit line, it is possible to reduce the widening of the width of a threshold distribution due to capacitive coupling. Also, because the bit line acts as a shield line, combined with the already stated effects, it is possible to reduce the effect of the interference of an adjacent memory cell due to capacitive coupling with an adjacent memory cell MC. Also, the above stated operation mode is allocated to a memory cell MC, two memory cells which are adjacent on the same word line are seen as one virtual memory cell and data is stored. By this, while reducing the interference of an adjacent memory cell due to capacitive coupling with an adjacent memory cell MC, it becomes possible to store multi bit data of more than two-levels and increase the capacity of the entire memory. Further, according to the present embodiment, programming of a memory cell is controlled so that programming is carried out from the memory cell MC which stores data with a small amount of information, however, it is not always limited to this. The memory cell MC which is adjacent in a word line direction and a bit line direction is allocated so that data with a different amount of information is stored and if programming is carried out on each bit line, the same effects can be obtained.

In addition, because the non-volatile semiconductor memory device relating to embodiment five of the present invention allocates data with an amount of information to a memory cell by fuse data, it is possible to allocate so that data with the same amount of information is stored according to purpose and it possible to allocate so that data with a different amount of information is stored. Therefore, by changing an operation mode which stores, it is possible to use one memory according to the purpose of use. Therefore, as a result, it is possible to reduce manufacture costs and thus sale price and because a stable product supply becomes possible it is possible to maintain high product quality. These effects are the same as in embodiments one, two, three and four.

Further, according to the non-volatile semiconductor memory device relating to embodiment five of the present invention, because it is possible to reduce the interference of an adjacent memory cell due to capacitive coupling, if voltage control technology is improved, it is possible to store more than five-levels data, for example, six-levels data or seven-levels data.

Figure 15:
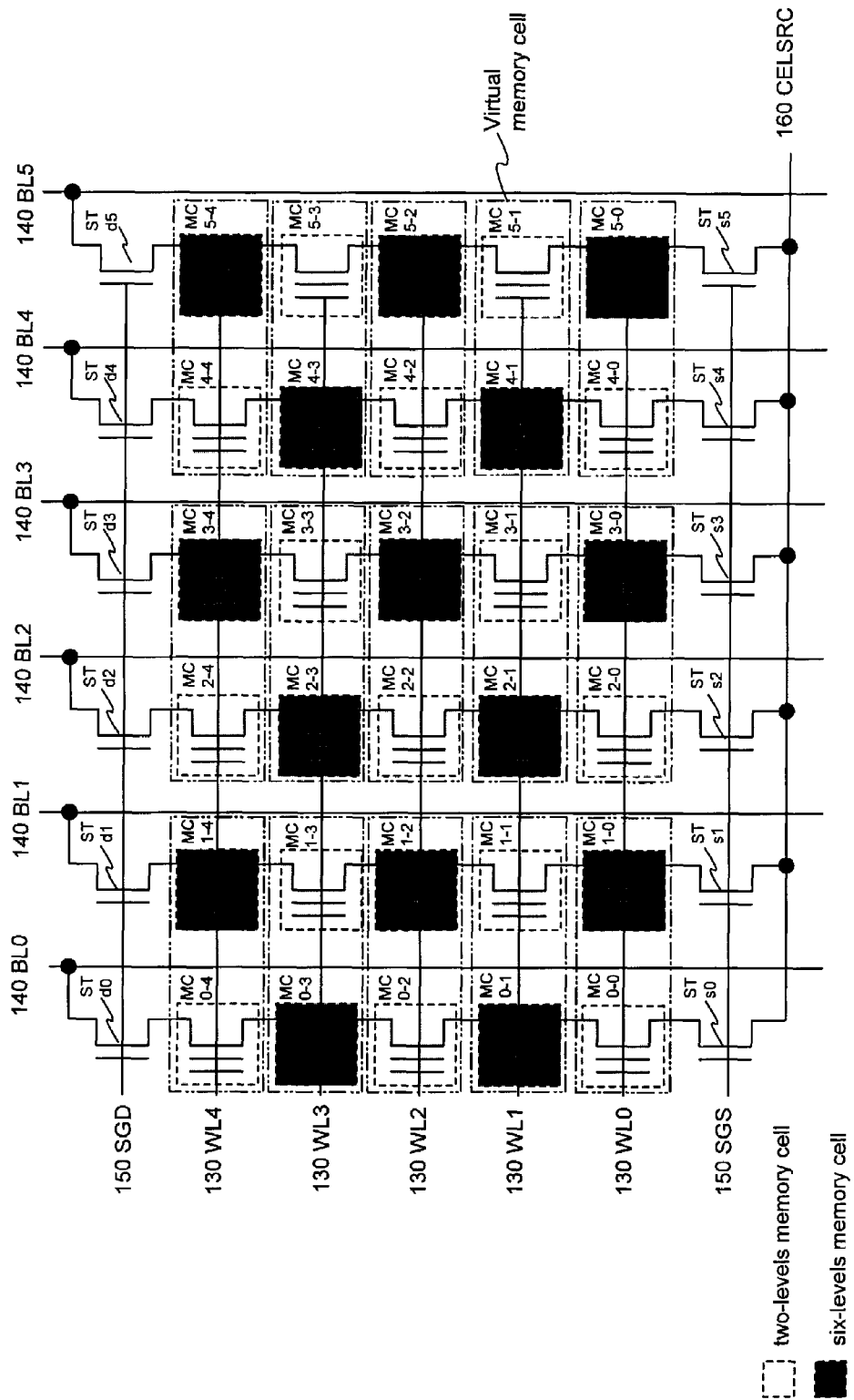
FIG. 15 is a typical drawing of the allocation of two-levels data and six-levels data to a memory cell in the non-volatile semiconductor memory device relating to a fifth embodiment of this invention.
Figure 16:
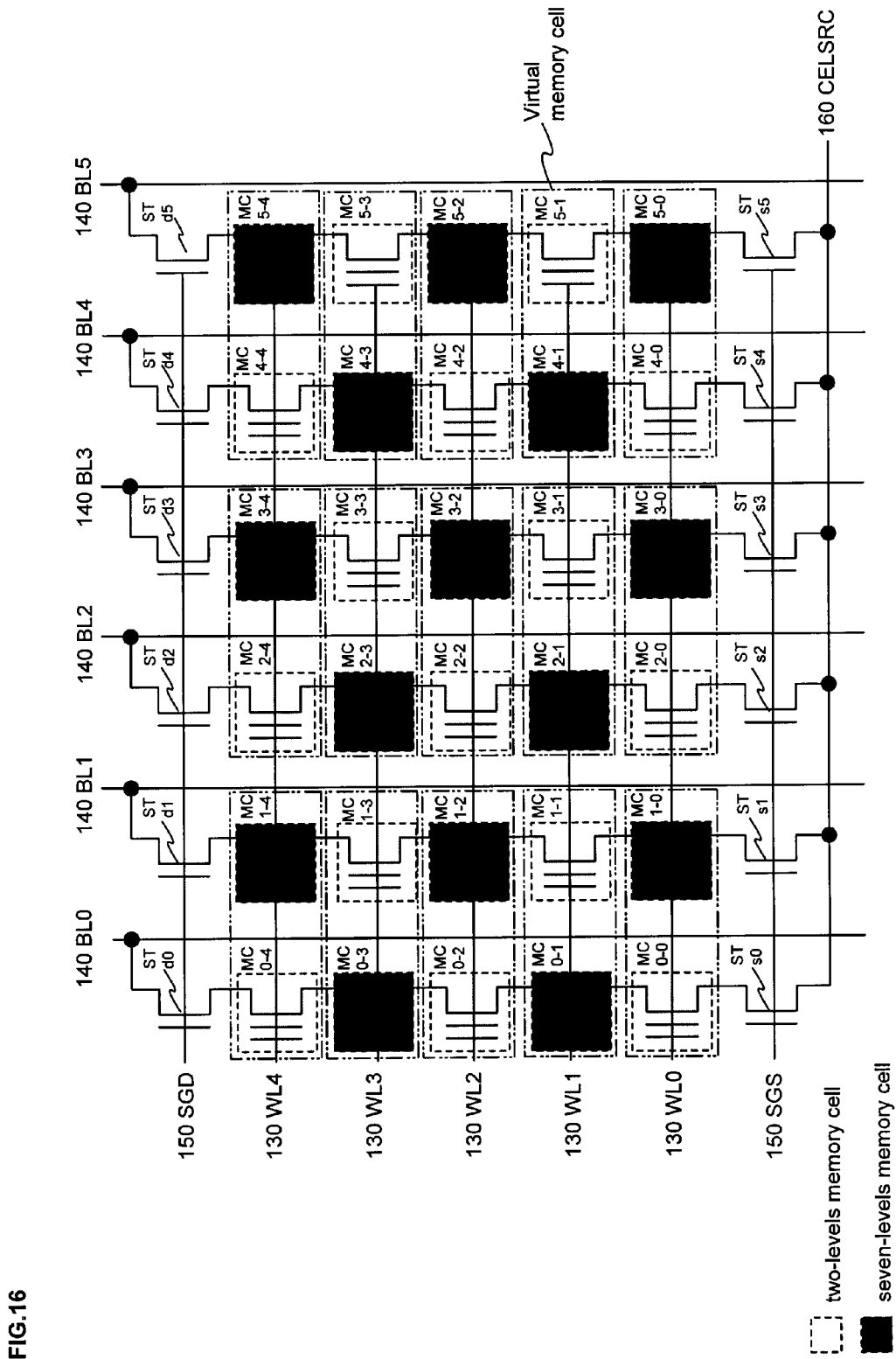
FIG. 16 is a typical drawing of the allocation of two-levels data and seven-levels data to a memory cell in the non-volatile semiconductor memory device relating to a fifth embodiment of this invention.

In this case, control of the threshold distribution naturally, becomes more difficult than five-levels data, however, it is possible to accommodate this by expanding the 0V to 5V range which is generally used as a range for setting a positive threshold voltage, for example, in the case of setting the range between 0V to 6V, it is not difficult to increase a positive threshold voltage by one or two to five-levels, six-levels or seven-levels. FIG. 15 and FIG. 16 are typical drawings of the allocation of a memory cell operation mode of the non-volatile semiconductor memory device relating to embodiment five of the present invention in the case where data which is stored by each memory cell are made two-levels and six-levels and two-levels and seven-levels. Corresponding to the improvement of control technology of the threshold distribution, allocation to this memory cell becomes possible according to one embodiment of the present invention.

Embodiment Six

In one embodiment of the present invention, as stated in embodiment five, an adjacent memory cell is allocated so that data with different amounts of information are stored and two memory cells which are on the same word line and which store data with different amounts of information are made a pair and treated as one virtual memory cell and it is possible to reduce interference from an adjacent memory cell and increase the capacity of the entire memory.

In the non-volatile semiconductor memory device relating to embodiment six of the present invention, an adjacent memory cell is allocated between a memory cell which stores three-levels data and a memory cell which stores six-levels data.

Figure 17:
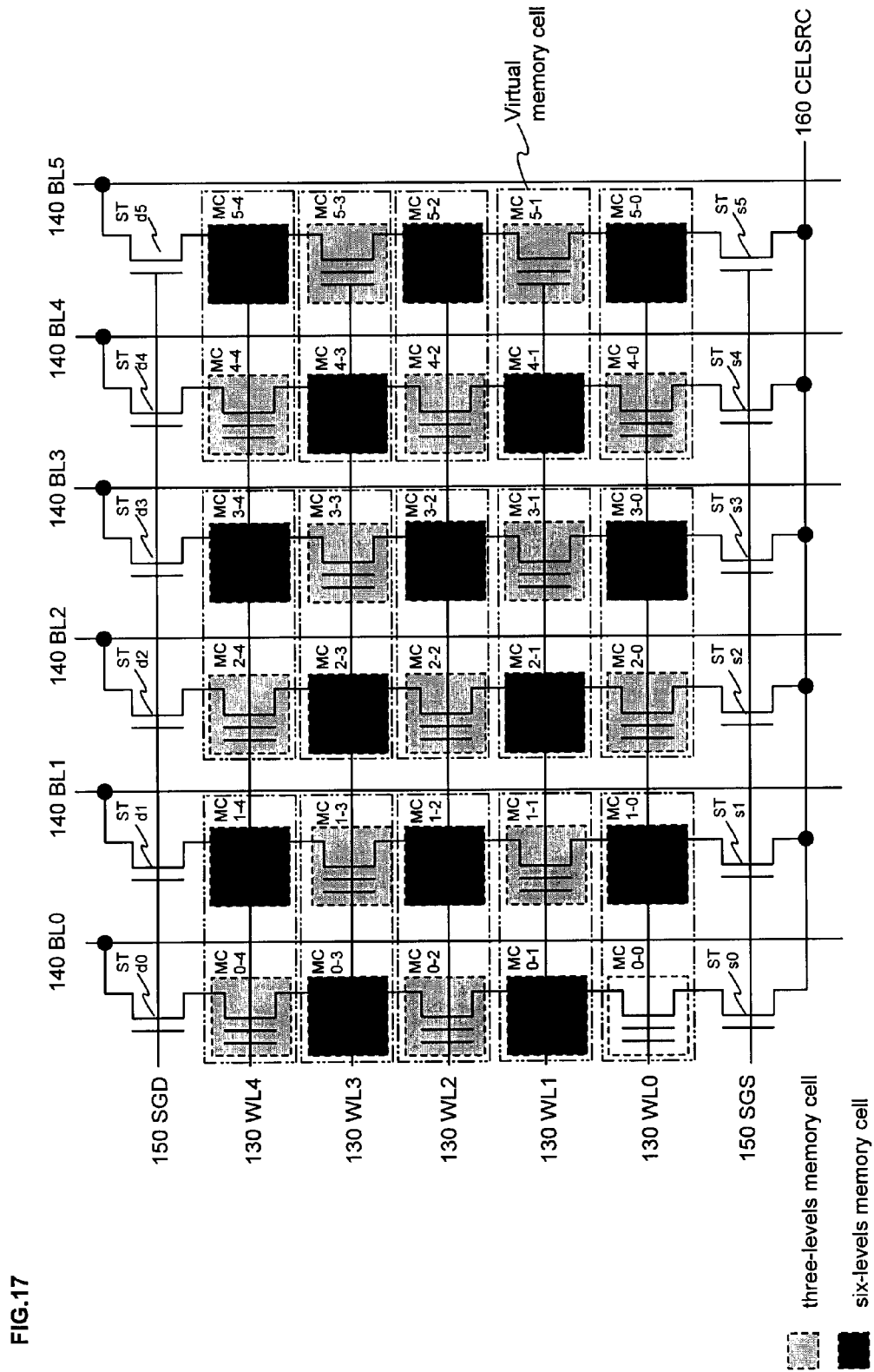
FIG. 17 is a typical drawing of the allocation of three-levels data and six-levels data to a memory cell in the non-volatile semiconductor memory device relating to a sixth embodiment of this invention.

FIG. 17 is a typical drawing of a memory cell MC allocation operation mode of the non-volatile semiconductor memory device relating to embodiment six of this invention. In FIG. 17, a memory cell MC which is located on an EVEN word line 130 and an EVEN bit line 140 and a memory cell MC which is located on an ODD word line 130 and an ODD bit line 140 are allocated with an operation mode which stores three-levels data. Alternatively, the remaining memory cells MC, that is, the memory cell MC which is located on an EVEN word line 130 and an ODD bit line 140 and the memory cell MC which is located on an ODD word line 130 and an EVEN bit line 140 are allocated with an operation mode so that they become memory cells MC which store six-levels data. The operation mode allocation method is carried out by the fuse data which is stored as fuse data in the ROM fuse, the same as in the first, second, third, fourth and fifth embodiments of the present invention. Of course, the allocation of an operation mode is possible even by a method which arranges a fuse circuit within the power on reset circuit, similar to that of embodiment one of the present invention. Also, it is also possible to set the changing of the operation mode by an external input.

The memory cell MC which has been allocated with an operation mode, is paired with an adjacent memory cell MC on the same word line 130 and which stores data with a different amount of information and are treated as a virtual memory cell. Also, a virtual page address is allocated to this virtual memory cell. The allocation method of this virtual page address is the same as that stated above in embodiment five of this invention.

Further, the non-volatile semiconductor memory device relating to embodiment six the present invention has a function which latches and calculates the data within a sense amplifier. This is the same as that stated above in embodiment five of this invention.

Then, three-levels data and six-levels data are latched in the sense amplifier by the first data programming and second data programming and while calculating, programming to and reading of the virtual memory cell is carried out. This is also the same as that stated above in embodiment five.

Characteristically, three-levels data and six-levels data are used as data to be stored. Together with miniature technology, therefore, there is case where a threshold voltage for eight-levels data cannot be stably controlled. However, in the case where one negative threshold voltage and five positive threshold voltages can be stably controlled, it is possible to allocate an operation mode so that one of two memory cells which are adjacent on the same word line and which store data which have different amounts, stores six-levels data in this invention. Also, where it is already possible to stably control a threshold distribution of four-levels, there is no problem with the control of programming and erasing by three-levels data, that is, one negative threshold and two positive thresholds.

According to the allocation of an operation mode to this memory cell MC, it is possible to store data, 3-levels×6-levels=18-levels>16-levels=$2^4$ (four bit) by a pair of memory cells MC. The threshold voltage of four-levels data can be stably controlled, however, even in the case where a threshold voltage for eight-levels data cannot be stably controlled, the effect of interference of an adjacent memory cell due to capacitive coupling with an adjacent memory cell MC is reduced and if calculated across the entire memory, it is possible to secure capacity about the same as the memory cells MC storing four-levels data. Therefore, it is possible to realistically achieve large capacity.

Further, according to the non-volatile semiconductor memory device relating to embodiment six of the present invention, an adjacent memory cell MC is allocated with an operation mode so that data with different amounts of information is stored and is programmed every bit line. Then, the bit line which is connected to a memory cell which is not programmed acts as a shield line. As a result, because it is possible to reduce the interference of an adjacent memory cell due to capacitive coupling, if a threshold voltage can be stably controlled, then data with an amount of information apart from three-levels data and six-levels data, for example, five-levels data or seven-levels data can be stored in a memory cell MC. Further, according to the present embodiment, programming is controlled so that programming is carried out from the memory cell which stores data with a small amount of information, however, this is not always the case. The memory cell MC which is adjacent in a word line direction and a bit line direction is allocated so that data with a different amount of information is stored and if programming is carried out every bit line then the same effects can be obtained.

As one example, the data which is stored by two adjacent memory cells MC which form a virtual memory cell, is given as five-levels data and seven-levels data. In this case, it is possible to store data with an amount of information of 5-levels×7-levels=35-levels>32-levels=$2^5$ (five bits) in this pair of memory cells.

Figure 18:
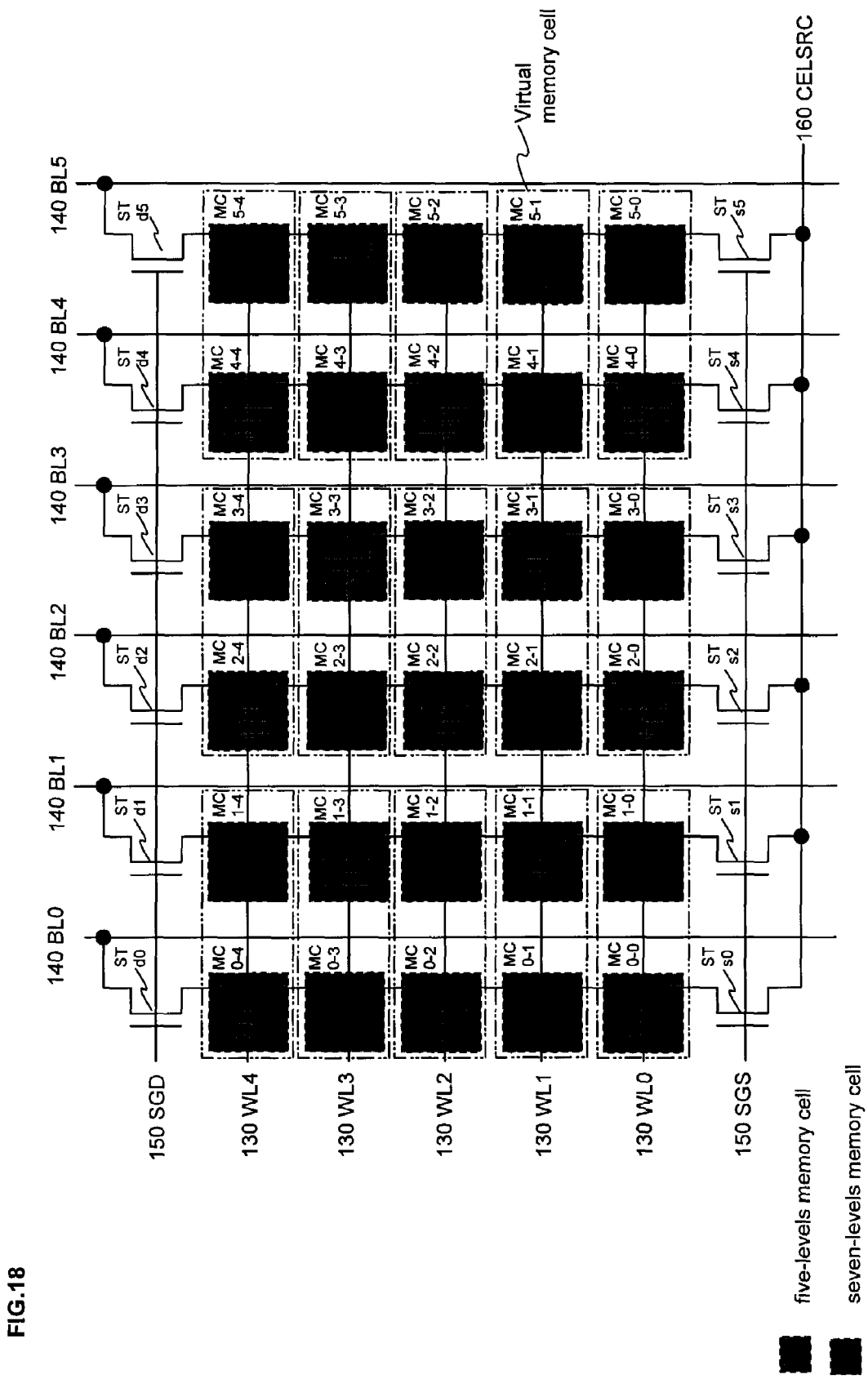
FIG. 18 is a typical drawing of the allocation of five-levels data and seven-levels data to a memory cell in the non-volatile semiconductor memory device relating to a sixth embodiment of this invention.

FIG. 18 is a typical drawing of a memory cell operation mode allocation in the case where five-levels data and seven-levels data are stored in the non-volatile semiconductor memory device relating to embodiment six of the present invention. According to embodiment six of the present invention, it is possible to reduce the interference of an adjacent memory cell due to capacitive coupling with an adjacent memory cell MC in the case where control of the threshold distribution of eight-levels data is difficult in the case of storing four-levels data and eight-levels data or in the case where control of the threshold distribution of eight-levels data is possible but control of the widening of the width of the threshold distribution is difficult due to interference of an adjacent cell. Therefore, even in this case it is possible to increase the capacity of the memory. According to embodiment six of the present invention, while reducing the interference of an adjacent memory cell due to capacitive coupling with an adjacent memory cell MC, it is possible to store a capacity of 5 bit×the number of memory cells×½ across the entire memory.

Embodiment Seven

In one embodiment of the present invention, as stated above, the memory cell adjacent in a bit line direction and a word line direction is allocated with an operation mode so that data with a different amount of information is stored. In embodiment seven of the present invention, in the case where programming speed is further demanded, by allocating an operation mode to two consecutive memory cells among three memory cells (that is, a trio of memory cells) which are adjacent on a word line so that data with a small amount of information among data with a different amount of information is stored, it is possible to improve programming speed.

Figure 19:
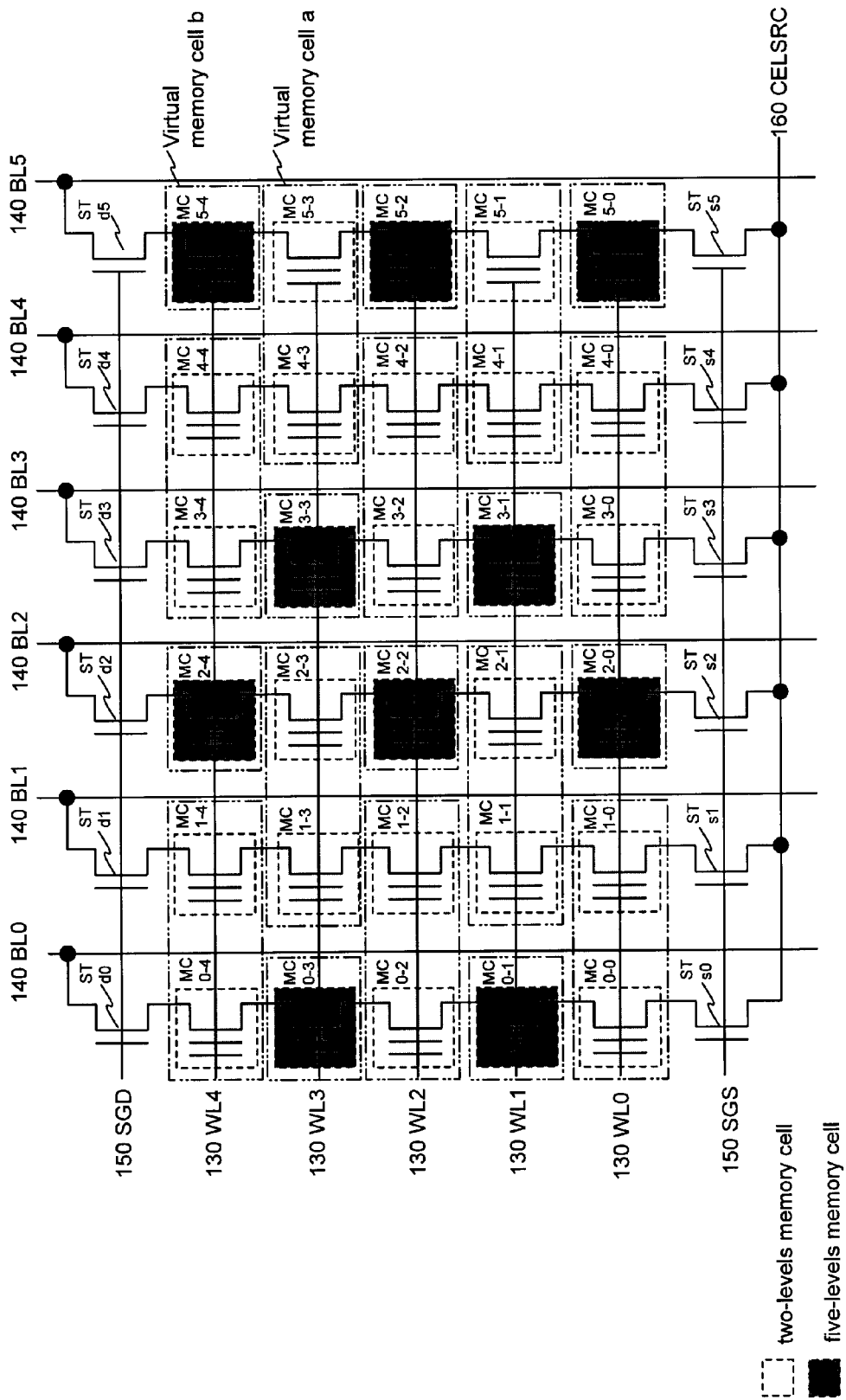
FIG. 19 is a typical drawing of the allocation of two-levels data and five-levels data to a memory cell in the non-volatile semiconductor memory device relating to a seventh embodiment of this invention.

FIG. 19 is a typical drawing of a memory cell allocation in the non-volatile semiconductor memory device relating to embodiment seven of the present invention. In FIG. 19, a case is shown where the data which has a different amount of information which is stored in a memory cell is given as two-levels data and five-levels data.

The allocation of a memory cell MC operation mode and a virtual page address are as follows. First, two consecutive memory cells MC among three adjacent memory cells MC on the same word line are allocated a two-levels cell mode as a virtual memory cell A. Also, one virtual page address is allocated to the virtual memory cell A. Next, the remaining memory cell MC among the three memory cells MC is allocated a five-levels cell mode as a virtual memory cell B. In addition, one virtual page address is allocated to the virtual memory cell B. In FIG. 19, for example, the memory cells MC0-2, MC1-2 and MC2-2 form a trio of memory cells. The memory cells MC0-2 and MC1-2 form the virtual memory cell A and a two-levels cell mode and, for example, a virtual page address a is allocated. Also, the virtual memory cell B is formed by the remaining memory cell MC2-2 from among the trio of memory cells and allocated with a five-levels cell mode and also, for example, a virtual page address b.

Furthermore, another trio of memory cells are formed by the same method by three consecutive memory cells which are connected to an adjacent word line and located on the same bit line as the trio of memory cells. However, at this time, a virtual memory cell A which is always formed by two memory cells MC is placed so that it is located in the memory cell MC which is adjacent on the same bit line as the memory cell MC which is already allocated with a virtual page address b and allocated with a virtual page address a. In FIG. 19, in the memory cells MC0-1, MC1-1, and MC2-1, MC0-3, MC1-3 and MC2-3 which are located on the adjacent word line to the memory cells MC0-2, MC1-2 and MC2-2, the memory cells MC0-1 and MC0-3 are independently treated as a virtual memory cell B and allocated with a virtual page address b. Alternatively, the memory cells MC1-1 and MC2-1 form a virtual memory cell A, the memory cells MC1-3 and MC2-3 form a virtual memory cell A and a virtual page address a is allocated to each. Then, a memory cell MC which is allocated with a virtual page address a is allocated so that two-levels data is stored and alternatively, a memory cell which is allocated with a virtual page address b is allocated so that five-levels data is stored.

This allocation is decided in advance based on the address of a memory cell and is stored as fuse data in the ROM fuse, the same as in the first, second, third and fourth, fifth and sixth embodiments of the present invention. Then, this fuse data is read from the ROM region by a ROM read operation and is set in the latch circuit. Of course, the allocation of an operation mode is possible even by a method which arranges a fuse circuit within the power on reset circuit, similar to that of embodiment one of the present invention. Also, it is also possible to set the changing of the operation mode by an external input.

The programming of these virtual memory cells A and B is controlled by a virtual page address. It is controlled as if the bit line which is connected to the virtual memory cell A is an EVEN bit line while the bit line which is connected to the virtual memory cell B is an ODD bit line. And, programming of the virtual memory cell A of the virtual page address a, is set so that first data programming and second data programming is carried out. The control method of the first data programming and the second data programming is the same as that in embodiment five and embodiment six of the present invention stated above.

In FIG. 19, programming of the memory cells MC0-2 and MC1-2 is carried out based on the virtual page address a. First, after the first data programming is carried out to the memory cell MC0-2, the second data programming is carried out to the memory cell MC1-2. In FIG. 19, these two memory cells MC are programmed with two-levels data.

Alternatively, programming of the memory cell MC2-2 is carried out based on a virtual page address, however, because this memory cell is programmed with five-levels data, a voltage is stepped up by, for example, 0.2V, and applied Therefore, at the time of this programming, interference of an adjacent memory cell due to capacitive coupling with an adjacent memory cell occurs. However, the memory cells MC1-2 and MC3-2 adjacent on the same word line WL2 (130) as this memory cell MC2-2 are already programmed two-levels data which has a threshold distribution with a wide width. Therefore, it is possible to reduce the effect of interference of an adjacent memory cell due to capacitive coupling with an adjacent memory cell MC. In addition, the memory cell MC2-1 which is adjacent on the same bit line BL2 (140) is similarly already programmed with two-levels data and the effect of interference of an adjacent memory cell can be absorbed. Alternatively, the memory cell MC2-2 is adjacent to and located between the memory cells MC2-1 and MC2-3 on the same bit line BL2 (140) and even if interference in the memory cell MC2-3 from an adjacent memory cell occurs, there is no effect because next the word line WL3 (130) is selected and two-levels data is programmed.

Alternatively, in the case where the memory cell MC2-3 which is adjacent on the bit line BL2, is programmed, interference of an adjacent memory cell occurs when the memory cell MC2-2 is programmed with five-levels data. However, this memory cell MC 2-3 is programmed with two-levels data and because the number of times a program voltage is applied is few there is only a small effect of interference of an adjacent memory cell.

This programming is latched and controlled by a sense amplifier, the same as in embodiment five and six of the present invention. Therefore, the non-volatile semiconductor memory device relating to embodiment seven of the present invention has a function which calculates input/output data corresponding to a normal address and a virtual address within the sense amplifier.

As stated above, in the non-volatile semiconductor memory device relating to embodiment seven of the present invention, while reducing the interference of an adjacent memory cell due to capacitive coupling with an adjacent memory cell MC, two-levels data is stored in two thirds of the memory cells MC of the entire memory. Therefore, it is possible to reduce a drop in programming speed.

In addition, because the non-volatile semiconductor memory device relating to embodiment seven of the present invention allocates data with an amount of information to a memory cell by fuse data, according to purpose it is possible to allocate so that data with the same amount of information is stored and it possible to allocate so that data with a different amount of information is stored. Therefore, by changing an operation mode which stores, it is possible to use one memory cell according to the purpose of use. Also, as a result, it is possible to reduce manufacture costs and thus sale price and because a stable product supply becomes possible it is possible to maintain high product quality. These effects are the same as in embodiments one, two, three and four, five and six.

Further, according to embodiment seven of the present invention, although not shown in the drawings, while securing the capacity of the entire memory by making the data with a different amount of information which is stored as two-levels data and six-levels data or two-levels data and eight-levels data, it is possible to reduce a drop in programming speed.

Embodiment Eight

If embodiment seven of the present invention stated above is developed, while reducing a drop in programming speed, it is possible to further increase the capacity of the entire memory. In the non-volatile semiconductor memory device relating to embodiment eight of the present invention, while reducing a drop in programming speed, it is possible to further increase the capacity of the entire memory.

Figure 20:
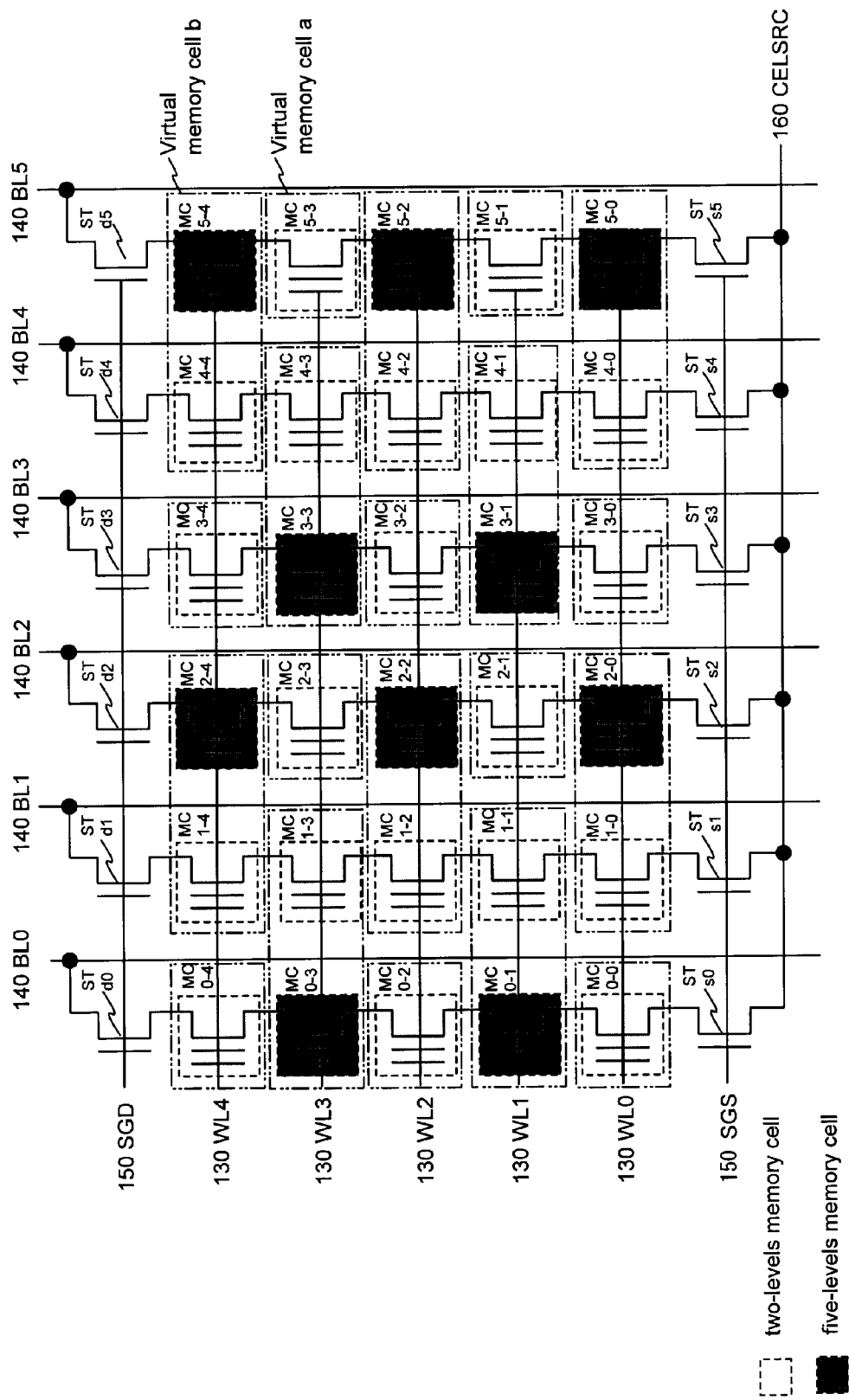
FIG. 20 is a second typical drawing of the allocation of two-levels data and five-levels data to a memory cell in the non-volatile semiconductor memory device relating to a eighth embodiment of this invention.

FIG. 20 is a typical drawing of a memory cell operation mode allocation of the non-volatile semiconductor memory device relating to embodiment eight of the present invention in the case where the data stored by a memory cell is given as two-levels data and five-levels data. In FIG. 20, the memory cell placement is the same as in FIG. 19.

However, in the present embodiment, the setting method of a virtual memory cell is different to that of embodiment seven of the present invention shown in FIG. 19. That is, in embodiment seven of the present invention, three memory cells which are adjacent on the same word line form a trio of memory cells. And, a memory cell which stores two-levels data is made into one virtual memory cell and one remaining memory cell which stores five-levels data is set as another virtual memory cell. Also, a virtual page address is set to each of these virtual memory cells. In embodiment eight of the present invention, a trio of memory cells are formed in the same way, however, the setting method of the virtual memory cell is different.

In embodiment eight of the present invention, consecutive memory cells MC which store two-levels data are not made into one virtual memory cell, one memory cell which stores two-levels data is made into one virtual memory cell and the remaining memory cell MC which stores two-levels data and a memory cell MC which stores five-levels data which is adjacent on the same word line form another virtual memory cell. And, similar to embodiment seven of the present invention, a virtual page address is allocated to each of the virtual memory cells. Also, in embodiment eight of the present invention, the word lines 130 are separated into EVEN word lines 130 and ODD word lines 130 and the series of two-levels data memory cells and five-levels data memory cells within a virtual memory cell is reversed. For example, on an EVEN word line 130, in the case of placing a memory cell MC which stores two-levels data within a virtual memory cell on an ODD bit line 140 side, on an ODD word line, the memory cell MC which stores two-levels data within a virtual memory cell is placed on an EVEN bit line 140 side and a memory cell MC which stores five-levels data is placed on an ODD bit line 140 side.

In FIG. 20, for example, the memory cells MC0-2, MC1-2 and MC2-2 which are located on an EVEN word line 130, form a trio of memory cells. And, a virtual memory cell A is formed by the memory cell MC0-2 and, for example, is allocated with a virtual page address a. Also, a virtual memory cell B is formed by the two remaining memory cells of the trio of memory cells MC1-2 and MC2-2 and, for example a virtual page address b is allocated. Within the virtual memory cell B, the memory cell MC 1-2 which is connected to the ODD bit line BL1 (140) is allocated an operation mode so that two-levels data is stored and the memory cell MC2-2 which is connected to the EVEN bit line BL2 (140) is allocated with an operation mode so that five-levels data is stored. Next, a trio of memory cells is formed by the memory cells MC0-3, MC1-3 and MC2-3 which are located on the adjacent ODD word line WL3. And, the memory cells MC0-3 and MC1-3 form a virtual memory cell B and within the virtual memory cell B, the memory cell MC0-3 which is located on the EVEN bit line BL0 (140) is allocated with an operation mode so that five-levels data is stored and the memory cell MC1-3 which is located on the ODD bit line BL1 (140) is allocated with an operation mode so that two-levels data is stored.

This allocation is decided in advance based on the address of a memory cell and is stored as fuse data in the ROM fuse, the same as in the first, second, third and fourth, fifth and sixth embodiments of the present invention. Then, this fuse data is read from the ROM region by a ROM read operation and is set in the latch circuit. Of course, the allocation of an operation mode is possible even by a method which arranges a fuse circuit within the power on reset circuit, similar to that of embodiment one of the present invention. Also, it is also possible to set the changing of the operation mode by an external input.

The programming of the virtual memory cell is controlled based on a virtual page address, the same as in embodiment seven of the present invention. It is controlled as if the bit line which is connected to the virtual memory cell A is an EVEN bit line while the bit line which is connected to the virtual memory cell B is an ODD bit line. And, programming of the virtual memory cell B of the virtual page address b is set so that first data programming and second data programming is carried out. The control method of the first data programming and the second data programming is the same as that in embodiment five, six and seven of the present invention stated above.

However, in embodiment eight of the present invention, the programming of the virtual memory cell B is controlled by further dividing the word lines 130 into EVEN word lines 130 and ODD word lines 130. That is, the programming of the virtual memory cell B which is connected to the EVEN word lines WL0, WL2 and WL4 (130) and which is allocated with the virtual page address b, is carried with the first data programming from, for example, the side of the ODD bit lines BL1, BL3 and BL5. Also, programming of the virtual memory cell B which is connected to the ODD word lines WL1, WL3 and WL5 (130) and which is allocated with the virtual page address b, is controlled so that the first data programming is carried out from, for example, the side of the EVEN bit lines BL0, BL2 and BL4. This is because programming of a virtual memory cell which is formed by two memory cells which store two-levels data and five-levels data is always carried out from the side of a memory cell which stores two-levels data.

This control becomes possible by latching data in the sense amplifier and having a calculation function in the sense amplifier. Therefore, the non-volatile semiconductor memory device relating to embodiment eight of the present invention has a data latch function and a calculation function in the sense amplifier. This is the same as in the embodiments five, six and seven of the present invention.

In embodiment eight of the present invention, by this formation, one virtual memory cell stores two-levels data (one bit) and another virtual memory cell stores data of 2-levels× 5-levels=10-levels>8-levels=$2^3$ (three bits). Therefore, it is possible to increase storage capacity of the entire memory.

Figure 21:
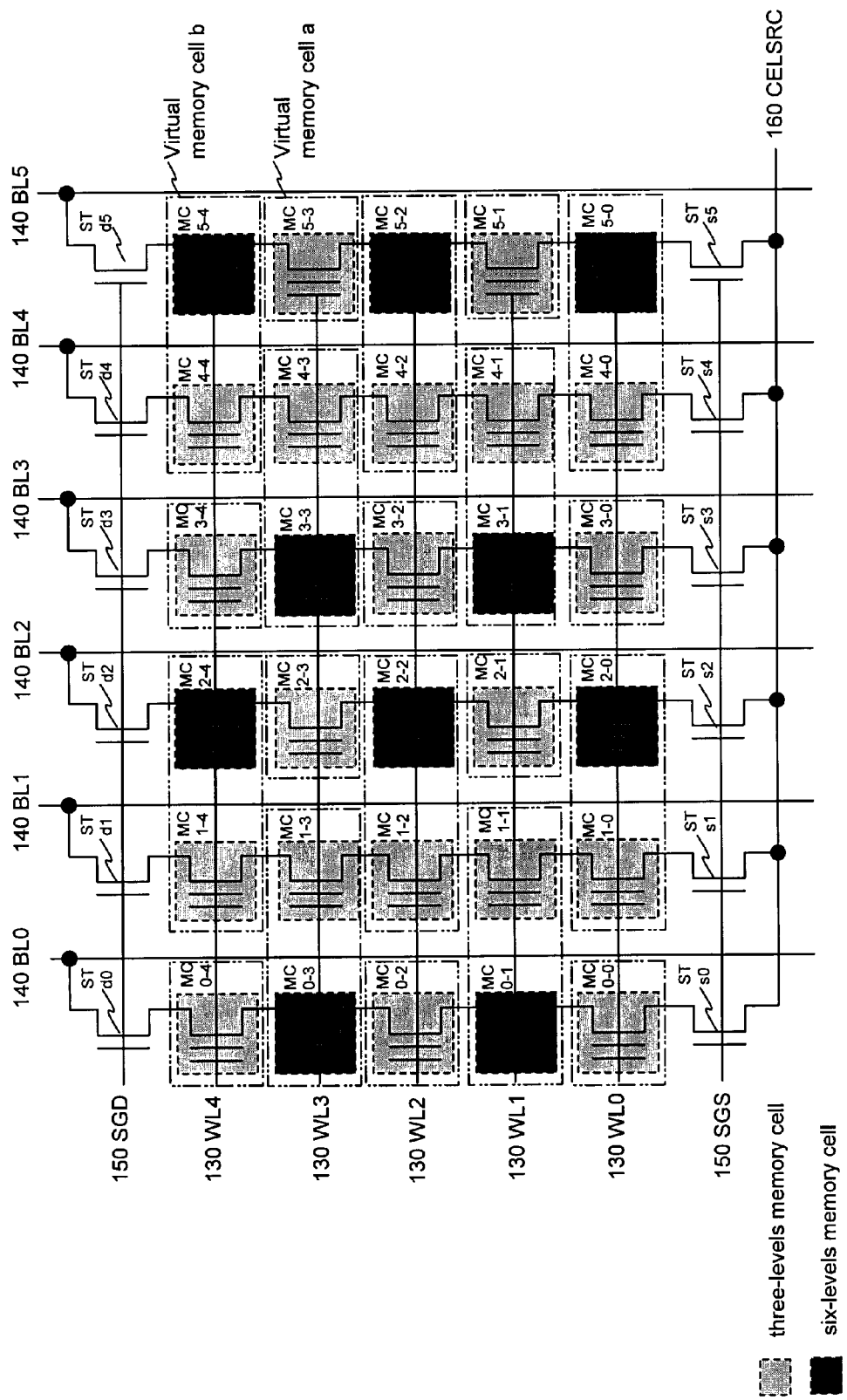
FIG. 21 is a typical drawing of the allocation of three-levels data and six-levels data to a memory cell in the non-volatile semiconductor memory device relating to a eighth embodiment of this invention.

In addition, according to embodiment eight of the present embodiment, as is shown in FIG. 21, it is possible to set a memory cell operation mode with three-levels cell mode and six-levels cell mode. In this case, in the virtual memory cell B, because data of 3-levels×6-levels=18-levels>16-levels=$2^4$ (four bits) is stored by a pair of memory cells, it is possible to increase storage capacity of the entire memory.

In the non-volatile semiconductor memory device relating to embodiment eight of the present invention, interference of an adjacent memory cell due to capacitive coupling with an adjacent memory cell is reduced and it is possible to reduce the widening of the width of the threshold distribution. Also, a drop in programming speed is reduced and it is possible to increase storage capacity of the entire memory. Furthermore, it is possible to use one memory cell and change the amount of information of the data which is stored in accordance with the purpose of use, and as a result, it is possible to reduce manufacture costs and thus sale price and because a stable product supply becomes possible it is possible to maintain high product quality.

Embodiment Nine

In embodiment eight of the present invention, as stated above, an operation mode is allocated so that data with a different amount of information is stored in an adjacent memory cell and by controlling programming from the memory cell which is adjacent on the same word line and stores data with a small amount of information, it is possible to reduce interference of an adjacent memory cell due to capacitive coupling with an adjacent memory cell. According to a different embodiment of the present invention, while reducing interference of an adjacent memory cell, it is possible to further increase the storage capacity of the entire memory.

Figure 22:
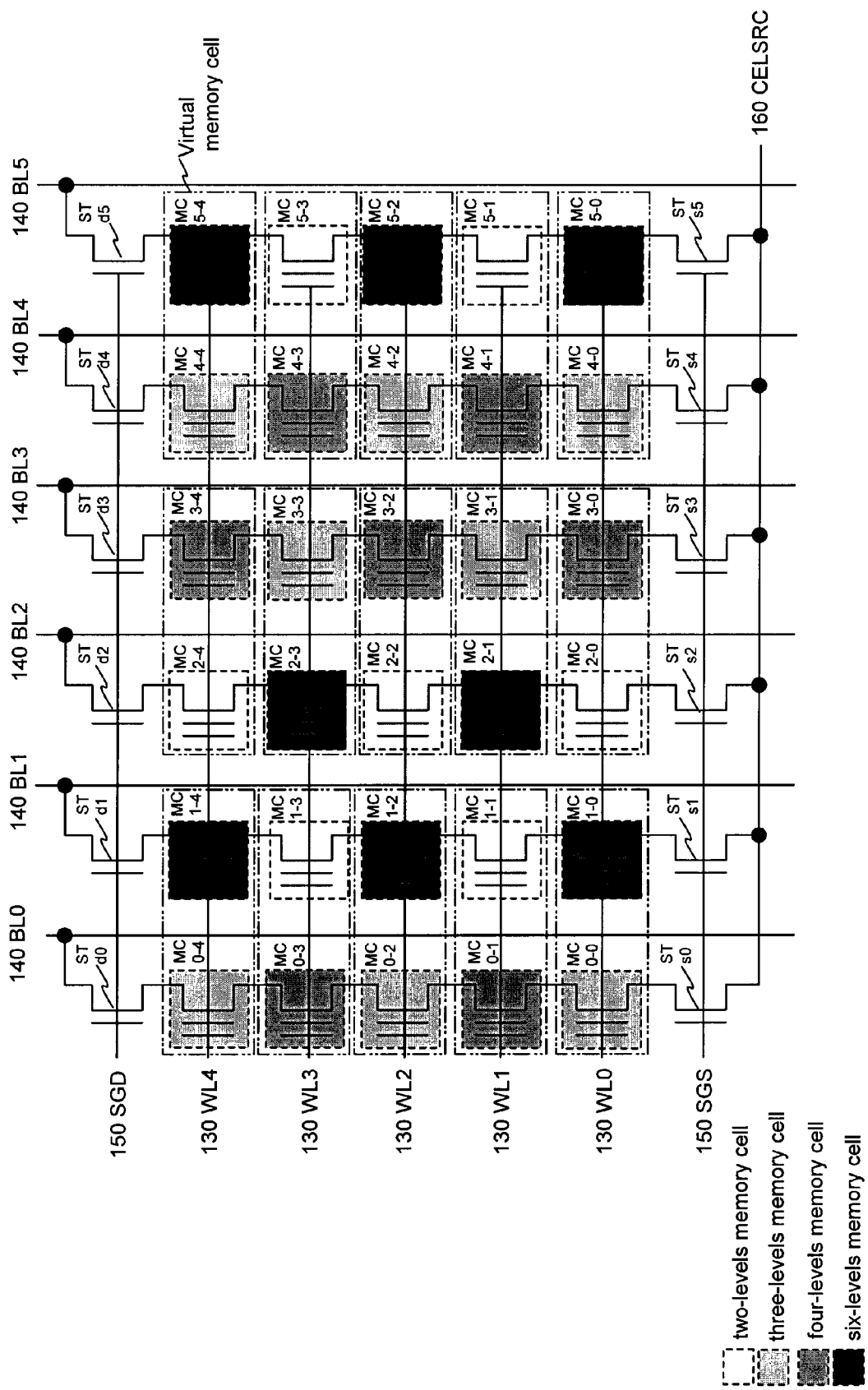
FIG. 22 is a typical drawing of the allocation of two-levels data, three-levels data, four-levels data and six-levels data to a memory cell in the non-volatile semiconductor memory device relating to a ninth embodiment of this invention.

FIG. 22 is a typical drawing which shows a memory cell MC allocation in the non-volatile semiconductor memory device relating to embodiment nine of the present invention. In embodiment nine of the present invention, data with four different amounts of information in four memory cells connected to two adjacent bit lines and adjacent word lines is stored. FIG. 22 is an example of data with four different amounts of information which is stored in a memory cell, two-levels, three-levels, four-levels and six-levels.

The allocation of an operation mode to a memory cell is set based on a memory cell address and stored as fuse data in a ROM fuse, read from a ROM region by a ROM read operation and set in the latch circuit. In embodiment nine of the present invention, a pair is formed by two memory cells which are adjacent on the same word line and each memory cell MC is allocated so that data with a different amount of information is stored. Then, this pair of memory cells and two memory cells MC which are adjacent on the same bit line as each memory cell MC of this pair of memory cells which are on an adjacent word line are set as a separate pair and each of these two memory cells MC is allocated with an operation mode so that data which is different to that of the pair of memory cells MC is stored.

Specifically, in FIG. 22, a pair is formed from two memory cells MC which are adjacent on the EVEN word lines WL0, WL2 and WL4 (130). Further, a separate pair is formed by two memory cells MC which are adjacent to each of the memory cells MC of the pair of memory cells on the adjacent ODD word lines WL1, WL3 and WL5 (130) and the same bit line. In FIG. 22, a pair is formed by the memory cells MC0-0 and MC1-0 which are adjacent on the EVEN word line WL0 (130) and a separate pair is formed by the memory cells MC0-1 and MC1-1 which are adjacent on the ODD word line WL1 (130) which is adjacent to the word line WL0 (130) and also adjacent on the same bit line as the pair of memory cells MC. Then, an operation mode is allocated so that two-levels, three-levels, four-levels and six-levels are stored in the four memory cells MC.

In the allocation of an operation mode, the data with the smallest amount of information among the data of four amounts of information and the data with the second largest amount of information is combined and the data with the third largest amount of information and the data with the most amount of information are combined so that the amount of information of data which is stored by memory cells which are adjacent on the same word line does not become an similar number. Then, the memory cell which stores data with the largest amount of information and the memory cell which stores data with the second largest amount of information are placed so that they are located on different bit lines. Specifically, in FIG. 22, a pair is formed by the memory cells MC0-0 and MC1-0 which are adjacent on the same word line WL0 (130) and a separate pair is formed by the memory cells MC0-1 and MC 1-1 which are located on the adjacent word line WL1 (130) and are each respectively adjacent on the same bit line to the memory cells MC0-0 or MC1-0. Then, a three-levels cell mode is allocated to the memory cell MC0-0 and a six-levels cell mode is allocated to the memory cell MC1-0. Next, because a memory cell which is located on a different bit line to the memory cell MC1-0 which is connected to the bit line BL1, is allocated so that the data with the second largest amount of information is stored, an operation mode is allocated so that the data with the second largest amount of information, four-levels data, is stored in the memory cell MC0-1 which is located on the bit line BL0. Therefore, an operation mode is inevitably allocated so that the memory cell MC1-1 stores two-levels data. Further, this operation mode allocation is one example and is not limited to this allocation.

Programming is carried out from the memory cell MC which is connected to an EVEN bit line and then to a memory cell MC which is connected to an ODD bit line. In embodiment nine of the present invention, in the case of programming a memory cell MC connected to the EVEN word lines WL0, WL2 and WL4 (130) and in the case of programming to a memory cell MC which is connected to the ODD word lines WL1, WL3 and WL5 (130), the order of programming to a memory cell MC which connected to an ODD bit line or an EVEN line respectively, is controlled so that it is reversed. That is, in FIG. 22, in the case of programming a memory cell MC which is connected to the EVEN word lines WL0, WL2 and WL4, first a memory cell MC is programmed from the EVEN bit line side BL0, BL2 and BL4 (140) and then the ODD bit line side BL1, BL3 and BL5 memory cells MC are programmed. Alternatively, in the case of programming a memory cell MC which is connected to the ODD word lines WL1, WL3 and WL5, a memory cell MC is first programmed from the ODD bit lines BL1, BL3 and BL5 (140) and then the EVEN bit line side BL0, BL2 and BL4 memory cells MC are programmed.

The control of the order of programming of each bit line by word line units so that it reversed is because of programming from a memory cell which stores data with a small amount of information between adjacent memory cells on the same bit line in order to reduce the interference of an adjacent cell due to capacitive coupling. Therefore, the programming order every bit line is changed and set so that programming is carried out from a memory cell MC which stores data with a small amount of information corresponding to the allocation of an operation mode to a memory cell MC. This control order is stored as fuse data in the ROM fuse, is read from the ROM region by the ROM read operation and set in the latch circuit. Of course, the allocation of an operation mode is possible even by a method which arranges a fuse circuit within the power on reset circuit, similar to that of embodiment one of the present invention. Also, it is also possible to set the changing of the operation mode by an external input. Further, according to the present embodiment, programming is controlled so that programming starts from a memory cell MC which stores data with a small amount of information, however, it is not always limited to this.

In the non-volatile semiconductor memory device relating to embodiment nine of the present invention, interference of an adjacent memory cell due to capacitive coupling with an adjacent memory cell is reduced by controlling this operation mode allocation and programming and it is possible to reduce the widening of the width of the threshold distribution. Also, a drop in programming speed is reduced and it is possible to increase storage capacity of the entire memory. Furthermore, it is possible to use one memory cell and change the amount of information of the data which is stored in accordance with the purpose of use, and as a result, it is possible to reduce manufacture costs and thus sale price and because a stable product supply becomes possible it is possible to maintain high product quality.

Figure 23:
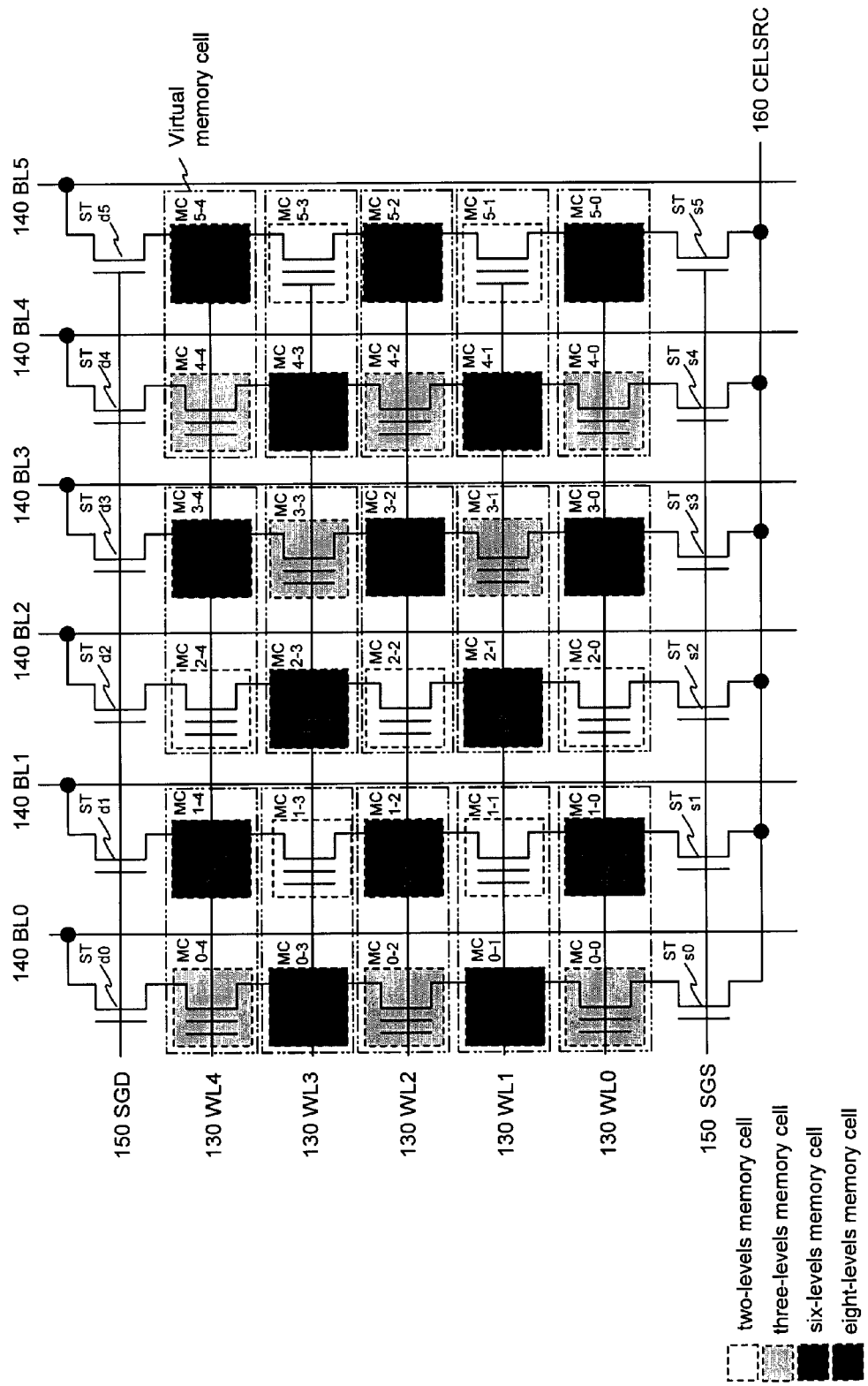
FIG. 23 is a typical drawing of the allocation of two-levels data, three-levels data, six-levels data and eight-levels data to a memory cell in the non-volatile semiconductor memory device relating to a ninth embodiment of this invention.
Figure 24:
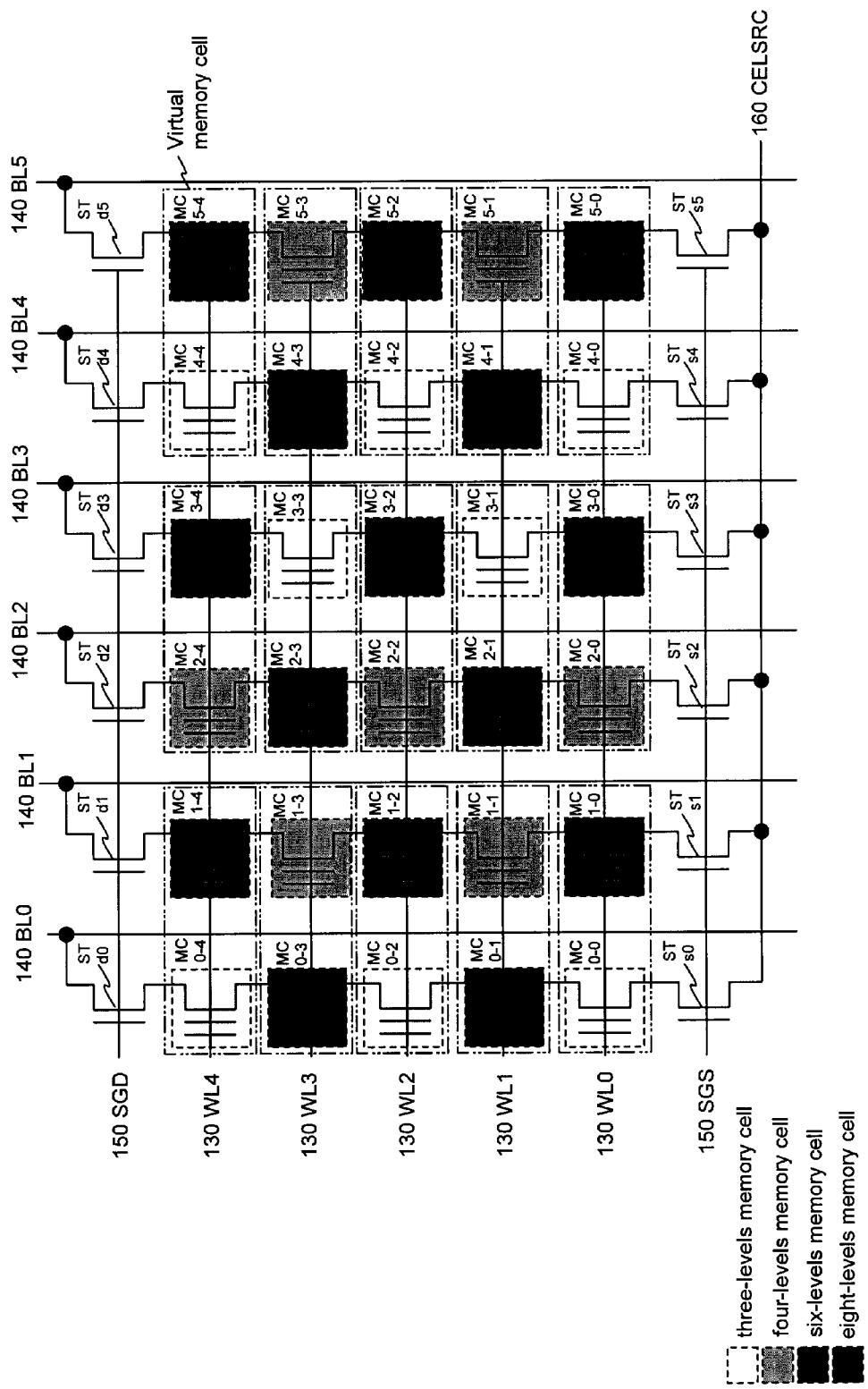
FIG. 24 is a typical drawing of the allocation of two-levels data, four-levels data, six-levels data and eight-levels data to a memory cell in the non-volatile semiconductor memory device relating to a ninth embodiment of this invention.

Further, the data with four different amounts of information which are stored in a memory cell MC are not limited to two-levels, three-levels, four-levels and six-levels. As is shown in FIG. 23 and FIG. 24, it is possible to combine two-levels, three-levels, six-levels and eight-levels and it is also possible to combine three-levels, four-levels, six-levels and eight-levels. In addition, it is also possible to combine other data amounts. The effects in these cases are the same as those stated above.

Embodiment Ten

In embodiment ten of the present invention, two-levels cell mode and four-levels cell mode are allocated as memory cell MC operation modes in a flash memory arranged with a two transistor cell.

In recent times, a flash memory (below this flash memory is referred to as a NANO type flash memory) arranged with two transistor cell which are arranged with the benefits of both a NOR type flash memory and a NAND type flash memory, has been proposed. This NANO type flash memory is arranged with a memory cell which includes two MOS transistors and one of the MOS transistors which functions as a non-volatile memory part has a construction which is arranged with a control gate and a floating gate and is connected to a bit line. The other MOS transistor is connected to a source line and is used for selecting a memory cell.

Because the area of one memory cell in this NANO flash memory becomes large, it is necessary to store data with an amount of information of more than two-levels in one memory cell MC in order to guarantee storage capacity. However, in the case of storing data with an amount of information of more than two-levels, the NANO flash memory is the same as the NAND type flash memory in that interference of an adjacent memory cell due to capacitive coupling with an adjacent memory cell MC occurs. In one embodiment of the present invention, by changing an operation mode, it is possible to make the operation mode of a memory cell MC a chequered flag shape mixed mode (a mixed mode of data of two-levels and of an amount of information of more than two-levels) of a two-levels cell mode and a cell mode with information which is more than two-levels and because the effect of an adjacent memory cell can be reduced, this is also effective in the NANO flash memory. The non-volatile semiconductor memory device relating to embodiment ten of the present invention is a NANO flash memory which allocates a two-levels cell mode and a four-levels cell mode as an operation mode of a memory cell MC.

Figure 25:
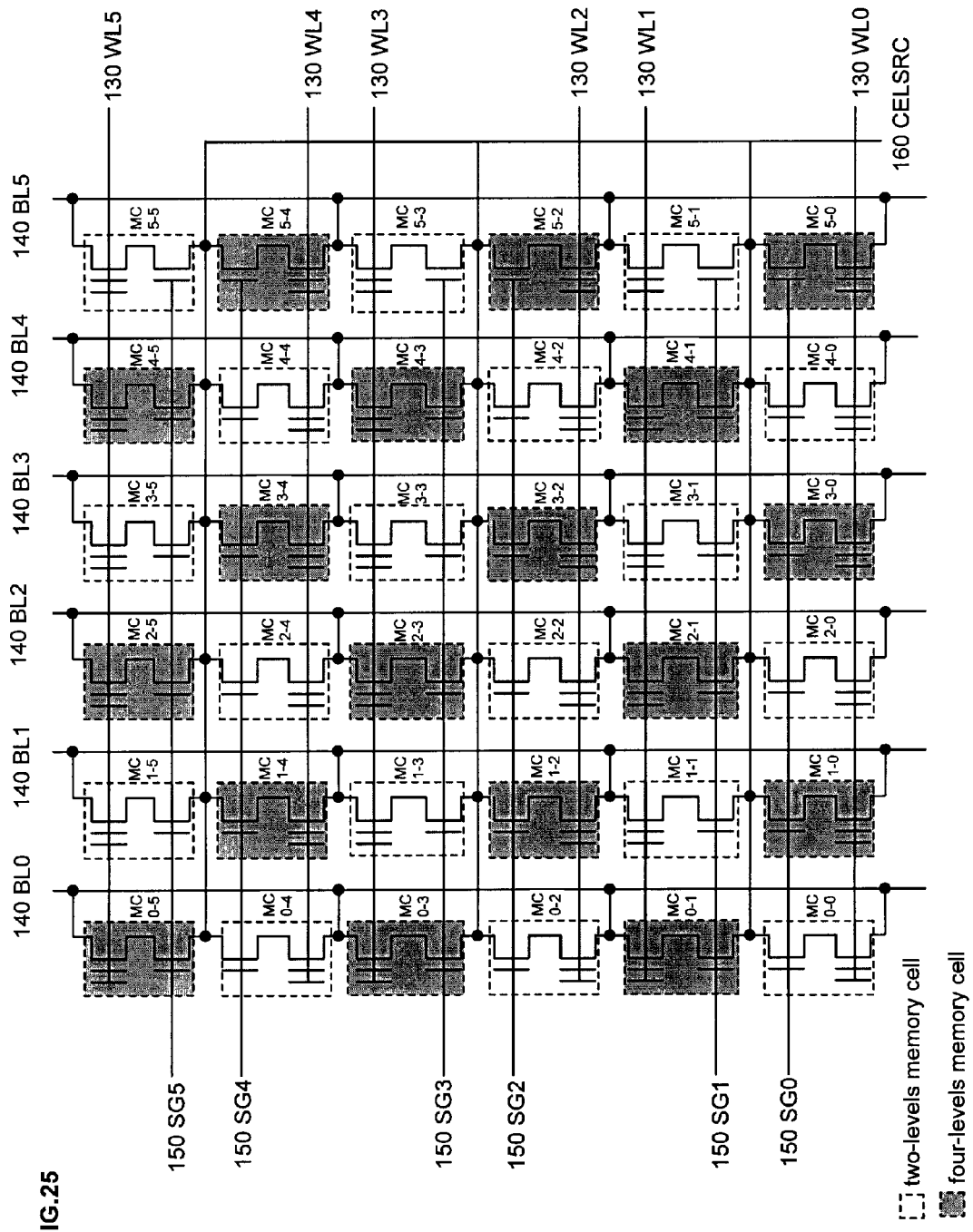
FIG. 25 is an outline drawing of a flash memory arranged with a two transistor cell relating to a tenth embodiment of this invention.

FIG. 25 is an outline construction drawing of a NANO flash memory relating to embodiment ten of the present invention. A memory cell array has a plurality ((m+1)×(n+1) cells, however, m and n are natural numbers) of memory cells MC0-0 to MCm-n which are placed in a matrix form, however, for the purposes of explanation, the memory cells MC0-0 to MC5-5 are shown in FIG. 25. Each memory cell MC has a memory cell transistor MT and a selection transistor ST which are mutually connected by a current route. The memory cell transistor MT is arranged with a stack gate construction which has floating gate formed on a semiconductor substrate separated by an gate insulation film and a control gate which is formed above the floating gate and separated by a gate insulation film. And, a source region of the memory cell transistor is connected to a drain region of the selection transistor ST. Also, the memory cells which are adjacent in a column direction share a selection transistor ST source region or a memory cell transistor MT drain region.

The control gate of the memory cell transistor MT of memory cells on the same row are commonly connected by any one of the word lines WL0 to WL5 and the control gate of a selection transistor ST of memory cells on the same row are connected to any one of the select gate lines SG0 to SG5. Also, the drain of the memory cell transistor MT of a memory cell in the same column is commonly connected to any one of the bit lines BL0 to BL5. And, the source of the selection transistor ST of a memory cell is commonly connected to a source line CELSRC 160.

The programming of data in this NANO flash memory is carried out at one time in one batch on all the memory cells connected to any one of the word lines. And, [0] data or [1] data is programmed depending on whether electrons are injected into the floating gate of the memory cell transistor MT. The injection of electrons into the floating gate is conducted by FOWLER-NORDHEIM (FN) TUNNELING.

First, in FIG. 25, program data ([1], [0]) is input from an I/O terminal (not shown in the drawing). Then, this program data is stored in each latch circuit (not shown in the drawing) arranged on each bit line. When [1] data is stored in the latch circuit, 0V is applied to the bit line, and conversely, when [0] data is stored, VBB (−6V) is applied to the bit line.

A first row decoder (not shown in the drawing) selects any one of the word lines WL0 to WL5 and Vpp (for example, 10V) is applied to the selected word line. A second row decoder (not shown in the drawing) applies VBB (−6V) to the selection gates SG0 to SG5. Also, the voltage of the memory cell substrate is given as VBB (−6V). As a result, all the selection transistors ST become an OFF state. Therefore, the selection transistor ST and the source line CELSRC 160 are electrically separated.

A voltage which corresponds to [1] data or [0] data is applied to the drain region of the memory cell transistor MT via the bit lines BL0 to BL5. Then, Vpp (10V) is applied to a selected word line WL and 0V is applied to the drain of the memory cell transistor MT which is to be programmed with [1] data and VBB (−6V) is applied to the drain region of the memory cell transistor which is to be programmed with [0] data. Therefore, in the memory cell transistor MT which is to be programmed with [1] data, because the voltage differential (10V) between the gate and drain is insufficient, electrons are not injected into the floating gate and the memory cell transistor MT retains a negative threshold. Alternatively, in the memory cell transistor MT which is to be programmed with [0] data, because the voltage differential (16V) between the gate and the drain is large, the floating gate is injecting with electrons by FN tunneling. As a result, the threshold of the memory cell transistor MT changes to positive.

It is possible to read the data from the plurality of memory cells which are commonly connected to any one word line at one time in one batch. In FIG. 25, the second row decoder (not shown in the drawing) selects any one of the selection gate lines SG0 to SG5. A [H] level voltage (for example, Vcc) is applied to the selection gate line. The voltages of the non-selected gate lines are all [L] level (for example, 0V). Therefore, the selection transistor ST which is connected to a selection gate line becomes an ON state and the selection transistor ST which is connected to a non-selected selection gate line becomes an OFF state. As a result, the selection transistor ST within the selected memory cell is electrically connected to the source line CELSRC 160. Also, the first row decoder (not shown in the drawing) makes the voltage of all the word lines WL0 to WL5 an [L] level (0V). In addition, a source line driver (not shown in the drawing) makes the voltage of the source line CELSRC 160 0V.

A voltage, for example about 1V, is applied to each of bit lines BL0 to BL5. Then, because the memory cell transistor MT of the memory cell MC which is programmed with [1] data has a negative threshold voltage, it becomes an ON state. Therefore, in the memory cell MC which is connected to a selection gate line, a current flows towards the source line CELSRC 160 via a current route of the memory cell transistor MT and the selection transistor ST from a bit line. Alternatively, because the memory cell transistor MT of the memory cell MC which is programmed with [0] data has a positive threshold voltage, it becomes an OFF state. Therefore, a current does not flow towards the source line CELSRC 160 from a bit line. As a result of the above, the voltages of the bit lines BL0 to BL5 changes and a read operation is carried out by the sense amplifier (not shown in the drawing) amplifying that amount of that change.

Erasing of the data of all the memory cells which share a well region is carried out at one time in one batch. In FIG. 25, the first row decoder (not shown in the drawing) makes the voltages of all the word lines WL0 to WL5 VBB (−6V). In addition, the voltage of the semiconductor substrate (well region) is Vpp (10V). Therefore, the electrons are extracted from the floating gate of the memory cell transistor of the memory cell MC to the semiconductor substrate. Consequently, the threshold voltage of all the memory cells becomes negative and data is erased.

Even in a NANO flash memory in which programming, reading and erasing is carried out via the above stated operations, in the case where data with an amount of information of more than two-levels is programmed, because the width of the threshold distribution is narrowed, the program voltage Vpgm is stepped up by a fixed ratio Dvpgm which is smaller than a two-levels programming from an initial value. The programming voltage Vpgm is applied to a memory cell as a pulse signal (program pulse) and every time the pulse signal is applied to a memory cell, it rises by that height (program voltage Vpgm). Therefore, interference from an adjacent memory cell is received.

In the NANO flash memory which is related to embodiment ten, an operation mode is allocated so that data (two-levels and four-levels) with a different amount of information is stored by an adjacent memory cell MC. In FIG. 25, in the case where an operation mode is allocated so that a certain specific memory cell MC stores data (here four-levels data) with an amount of information of more than two-levels, an operation mode is allocated to the memory cells MC which are adjacent on both sides of this memory cell MC on the same bit line and the memory cells MC which are adjacent on both sides of this memory cell MC on the same word line so that data (here, two-levels) of an amount which is less than the data (here, four-levels) with an amount of information of more than two-levels, are stored. The method of allocating an operation mode to a memory cell based on the address of a memory cell MC is the same as that stated in embodiment one.

Specifically, in FIG. 25, in the case where the memory cell MC2-2 is allocated with an operation mode so that it stores two-levels data, the memory cells MC2-1, MC2-3 which are adjacent on the same bit line and the memory cells MC1-2, MC3-2 which are adjacent on the same word line are all allocated with an operation mode so that four-levels data is stored. Similarly, when looking at the memory cell MC3-2, this memory cell is allocated with an operation mode so that four-levels data is stored, however, the adjacent memory cells MC3-1, MC3-3, MC2-2 and MC4-2 are all allocated with an operation mode so that two-levels data is stored.

Here, the interference of an adjacent memory cell in the case where data is programmed to the memory cell MC2-2 in FIG. 25 will be explained. In FIG. 25, the memory cell MC2-2 is allocated with an operation mode so that two-levels data is stored.

First, the word line WL2 (130) is selected by the first row decoder (not shown in the drawing) and Vpp is applied. The voltage of all the other word lines WL0, WL1, WL3, WL4 and WL5 is 0V. Also, the voltage of all the selection gate lines SG0 to SG5 is VBB (−6V). In this state, 0V or VBB is applied to each of the EVEN bit lines BL0, BL2 and BL4. Then, electrons are injected into the floating gate of the memory cells MC0-2, MC2-2 and MC4-2 which are connected to the word line WL2 and connected to the bit line which is applied with VBB.

Alternatively, electrons are not injected into the floating gates of the memory cells MC which are connected to the word lines WL0, WL1, WL3, WL4 and WL5 because the voltage of these word lines is 0V, regardless of the voltage of the bit lines BL0 to BL5. Therefore, the memory cells MC2-1 and MC2-3 which are adjacent to the memory cell MC2-2 in a bit line direction are not programmed. Here, because there is capacitive coupling between the memory cell MC2-2 and the adjacent memory cells MC2-1 and MC2-3, influence is received by applying a program voltage to the memory cell MC2-2. However, because the memory cell MC2-2 is programmed with two-levels data there is no need to heighten the threshold and the threshold change of the memory cell MC2-2 is small. Therefore, the effect of the interference of an adjacent memory cell to the memory cells MC2-1 and MC2-3 is small.

Next, the ODD bit lines BL1, BL3 and BL5 are selected and 0V or VBB is applied. Then, electrons are injected into the floating gate of the memory cells MC1-2, MC3-2 and MC5-2 which are connected to the word line WL2 and connected to the bit lines which are applied with VBB and programming is carried out. Because these memory cells MC1-2, MC3-2 and MC5-2 are allocated with an operation mode so that four-levels data is stored, a voltage which has been narrowly stepped up is applied to each of these memory cells MC. Therefore, the effect of the interference of an adjacent memory cell due to capacitive coupling with the memory cell MC3-2 reaches the memory cells MC3-1 and MC3-3 which are adjacent in a bit line direction to the memory cell MC3-2 and the memory cells MC2-2 and MC4-2 which are adjacent in a word line direction to the memory cell MC3-2.

However, because the memory cells MC3-1 and MC2-2 and MC4-2 are already programmed with two-levels data it is possible to absorb the effect of the interference of this adjacent memory cell. Also, the memory cell MC3-3 is not yet programmed with data. Therefore, this memory cell MC receives the effect of the interference of an adjacent cell, however, after this, the word line WL3 (130) is selected and because two-levels data is again programmed to this memory cell MC, there is no effect.

As stated above, a memory cell MC which stores data with an amount of information of more than two-levels while memory cells MC which are adjacent to this memory cell MC in a word line direction and a bit line direction are allocated so that data with less information is stored. Then, programming of a memory cell MC is controlled for every word line so that a memory cell MC which is connected to an EVEN bit line and is connected to this word line is programmed and a memory cell MC which is connected to an ODD bit line and is connected to this word line is programmed. By this, it is possible to reduce to a minimum the effect of the adjacent memory cell interference from an adjacent memory cell in a word line direction and a bit line direction. Alternatively, a memory cell MC which stores data with a small amount of information is programmed with data first and because the width of the threshold distribution is wide it is possible to absorb the effect of the interference of an adjacent memory cell. As a result, it is possible to reduce the effect of the interference of an adjacent memory cell over the entire memory. Further, according to the present invention, programming of a memory cell is controlled so that programming starts from a memory cell MC which stores data with a small amount of information, however, it is not always limited to this.

In addition, because half of the memory cells MC store two-levels data in which the number of program times is less than in four-levels data, it is possible to reduce to a fixed level a drop in program speed over the entire memory. Furthermore, when reading two-levels data, because it is possible to set the read voltage of a non-selected word line lower than the read voltage of four-levels data, it is possible to reduce read disturbance and maintain a high level of reliability. These effects are the same as the effects in a NAND type flash memory.

In addition, in the NANO flash memory relating to embodiment ten of the present invention, it is possible to easily change an operation mode of one memory cell, because changing of an operation mode is carried out by fuse data based on the address of a memory cell and it is possible to change and use an operation mode of a memory cell corresponding to purpose of use. These effects further make it possible to reduce manufacture costs and thus sale price and because a stable product supply becomes possible it is possible to maintain high product quality. These effects are the same as the effects as in a NAND type flash memory.

Furthermore, in embodiment ten of the present invention, two-levels data and four-levels data was used as data with different amounts of information, however, it is not limited to this, for example, three-levels data and six-levels data or four-levels data and eight-levels data or any other combination may be used. By controlling programming by allocating so that memory cells adjacent on the same bit line and on the same world line store data with different amounts of information, it is possible to obtain the same effects.

In the embodiments from embodiment one to embodiment nine of the present invention as explained above, an example is shown which uses what is called a bit line shield wherein programming is performed for each bit line and a potential of a non-selected bit line is controlled to a predetermined potential. However, the present invention is not limited to this. The present invention is effective even with a programming method which does not use a bit line shield.

What is claimed is:

1. A non-volatile semiconductor memory device comprising:
    a plurality of word lines;
    a plurality of bit lines comprising even numbered bit lines and odd numbered bit lines; and
    a memory cell array including a plurality of memory cells having two or more storage states, one of said plurality of memory cells being connected to a corresponding word line of said plurality of word lines, the number of storage states between adjacent memory cells is different in a word line direction and a bit line direction.

2. The non-volatile semiconductor memory device according to claim 1, wherein it is possible to change the number of storage states of said plurality of memory cells by an external input so that all of said plurality of memory cells have the same number of storage states.

3. The non-volatile semiconductor memory device according to claim 1, wherein the number of storage states of said memory cells is memorized in a fuse and it is possible to change the number of storage states of said plurality of memory cells so that all of said plurality of memory cells have the same number of storage states based on data memorized in said fuse.

4. The non-volatile semiconductor memory device according to claim 1, wherein the non-volatile semiconductor memory device is a NAND type flash memory.

5. The non-volatile semiconductor memory device according to claim 1, wherein each of said plurality of memory cells includes two transistors.

6. The non-volatile semiconductor memory device according to claim 1 wherein, the number of storage states have a first number of storage states, a second number of storage states and a third number of storage states, said first number of storage states has the lowest number of storage states, said third number of storage states has the largest number of storage states, and said second number of storage states has a number of storage states between said first number of storage states and said third number of storage states, and the number of storage states of said memory cells which are connected to said odd numbered bit lines of said plurality of bit lines and said odd numbered word lines of said plurality of word lines and said memory cells which are connected to said even numbered bit lines of said plurality of bit lines and said even numbered word lines of said plurality of word lines are set as said first number storage states.

7. The non-volatile semiconductor device according to claim 1, wherein the number of storage states of said memory cells are the same every other said word line and the same every other said bit line.

8. The non-volatile semiconductor device according to claim 1, wherein said plurality of memory cells are programmed in each of said plurality of word lines every said even numbered bit line and every said odd numbered bit line, and the voltage of said bit lines which have not been selected of said plurality of bit lines at the time of programming is controlled to a predetermined voltage.

9. A non-volatile semiconductor device comprising:
a plurality of word lines;
a plurality of bit lines comprising even numbered bit lines and odd numbered bit lines;
a memory cell array including a plurality of memory cells having two or more storage states, said plurality of memory cells having a first address and a second address, said second address being allocated and being the same between two said adjacent memory cells, one of said plurality of memory cells being connected to a corresponding word line of said plurality of word lines, the number of storage states between adjacent memory cells is different in a word line direction and a bit line direction; and
a plurality of sense amplifiers connected to said plurality of bit lines, said sense amplifiers amplify and output a signal which is read from said plurality of memory cells, latches data which is input or output and converts said data based on said second address into a signal.

10. The non-volatile semiconductor memory device according to claim 9, wherein it is possible to change the number of storage states of said plurality of memory cells by an external input so that all of said plurality of memory cells have the same number of storage states.

11. The non-volatile semiconductor memory device according to claim 9, wherein the number of storage states of said memory cells is memorized in a fuse and it is possible to change the number of storage states of said plurality of memory cells so that all of said plurality of memory cells have the same number of storage states based on data memorized in said fuse.

12. The non-volatile semiconductor memory device according to claim 9, wherein the non-volatile semiconductor memory device is a NAND type flash memory.

13. The non-volatile semiconductor memory device according to claim 9, wherein each of said plurality of memory cells includes two transistors.

14. The non-volatile semiconductor memory device according to claim 9, wherein the number of storage states have a first number of storage states, a second number of storage states, a third number of storage states and a fourth number of storage states, said first number of storage states being lower than said second number of storage states which is lower than said third number of storage states which is lower than said fourth number of storage states, said first number of storage states and said third number of storage states are set as the number of storage states which are stored in said memory cells which are connected to the same word line, and said second number of storage states and said fourth number of storage states are set as the number of storage states which are stored in said memory cells which are connected to the same word line adjacent to said word line, and the order of selecting said odd numbered bit lines and said even numbered bit lines is reversed every said adjacent word line.

15. The non-volatile semiconductor memory device according to claim 9, wherein said plurality of memory cells are selected in each of said plurality of word lines every said even numbered bit line and every said odd numbered bit line based on said second address, and the voltage of said bit lines which have not been selected of said plurality of bit lines at the time of programming is controlled to a predetermined voltage.

16. A non-volatile semiconductor device comprising:
a plurality of word lines;
a plurality of bit lines comprising even numbered bit lines and odd numbered bit lines;
a memory cell array including a plurality of memory cells having two or more storage states, said plurality of memory cells having a first address, a second address and a third address, said second address being allocated and being the same between two said consecutive memory cells among three consecutive memory cells which are adjacent and said third address which is allocated to another memory cell among said three memory cells, one of said plurality of memory cells being connected to a corresponding word line of said plurality of word lines, the number of storage states of said memory cell among three consecutive memory cells which are adjacent is different; and
a plurality of sense amplifiers connected to said plurality of bit lines, said sense amplifiers amplify and output a signal which is read from said plurality of memory cells, latches data which is input or output and converts said data based on said second address and said third address into a signal.

17. The non-volatile semiconductor memory device according to claim 16, wherein it is possible to change the number of storage states of said plurality of memory cells by an external input so that all of said plurality of memory cells have the same number of storage states.

18. The non-volatile semiconductor memory device according to claim 16, wherein the number of storage states of said memory cells is memorized in a fuse and it is possible to change the number of storage states of said plurality of memory cells so that all of said plurality of memory cells have the same number of storage states based on data memorized in said fuse.

19. The non-volatile semiconductor memory device according to claim 16, wherein the non-volatile semiconductor memory device is a NAND type flash memory.

20. The non-volatile semiconductor memory device according to claim 16, wherein each of said plurality of memory cells includes two transistors.

21. The non-volatile semiconductor memory device according to claim 16, wherein the number of storage states of said memory cells are the same in the memory cells which are allocated with a common second address.

22. The non-volatile semiconductor memory device according to claim 16, wherein the number of storage states of said memory cells are different in the memory cells which are allocated with a common second address.

23. The non-volatile semiconductor memory device according to claim 16, wherein said plurality of memory cells are selected in each of said plurality of word lines every said even numbered bit line and every said odd numbered bit line based on said second address and said third address, and the voltage of said bit lines which have not been selected of said plurality of bit lines at the time of programming is controlled to a predetermined voltage.

* * * * *